(12) United States Patent
Asai et al.

(10) Patent No.: US 8,249,402 B2
(45) Date of Patent: Aug. 21, 2012

(54) MULTILAYER PRINTED CIRCUIT BOARD

(75) Inventors: Motoo Asai, Ibi-gun (JP); Hiroaki Kodama, Ibi-gun (JP); Kazuhito Yamada, Ibi-gun (JP)

(73) Assignee: Ibiden Co., Ltd., Ogaki-shi (JP)

( * ) Notice: Subject to any disclaimer, the term of this patent is extended or adjusted under 35 U.S.C. 154(b) by 240 days.

(21) Appl. No.: 12/697,646

(22) Filed: Feb. 1, 2010

(65) Prior Publication Data

US 2010/0135611 A1     Jun. 3, 2010

Related U.S. Application Data

(63) Continuation of application No. 11/737,792, filed on Apr. 20, 2007, now abandoned, which is a continuation of application No. PCT/JP2005/018361, filed on Oct. 4, 2005.

(30) Foreign Application Priority Data

Oct. 22, 2004   (JP) ................................. 2004-308782

(51) Int. Cl.
  *G02B 6/12* (2006.01)
  *G02B 6/10* (2006.01)

(52) U.S. Cl. ......................................... 385/14; 385/131

(58) Field of Classification Search ................... 385/14, 385/129–132
See application file for complete search history.

(56) References Cited

U.S. PATENT DOCUMENTS

| | | | |
|---|---|---|---|
| 6,285,808 B1 | 9/2001 | Mehlhorn et al. | |
| 6,330,377 B1 | 12/2001 | Kosemura | |
| 6,370,292 B1 | 4/2002 | Strake | |
| 6,804,423 B2 | 10/2004 | Tsukamoto et al. | |
| 7,070,207 B2 | 7/2006 | Asai | |
| 7,072,535 B2 | 7/2006 | Uchida | |
| 7,248,757 B2 | 7/2007 | Iwasaki | |
| 7,437,030 B2 | 10/2008 | Asai et al. | |
| 7,674,987 B2 | 3/2010 | Kodama et al. | |
| 7,693,382 B2 | 4/2010 | Asai | |
| 2004/0145873 A1 | 7/2004 | Kim et al. | |
| 2005/0063635 A1 | 3/2005 | Yamada et al. | |
| 2006/0012967 A1 | 1/2006 | Asai et al. | |
| 2007/0297729 A1 | 12/2007 | Kodama et al. | |
| 2008/0170819 A1 | 7/2008 | Kodama et al. | |
| 2008/0247703 A1 | 10/2008 | Kodama et al. | |
| 2008/0247704 A1 | 10/2008 | Kodama et al. | |
| 2008/0285910 A1 | 11/2008 | Yamada et al. | |
| 2008/0308311 A1 | 12/2008 | Kodama et al. | |
| 2008/0310793 A1 | 12/2008 | Kodama et al. | |

FOREIGN PATENT DOCUMENTS

| | | |
|---|---|---|
| EP | 1 376 180 A2 | 1/2004 |
| JP | 11-113033 | 4/1999 |
| JP | 11-248956 | 9/1999 |
| JP | 2000-298216 | 10/2000 |
| JP | 2001-311846 | 11/2001 |
| JP | 2002-250830 | 9/2002 |
| JP | 2002-267863 | 9/2002 |
| JP | 2002-277694 | 9/2002 |
| JP | 2002-329891 | 11/2002 |
| JP | 2002-331532 | 11/2002 |
| JP | 2003-287637 | 10/2003 |
| JP | 2004-20767 | 1/2004 |
| JP | 2004-86185 | 3/2004 |

*Primary Examiner* — Daniel Petkovsek

(74) *Attorney, Agent, or Firm* — Oblon, Spivak, McClelland, Maier & Neustadt, L.L.P.

(57) ABSTRACT

A multilayer printed circuit board according to the present invention is a multilayer printed circuit board where a plurality of insulating layers, a conductor circuit and an optical circuit are formed and layered and an optical element is mounted, wherein the above described optical circuit is formed between the above described insulating layers.

21 Claims, 29 Drawing Sheets

MULTILAYER PRINTED CIRCUIT BOARD

CROSS-REFERENCE TO RELATED APPLICATIONS

This application is a continuation application of and claims benefit of the priority to U.S. application Ser. No. 11/737,792, filed Apr. 20, 2007, which is a continuation application of PCT/JP2005/018361, filed on Oct. 4, 2005, which claims priority of JP-A 2004-308782 filed on Oct. 22, 2004. The contents of these applications are incorporated herein by reference in their entirety.

BACKGROUND OF THE INVENTION

1. Field of the Invention

The present invention relates to a multilayer printed circuit board which can be used for optical communications.

2. Discussion of the Background

In recent years, together with the expansion of high speed Internet networks, it has been suggested that optical communications be used in communication between trunk networks and terminal equipments (personal computers, mobile units, games and the like), communication between terminal equipments and communication within terminal equipment, in addition to communication within trunk networks.

In trunk networks, increase in the speed of switching apparatuses, such as address translators and routers, is progressing, together with increase in the amount of information, and therefore, transmission of signals between a daughter board and a switching board in, for example, bookshelf type backplane boards through optical communication has been examined, and optical communication through optical fibers using optical connectors has been examined (see JP-A 1999-113033).

In addition, provision of an optical transceiver in terminal equipment allowing optical communication through optical fibers has also been examined.

The contents of JP-A 1999-113033 are incorporated herein by reference in their entirety.

Electronic parts are mounted on the two surfaces of printed circuit boards used as a daughter board and inside terminal equipment, in order to achieve higher performance and miniaturization of switching apparatuses and terminal equipment in printed circuit boards, and furthermore, miniaturization and increase in the density of mounting of electronic parts are achieved together with increase in the number of mounted parts.

In addition, in the case where optical communication through optical fibers is used, as described above, an optical connector is mounted in the periphery of an end portion of the printed circuit board which forms, for example, a daughter board, and furthermore, this optical connector is connected to a photoelectric conversion element mounted on the printed circuit board. In addition, an optical transceiver is also provided to terminal equipment, usually in such a state as to be mounted on a multilayer printed circuit board.

Thus, it has become necessary for optical connectors and photoelectric conversion elements and optical transceivers to be mounted on a printed circuit board, and in this case, it is necessary to secure a new space for mounting on a printed circuit board, causing a problem that the printed circuit board increases in size, and furthermore, connection with an optical fiber is required and the location in which this is mounted is limited to the periphery of an end portion of the printed circuit board, and as a result, a problem arises that there is less freedom in design.

Thus, as a result of diligent examination, the present inventors found that optical circuits may be formed inside a multilayer printed circuit board in order to achieve miniaturization of the printed circuit board for achieving miniaturization of terminal equipment and the like, and increase the freedom in design, and completed the present invention.

SUMMARY OF THE INVENTION

A multilayer printed circuit board according to the present invention is a multilayer printed circuit board where a plurality of insulating layers, a conductor circuit and an optical circuit are formed and layered and an optical element is mounted, wherein the above described optical circuit is formed between the above described insulating layers.

In the multilayer printed circuit board according to the present invention, an insulating layer and a conductor circuit are desirably formed and layered on each of two surfaces of the above described optical circuit.

In the above described multilayer printed circuit board, an optical signal transmitting region is desirably formed so as to penetrate through at least one of the above described insulating layers and at least one end of the above described optical signal transmitting region and the above described optical circuit are optically coupled.

In addition, in this case, the above described optical signal transmitting region is formed so as to penetrate through one outermost insulating layer, and a conductor circuit and/or a pad are/is desirably formed in a location on the outside of the other outermost insulating layer and along a line extending from the side of above described optical signal transmitting region which is optically coupled with the above described optical circuit.

In the above described multilayer printed circuit board, the above described optical circuits are desirably formed so as to be located in different layers, and it is visually confirmed that a portion of one optical circuit and a portion of another optical circuit from among the optical circuits in different layers are superposed on one another when viewed in the direction perpendicular to one main surface of the multilayer printed circuit board.

In the above described multilayer printed circuit board, the above described optical circuit is desirably layered on at least one of the above described insulating layers, the above described conductor circuit and another optical circuit by interposing an adhesive layer.

In the above described multilayer printed circuit board, desirably, a via hole for connecting conductor circuits sandwiching the above described insulating layer is formed and the above described via hole is a penetrating via hole and/or a non-penetrating via hole.

In the above described multilayer printed circuit board, desirably, the above described optical circuit has a core and a clad, and it is visually confirmed that a portion of the above described core and a portion of the above described non-penetrating via hole are superposed on one another when viewed in the direction perpendicular to one main surface of the multilayer printed circuit board.

In addition, in the above described multilayer printed circuit board, the above described optical circuit is desirably an optical waveguide.

In the above described multilayer printed circuit board, the above described optical circuit is desirably an optical waveguide or an optical fiber sheet.

In the above described multilayer printed circuit board, the above described optical circuit is desirably in film form.

In the above described multilayer printed circuit board, a transparent solder resist layer is desirably formed as an outermost layer.

In the above described multilayer printed circuit board, a solder resist layer is formed as an outermost layer; an optical waveguide and an optical connector are desirably fixed on the above described solder resist; and the above described optical waveguide is desirably coupled with the above described optical connector.

The above described multilayer printed circuit board desirably has a plurality of the above described optical signal transmitting regions, and at least one of the above described optical signal transmitting regions is desirably not exposed to an outermost part.

In the multilayer printed circuit board according to the present invention, desirably, an insulating layer where conductor circuits are formed on both surfaces and furthermore, an optical waveguide is formed on at least one surface, is layered by interposing an insulating layer comprising an adhesive insulating material.

In addition, in the multilayer printed circuit board according to the present invention, insulating layers where conductor circuits are formed on both surfaces are also desirably layered on both surfaces of an optical waveguide film or an optical fiber sheet by interposing an insulating layer comprising an adhesive insulating material.

In addition, insulating layers where conductor circuits are formed on both surfaces are also desirably layered by interposing an insulating layer comprising an adhesive insulating material on both surfaces of an insulating layer where an optical waveguide is formed on at least one surface.

Here, in the present specification, optical connection between an optical signal transmitting region and an optical waveguide means a state where the connection is formed so that an optical signal can be transmitted between the two, and a specific configuration for this is described in the following.

BRIEF DESCRIPTION OF THE DRAWINGS

FIG. 12-1 is a cross section view schematically showing a multilayer printed circuit board according to another embodiment of the present invention.

FIG. 12-2 is a cross section view schematically showing a multilayer printed circuit board according to another embodiment of the present invention.

DESCRIPTION OF THE EMBODIMENTS

Figure 1:
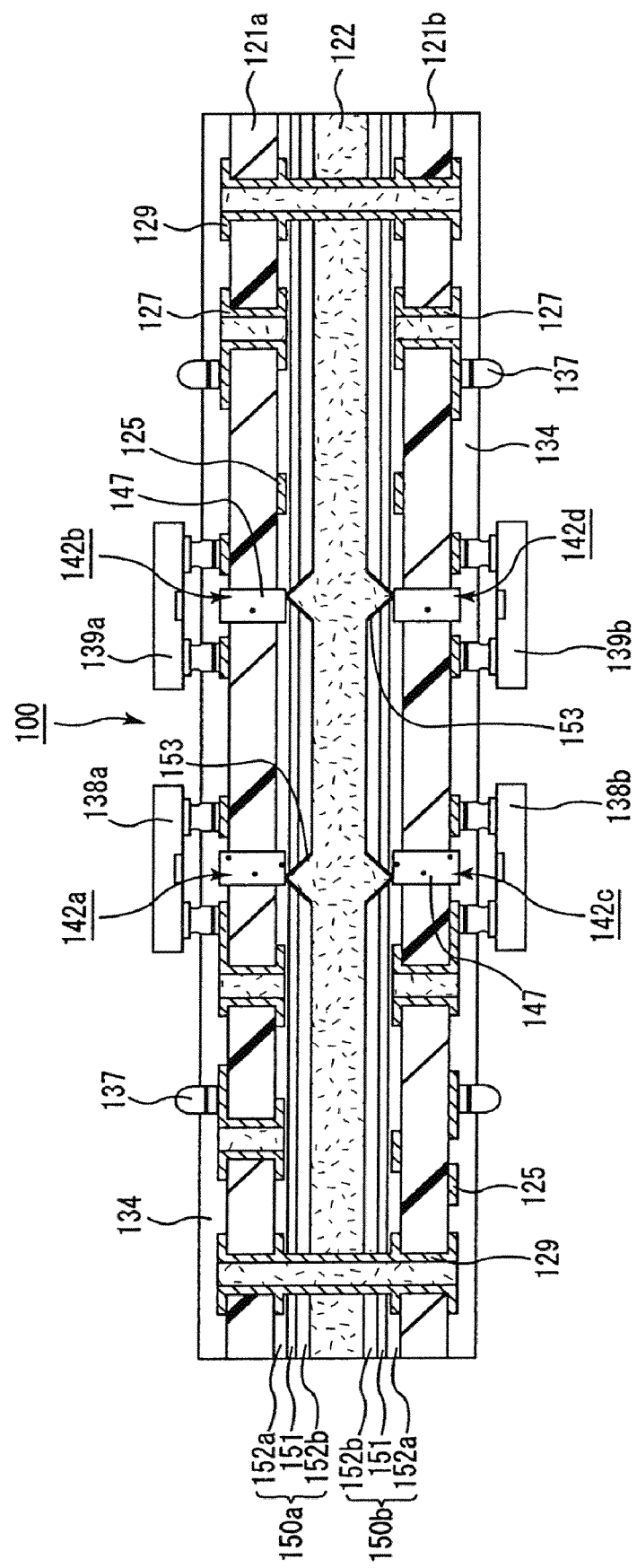
FIG. 1 is a cross section view schematically showing a multilayer printed circuit board according to one embodiment of the present invention.

In the following, multilayer printed circuit boards according to the embodiments of the present invention are described.

A multilayer printed circuit board according to the present invention is a multilayer printed circuit board where a plurality of insulating layers, a conductor circuit and an optical circuit are formed and layered and an optical element is mounted, wherein the above described optical circuit is formed between the above described insulating layers.

In the multilayer printed circuit board according to the present invention, an optical circuit is formed between insulating layers.

The manner in which the optical circuits are formed between the insulating layers is described in detail in the following in reference to the drawings, and embodiments where (1) an insulating layer where conductor circuits are formed on both sides and an optical waveguide is formed on at least one side is layered by interposing an insulating layer comprising an adhesive insulating material, (2) insulating layers where conductor circuits are formed on both sides are layered on both sides of an optical waveguide film or an optical fiber sheet by interposing an insulating layer comprising an adhesive insulating material, or (3) insulating layers where conductor circuits are formed on both sides are layered on both sides of an insulating layer where an optical waveguide is formed on at least one side by interposing an insulating layer comprising an adhesive insulating material, and the like can be cited as examples.

Here, optical circuits may be formed in different layers in the above described multilayer printed circuit board.

As the above described optical circuits, optical waveguides, optical fiber sheets and the like can be cited.

As the above described optical waveguides, organic optical waveguides comprising a polymer material and the like and inorganic optical waveguides comprising silica glass, a compound semiconductor and the like can be cited. From among these, organic optical waveguides comprising a polymer material and the like is desirable. This is because these have excellent adhesiveness with insulating layers and processing is easy.

As the above described polymer material, there are no particular limitations, as long as long as absorption of light in the communication wavelength band is little, and thermosetting resins, thermoplastic resins, photosensitive resins, thermosetting resins which are partially converted to a photosensitive resin, resin compounds of a thermosetting resin and a thermoplastic resin, compounds of a photosensitive resin and a thermoplastic resin, and the like can be cited.

Specifically, acrylic resins such as PMMA (polymethyl methacrylate), heavy-hydrogenated EMMA, heavy-hydrogen fluoridated PMMA; polyimide resins such as fluorinated polyimide; epoxy resins; UV setting epoxy resins; polyolefin based resins; silicone resins such as heavy-hydrogenated silicone resin; siloxane resins; polymers manufactured from benzocyclobutene; and the like can be cited.

In addition, it is desirable for the thickness of the core of the above described optical waveguides to be 1 to 100 µm, and it is desirable for the width to be 1 to 100 µm. In the case where the above described width is less than 1 µm, formation thereof sometimes not easy, while in the case where the above described width exceeds 100 µm, this may cause freedom in design for the conductor circuits and the like which form the multilayer printed circuit board to be impeded.

In addition, it is desirable for the ratio of the thickness to the width of the core of the above described optical waveguides to be close to 1:1. This is because the light receiving portion of the above described light receiving elements and the light emitting portion of the above described light emitting elements are usually in circular form in a plan view. Here, the above described ratio of the thickness to the width is not particularly limited, and it usually falls in the range of about (1:2) to about (2:1).

In addition, it is desirable for the above described optical waveguides to be an optical waveguide having multiple modes, and in the case where the above described optical waveguides are optical waveguides having multiple modes for a communication wavelength of 0.85 µm, it is more desirable for the thickness and the width of the core to be 20 to 80 µm, and it is most desirable for these to be about 50 µm.

An optical waveguide having multiple modes is desirable because it makes positioning of optical waveguides and optical elements relatively easy in comparison with optical waveguides having a single mode, and the allowance for positional deviation is high.

In addition, particles may be mixed in with the above described waveguides. This is because mixing in of particles makes it difficult for cracking to occur in the optical waveguides. That is to say, in the case where no particles are mixed in with the optical waveguides, cracking may occur in the optical waveguides, due to the difference in the coefficient of thermal expansion between the optical waveguides and other layers (for example insulating layers), while in the case where particles are mixed in with the optical waveguides so as to adjust the coefficient of thermal expansion, and thus, the difference in the coefficient of thermal expansion with the other layers described above becomes smaller, it becomes difficult for cracking to occur in the optical waveguides.

As the above described particles, the same particles as those included in the resin composite that forms the below described optical signal transmitting region and the like can be cited as examples. Any of these particles may be used alone, or two or more kinds may be used together.

As the above described particles, inorganic particles are desirable, and particles comprising silica, titania or alumina are desirable. In addition, particles having a mixed composition which are formed by mixing and fusing at least two kinds from among silica, titania and alumina are also desirable.

In addition, the form of particles for the above described resin particles, for example, is not particularly limited, and spherical form, elliptic spherical form, crushed form, polygonal form and the like can be cited.

In addition, it is desirable for the particle diameter of the above described particles to be shorter than the communication wavelength. This is because transmission of optical signals may be hindered in the case where the particle diameter is longer than the communication wavelength.

It is desirable for the lower limit of the above described particle diameter to be 0.01 µm and for the upper limit to be 0.8 µm. This is because in the case where particles outside this range are included, the distribution in particle size becomes too wide, making the inconsistency in viscosity of the resin composite great when the particles are mixed into the resin composite, and thus, reproducibility in terms of preparation of the resin composite becomes low and it sometimes becomes difficult to prepare a resin composite having a predetermined viscosity.

It is more desirable for the lower limit of the above described particle diameter to be 0.1 µm and for the upper limit to be 0.8 µm. Particles within this range are appropriate for making it easy to apply the resin composite using spin coating, roll coating and the like, and in addition, when a resin composite into which particles are mixed is prepared, it is easy to adjust the viscosity to a predetermined value.

It is most desirable for the lower limit of the above described particle diameter to be 0.2 µm and for the upper limit to be 0.6 µm. This range is particularly suitable for application of the resin composite and for formation of the core of optical waveguides. Furthermore, inconsistency in the formed optical waveguides, particularly inconsistency in the core, becomes smallest, making the properties of the multilayer printed circuit board excellent.

In addition, two or more kinds of particles having different particle diameters may be included, as long as the particles have particle diameters within this range.

A desirable lower limit for the amount of the above described particles mixed in is 10% by weight, and a more desirable lower limit is 20% by weight. Meanwhile, a desirable upper limit for the above described particles is 80% by weight, and a more desirable upper limit is 70% by weight. In the case where the amount of particles mixed in is less than 10% by weight, the effects of mixing in particles may not be gained, while in the case where the amount of particles mixed in exceeds 80% by weight, transmission of optical signals may be hindered.

In addition, though the form of the above described optical waveguides is not particularly limited, it may be film form, because this makes formation easy.

In addition, in the case where the above described optical waveguides are formed of a core and a clad, though the above described particles may be mixed in with both the core and the clad, it is desirable for the particles not to be mixed in with the core, and for the particles to be mixed in only with the clad which coats the surrounding of the core. The reason for this is as follows.

That is to say, in the case where particles are mixed in with an optical waveguide, an air layer may be formed in the interface between the particles and the resin component of the optical waveguide, depending on the adhesiveness between the particles and the resin component, and in such a case, the air layer may change the direction of refraction of light, making the transmission loss in the optical waveguide great, while in the case where particles are mixed in only with the clad, no such problem that the transmission loss in the optical waveguide becomes great arises when particles as those described above are mixed in, and at the same time, it becomes difficult for cracking to occur in the optical waveguide, and the above described effects can be gained.

In addition, as the above described optical fiber sheet, an optical fiber sheet where a plurality of optical fibers are placed in parallel and the surrounding thereof are coated with a cover resin layer made of a resin composite and the like so that a film is formed can be cited. In this case, the optical fibers may be placed in parallel only in one layer, or optical fibers placed in parallel may be piled up in a plurality of layers.

As the above described optical fibers, there are no particular limitations, and silica glass based optical fibers (SOF), polymer clad optical fibers (PCF), hard polymer clad optical fibers (HPCF), plastic optical fibers (POF) and the like can be cited. From among these, silica glass based optical fibers (SOF) are desirable, taking into consideration that the thickness can be reduced.

Only one optical fiber of which the surrounding is coated with a resin composite and which is in film form can also be used as the above described optical fiber sheet.

In addition, in the case where optical circuits as those described above are formed so as to be located in different layers in the above described multilayer printed circuit board, desirably, it is visually confirmed that a portion of one optical circuit and a portion of another optical circuit from among the optical circuits in different layers are superposed on one another when viewed in the direction perpendicular to one main surface of the multilayer printed circuit board.

In the case where optical circuits are provided in such locations, there is great freedom in design in terms of the locations of optical circuits, and therefore, optical signals can be designed so as to be transmitted over the shortest distance, and thus, transmission loss within the multilayer printed circuit board can be reduced.

In addition, because there is great freedom in design for the optical circuits, miniaturization of the multilayer printed circuit board and increase in the density of wires (circuits) can be achieved, and furthermore, the density of optical parts and electronic parts mounted on the surface can be increased.

In terms of the manner in which it is visually confirmed that a portion of one optical circuit and a portion of another optical circuit are superposed on one another, embodiments where the two are partially superposed on one another in such a manner as to cross perpendicularly or diagonally; in parallel; or the like can be cited.

In addition, it is desirable for an optical path conversion mirror to be formed in the above described optical circuits. This is because the formation of an optical path conversion mirror makes it possible to change the optical path to a desired angle, so that it can be optically coupled with an end portion of the optical signal transmitting region. In this case, the optical path conversion mirror may make contact with air or a resin having a different index of refraction, or a metal vapor deposition layer may be formed. As the above described metal vapor deposition layer, gold, silver, platinum, copper, nickel, palladium, aluminum, chromium, alloys of these and the like can be cited. These may be used alone or in combination.

The above described optical path conversion mirror can be formed by cutting an optical circuit, and if necessary, forming a metal vapor deposition layer, as described below. In addition, a member having an optical path diverting portion may be placed at an end portion of an optical circuit by using an adhesive, instead of forming an optical path conversion mirror in the optical circuit.

In addition, in the case where an optical path conversion mirror is formed as described above, though the angle at which it is formed is not particularly limited, and an appropriate angle may be selected in accordance with the optical path, an optical path conversion mirror is usually formed so that the angle formed with the surface that makes contact with the insulating layer is 45° or 135°. It is particularly desirable for the above described angle to be 45° when the optical path conversion mirror is formed, and in this case, formation thereof particularly easy.

It is desirable in the multilayer printed circuit board according to the present invention for an optical signal transmitting region to be formed so as to penetrate through at least one insulating layer in such a manner that at least one end of the above described optical signal transmitting region is optically coupled with one end of the above described optical circuit.

This is because by forming such an optical signal transmitting region, freedom in design of an optical circuit becomes greater.

The above described optical signal transmitting region may be formed of only a space, or a space that is partially or entirely filled in with a resin composite. In the case where the entirety of the above described optical signal transmitting region is filled in with a resin composite, the above described optical signal transmitting region is formed of the resin composite.

As the resin component in the above described resin composite, there are no particular limitations, as long as it has a little absorption in the communication wavelength band, and thermosetting resins, thermoplastic resins, photosensitive resins, thermosetting resins which are partially converted to a photosensitive resin, and the like can be cited as examples.

Specifically, epoxy resins; UV setting epoxy resins; polyolefin based resins; acrylic resins such as PMMA (polymethyl methacrylate), heavy-hydrogenated PMMA, and heavy-hydrogen fluoridated PMMA; polyimide resins such as fluorinated polyimide; silicone resins such as heavy-hydrogenated silicone resin; polymers manufactured from benzocyclobutene; and the like can be cited as examples.

In addition, the above described resin composite may include particles, for example resin particles, inorganic particles, metal particles or the like, in addition to the above described resin component. When these particles are included, matching in the coefficient of thermal expansion can be achieved between the optical signal transmitting region and the insulating layers and the like, and in addition, the optical signal transmitting region may become fire retardant, depending on the kind of particles.

As the above described particles, inorganic particles, resin particles, metal particles and the like can be cited as examples.

As the above described inorganic particles, particles comprising aluminum compounds such as alumina and aluminum hydroxide; calcium compounds such as calcium carbonate and calcium hydroxide; potassium compounds such as potassium carbonate; magnesium compounds such as magnesia, dolomite, basic magnesium carbonate, and talc; silicon compounds such as silica and zeolite; titanium compounds such as titania; and the like can be cited as examples. In addition, the particles may have a mixed composite where at least two kinds of inorganic materials are mixed and fused.

As the above described resin particles, particles comprising a thermosetting resin, a thermoplastic resin or the like can be cited as examples, and specifically, particles comprising an amino resin (melamine resin, urea resin or guanamine resin), an epoxy resin, a phenol resin, a phenoxy resin, a polyimide resin, a polyphenylene resin, a polyolefin resin, a fluorine resin, a bismaleimide-triazine resin or the like can be cited as examples.

As the above described metal particles, gold, silver, copper, tin, zinc, stainless steel, aluminum, nickel, iron, lead and the like can be cited as examples. It is desirable for the surface layer of the above described metal particles to be coated with resin and the like, in order to secure insulating properties.

In addition, these particles may be used alone, or two or more kinds may be used together.

In addition, it is desirable for the form, the maximum length, content and the like of the above described particles to be the same as those of the particles included in the above described optical waveguides.

In addition, in the case where the optical signal transmitting region is filled in with a resin composite in the multilayer printed circuit board according to the present invention, it is desirable for the transmittance of light transmitting through this resin composite to be 70%/mm or more. This is because in the case where the above described transmittance is less than 70%/mm, sufficient optical signal transmitting performance cannot be gained. It is more desirable for the above described transmittance to be 90%/mm or more.

Here, in the present specification, transmittance of a resin composite refers to the transmittance of transmission light per length of 1 mm. In addition, the above described transmittance refers to transmittance measured at 25° C. to 30° C.

In addition, the above described optical signal transmitting region may have a form through which optical signals can be transmitted via an optical circuit having a single channel, or a form through which optical signals can be transmitted via an optical circuit having multiple channels.

In addition, the optical signal transmitting region which can transmit optical signals via an optical circuit having multiple channels as described above may have a collective through hole structure which can transmit optical signals for all channels, or a individual through hole structure which can transmit optical signals for each channel. Here, in either case, the number of channels is not limited. In addition, there may be an optical signal transmitting region having a collective through hole structure and an optical signal transmitting region having a individual through hole structure together in one multilayer printed circuit board.

As the form of the optical signal transmitting region having a collective through hole structure as described above, a round pillar, a rectangular pillar, a cylindroid shape, a form of a plurality of round pillars aligned in parallel and connected through portions on the sides of adjacent round pillars, and a pillar form with a bottom surrounded by a line and an arc can be cited as examples.

In addition, in the case where the form of the above described optical signal transmitting region is a form of a plurality of round pillars aligned in parallel and connected through portions on the sides of adjacent round pillars, some round pillars may be formed as dummy round pillars which do not actually function as a portion of the optical signal transmitting region.

In addition, it is desirable for the size of the optical signal transmitting region having a collective through hole structure as described above to be 100 µm to 5 mm longitudinally and laterally. In addition, in the case where the form of the above described optical signal transmitting region is cylindrical, it is desirable for the diameter to be in the above described range.

In the case where the diameter of the cross section is less than 100 µm as described above, transmission of optical signals may be hindered, while in the case where the diameter exceeds 5 mm, the problem regarding transmission loss of optical signals does not improve, making miniaturization of the above described multilayer printed circuit board difficult.

In addition, as the form of each optical signal transmitting region having a individual through hole structure as described above, a round pillar, a rectangular pillar, a cylindroid shape, a pillar form with a bottom surrounded by a line and an arc, and the like can be cited as examples.

It is desirable in the optical signal transmitting region having a individual through hole structure as described above for the lower limit of the diameter in the cross section to be 100 µm, in terms of the size of each optical signal transmitting region, and it is desirable for the upper limit to be 500 µm.

The reason for this is as follows. In the case where the above described diameter is less than 100 µm, there is a risk that the optical path may be clogged, and it may be difficult for the optical signal transmitting region to be filled in with an uncured resin composite. Meanwhile, in the case where the above described diameter is made more than 500 µm, the transmitting properties for optical signals do not increase very much, and this may result in hindering freedom in design for the conductor circuit and the like which form the multilayer printed circuit board.

A more desirable lower limit for the diameter is 250 µm, and a more desirable upper limit for the diameter is 350 µm.

Here, diameter in the cross section in a portion of the above described optical signal transmitting region which penetrates through the above described substrate and the above described insulating layers means the diameter in the cross section in the case where the above described optical signal transmitting region is in cylindrical shape, the long diameter in the cross section in the case of a cylindroid shape, and the length of the longest portion in the cross section in the case of a quadrangular pillar or a polygonal pillar. In addition, in the present invention, cross section in the optical signal transmitting region means the cross section in the direction parallel to the main surface of the multilayer printed circuit board.

Here, it is desirable for the above described optical signal transmitting region to be formed so as to have a size which prevents propagating light from being reflected from the wall surface upon transmission of the optical signal, and in order to do so, it is desirable for the design to be such that collimated light is allowed to transmit through the optical signal transmitting region, by providing the below described micro lens.

The walls of the above described optical signal transmitting region may be formed of resin or metal.

Here, an insulating layer is usually exposed from the wall surface of the above described optical signal transmitting region, and therefore, the walls are formed of the same material as the insulating layers. Accordingly, in the case where the insulating layers are made of resin, the walls of the above described optical signal transmitting region are formed of the resin without any particular processing.

Here, a resin layer may be separately formed on the wall surface of the above described optical signal transmitting region, and in this case, it is desirable for the resin layer to be formed so as to function as a clad, when the resin composite with which the above described optical signal transmitting region is filled in functions as a core.

In addition, in the case where the walls of the above described optical signal transmitting region are formed of a metal, examples of the material include copper, nickel, chromium, titanium, precious metals, and the like.

In addition, in the case where the walls of the above described optical signal transmitting region are formed of a metal, that is to say, in the case where a metal layer is formed on the wall surface of the optical signal transmitting region, this metal layer may be formed of one layer or two or more layers.

In addition, in some cases, the above described metal layer may function as a through hole, that is to say, may electrically connect conductor circuits sandwiching a substrate or conductor circuits sandwiching a substrate and an insulating layer.

In addition, in the case where a resin layer or a metal layer is formed on the wall surface of the above described optical signal transmitting region, it is desirable for the surface (surface which makes contact with the resin composite with which the inside is filled in) to be made coarse, so that the surface roughness (Ra) becomes 0.1 to 5 μm. This is because the adhesiveness with the resin composite increases.

Here, the above described surface may be made coarse through an etching process and the like.

Meanwhile, in the case where a resin layer or a metal layer is formed on the wall surface of the above described optical signal transmitting region, optical signals can be transmitted as light is reflected from this resin layer or metal layer, and in this case, it is desirable for the surface coarseness on the wall surface to be small. This is because the transmission loss of optical signals can be reduced.

In particular, in the case of multilayer boards having a great number of layers, the optical signal transmitting region becomes long, and therefore, it is effective to use a method for transmitting optical signals while light is reflected.

Here, the form of the above described optical signal transmitting region, the location where it is formed and the number of optical signal transmitting regions as that described above are not particularly limited in the multilayer printed circuit board according to the present invention, and an appropriate form, location and number can be selected taking into consideration the design of the multilayer printed circuit board, that is to say, the locations in which optical parts are mounted and the locations where optical waveguides and conductor circuits are formed.

Here, desirably, the above described optical signal transmitting region is formed so as to penetrate through one outermost insulating layer, and a conductor circuit and/or a pad are/is formed in a location on the outside of the other outermost insulating layer and along a line extending from the side of the above described optical signal transmitting region which is optically coupled with the above described optical circuits.

In this configuration, it becomes possible to wire optical circuits and conductor circuits with high density, and furthermore, it becomes possible to mount optical elements and various electronic parts with high density.

Here, the above described pad is provided so that an optical element or various electronic parts can be mounted.

In the case where an optical signal transmitting region is formed in the multilayer printed circuit board according to the present invention, a micro lens may be provided on an end portion and the like on the side opposite to the side of the optical signal transmitting region which is optically coupled with an optical circuit. The above described micro lens may be provided directly, or may be provided by interposing an optical adhesive.

This is because when a micro lens is provided, optical signals can be focused through the micro lens, making it possible for optical signals to be transmitted more certainly.

The above described micro lens is not particularly limited, and micro lenses used as an optical lens can be cited, and as specific examples of the material, optical glass, resins for optical lenses, and the like can be cited. As the above described resins for optical lenses, the same materials as the above described polymer materials described as resin composites, such as acrylic resins and epoxy resins, with which the above described optical signal transmitting region is filled in can be cited as examples.

In addition, as the form of the above described micro lens, a form of a convex lens having a convex surface only on one side can be cited as an example, and in this case, an appropriate radius of curvature for the above described convex lens surface can be selected taking the design of the optical signal transmitting region into consideration. Specifically, it is desirable to increase the radius of curvature, for example, when it is necessary to increase the focal distance, and it is desirable to decrease the radius of curvature when it is necessary to decrease the focal distance.

Here, the form of the above described micro lens is not limited to a form of a convex lens, and may be any form which allows optical signals to be focused in a desired direction.

It is desirable for the transmittance of the above described micro lens for light having the communication wavelength to be 70%/mm or more.

This is because in the case where the transmittance of light having the communication wavelength is less than 70%/mm, loss of optical signals is great, which leads to reduction in the transmission of optical signals. It is more desirable for the above described transmittance to be 90%/mm or more.

In addition, the above described micro lens may include particles such as resin particles, inorganic particles or metal particles.

This is because when particles are included, the strength of the micro lens increases, so that the form can be maintained more certainly and the coefficient of thermal expansion can be matched with the above described substrate, the insulating layers, or the like and thus, it becomes more difficult for cracking and the like to occur due to the difference in the coefficient of thermal expansion.

In the case where particles are included in the above described micro lens, it is desirable for the index of refraction of the resin component of the micro lens and the index of refraction of the above described particles to be approximately the same. Therefore, it is desirable for the particles included in the micro lens to be a mixture of two or more kinds of particles having different indices of refraction, so that the index of refraction of the particles becomes approximately the same as the index of refraction of the resin component.

Specifically, in the case where the resin component is an epoxy resin having an index of refraction of 1.53, for example, it is desirable for the particles included in the micro lens to be particles gained by mixing and fusing silica particles having an index of refraction of 1.46 and titanium particles having an index of refraction of 2.65.

Here, as the method for mixing particles, a kneading method, a method for forming particles after two or more kinds of particles are melted and mixed, and the like can be cited.

Here, as specific examples of the above described particles, the same kinds of particles as those which can be mixed in with the above described optical signal transmitting region and the like can be cited.

Though the particle diameter of the above described particles is not particularly limited, it is desirable for the upper limit to be 0.8 µm and the lower limit to be 0.01 µm.

This is because the above described micro lens is usually provided using an inkjet apparatus or a dispenser, and the minimum size of the inner diameter of the application nozzle of inkjet apparatuses and the inner diameter of the nozzle of dispensers is currently 20 µm, and in the case where the particle diameter is in the above described range, application becomes possible without the nozzle being clogged.

In addition, it is more desirable for the lower limit of the above described particle diameter to be 0.1 µm.

It is more desirable for the above described particle diameter to be in this range taking into consideration the stability of the viscosity and inconsistency in the applied amount in the application using an inkjet apparatus or a dispenser.

A desirable lower limit for the amount of particles mixed in with and included in the above described micro lens is 5% by weight, and a more desirable lower limit is 10% by weight. Meanwhile, a desirable upper limit for the above described amount of particles mixed in is 60% by weight, and a more desirable upper limit is 50% by weight. This is because, in the case where the amount of particles mixed in is less than 5% by weight, the effects of mixing in particles sometimes cannot be gained, while in the case where the amount of particles mixed in exceeds 60% by weight, transmission of optical signals may be hindered.

Here, in the case where the multilayer printed circuit board according to the present invention has an optical circuit having multiple channels and this multilayer printed circuit board is provided with micro lenses, these micro lenses may be micro lenses that are independent of each other or may form a micro lens array where a plurality of lenses are arranged in parallel.

In addition, in the case where micro lenses are provided, it is desirable for a micro lens which is provided on the side facing a light emitting element to be designed so that the focal point is focused on the core of the optical waveguide on the side opposite to the side facing the light emitting element, and for a micro lens that is provided on the side facing a light receiving element to be designed so that light transmitted from the optical waveguide is converted to collimated light.

Though the above described micro lenses may be provided directly as described above, or provided by using an optical adhesive, it is desirable for them to be provided directly.

The above described optical adhesive is not particularly limited, and an epoxy resin based, acryl resin based or silicone resin based optical adhesive and the like can be used.

As for the properties of the above described optical adhesive, the following is desirable: a viscosity of 0.2 Pa·s to 1.0 Pa·s, an index of refraction of 1.4 to 1.6, light transmittance of 80%/mm or more, a coefficient of thermal expansion (CTE) of $4.0 \times 10^{-5}$ (/° C.) to $9.0 \times 10^{-5}$ (/° C.).

In addition, it is desirable for the thickness of the above described optical adhesive to be 50 µm or less.

In addition, in the case where the above described micro lens is provided, a surface process may be carried out in the region in which it is provided.

When resin is applied in order to form a micro lens using an inkjet apparatus and the like, there tends to be inconsistency in the form of the micro lens, specifically the degree of sagging, due to inconsistency in the conditions for the process up to the formation of the solder resist layer and inconsistency in the wettability in the portion in which the micro lens is provided, caused by the difference in the length of time over which the solder resist layer is left, but inconsistency in the degree of sagging can be reduced by carrying out a surface process with a water repellant coating agent, and the like.

As the above described surface process, a process using a water repellant coating agent such as a fluorine based polymer coating agent (surface tension: 10 to 12 mN/m), a water repellant process using $CF_4$ plasma, a hydrophilic process using $O_2$ plasma or the like can be cited as examples.

In addition, the above described micro lens may be provided via a lens marker.

As the above described lens marker, one disclosed in JP-A 2002-331532 can be cited as an example.

In addition, in the case where a lens marker is formed, it is desirable for the above described micro lens to be provided on a lens marker on which a water repellent process or a hydrophilic process is carried out.

This is because of the following. In the case where the surface of the lens marker is dirty, the resin composite (resin composite for a lens) used for the formation of the micro lens does not spread uniformly, and leading to a problem that a micro lens having a desired form cannot be formed, but the dirt on the surface of the lens marker can be removed by carrying out a water repellent process or a hydrophilic process as described above, and thus, the above described resin component for a lens can be spread uniformly over the lens marker.

Furthermore, it is desirable for a hydrophilic process to be carried out, rather than a water repellant process, on the lens marker.

This is because in the case where a hydrophilic process is carried out, the resin composite for a lens that has been dropped onto the lens marker tends to spread over the entirety of the lens marker when the micro lens is provided, and in addition, the spread of this resin stops at the outer periphery of the lens marker without fail, which is suitable for the formation of a micro lens having a predetermined form, due to the surface tension.

Optical elements are mounted in a multilayer printed circuit board of the present invention.

As the above described optical elements, light receiving elements, light emitting elements and the like can be cited as examples.

Appropriate elements may be used from among these, taking into consideration the configuration of the above described multilayer printed circuit board, the required properties and the like.

As the material for the above described light receiving elements, Si, Ge, InGaAs and the like can be cited. InGaAs is desirable from among these, because of the excellent light receiving sensitivity.

As the above described light receiving elements, a PD (photo diode), an APD (avalanche photo diode) and the like can be cited as examples.

As the above described light emitting elements, an LD (semiconductor laser), a DFB-LD (distribution feedback-type semiconductor laser), an LED (light emitting diode), and an infra-type, an oxidation constriction-type VCSEL (plane emission semiconductor laser), and the like can be cited as examples.

Appropriate elements may be used from among these, taking into consideration the configuration of above described multilayer printed circuit board, the required properties and the like.

As the material for the above described light emitting elements, a compound of gallium, arsenic and phosphorous (GaAsP), a compound of gallium, aluminum and arsenic (GaAlAs), a compound of gallium and arsenic (GaAs), a compound of indium, gallium and arsenic (InGaAs), a compound of indium, gallium, arsenic and phosphorous (InGaAsP) and the like can be cited.

An appropriate material may be used from among these, taking the communication wavelength into consideration, and GaAlAs can be used in the case where the communication wavelength is, for example, a band of 0.85 µm, and InGaAs or InGaAsP can be used in the case where the communication wavelength is a band of 1.3 µm or a band of 1.55 µm.

In addition, the optical elements, for example the light receiving elements or the light emitting elements, may be optical elements having multiple channels, and the number of channels is not particularly limited. Here, in the case where the optical elements form an array element having multiple channels, the array element may have light receiving portions or light emitting portions arranged linearly or two-dimensionally.

In addition, the above described optical elements may be mounted through flip chip bonding or wire bonding.

The above described optical element may be mounted in a mounted state on a package substrate, that is to say, as a package substrate mounted with an optical element.

In addition, in the case where an optical element (including a package substrate mounted with an optical element) is mounted as described above, the optical element may be filled in with an underfill after mounting.

The material for the above described underfill is not particularly limited, and thermosetting resins, photosensitive resins, thermosetting resins to which a photosensitive group is partially added, resin compounds including any of these and thermoplastic resins, and the like, for example, can be used. In addition, commercially available resins can be used for the underfill.

In addition, it is desirable for the transmittance of the above described underfill for light having the communication wavelength to be 70%/mm or more. This is because in the case where the transmittance of light having the communication wavelength is less than 70%/mm, loss of optical signals is great, which leads to reduction in the transmission of optical signals. It is more desirable for the above described transmittance to be 90%/mm or more.

As the above described thermosetting resins, epoxy resins, phenol resins, polyimide resins, polyester resins, bismaleimide resins, polyolefin based resins, polyphenylene ether resins, polyphenylene resins, fluorine resins, and the like can be cited as examples.

As the above described photosensitive resins, acrylic resins and the like can be cited as examples.

In addition, as the above described thermosetting resins to which a photosensitive group is partially added, thermosetting resins as those described above, of which the thermosetting group is made to react with a methacrylic acid or an acrylic acid so as to be converted to acryl, and the like can be cited as examples.

As the above described thermoplastic resins, phenoxy resins, polyether sulfone (PES), polysulfone (PSF), polyphenylene sulfone (PPS), polyphenylene sulfide (PPES), polyphenylene ether (PPE), polyether imide (PI), and the like can be cited as examples.

In addition, particles may be included in the above described underfill. In the case where particles are included, the coefficient of thermal expansion can be adjusted by adjusting the amount mixed in, and therefore, matching of the coefficient of thermal expansion can be achieved between the underfill and the package substrates or the optical elements.

As specific examples of the above described particles, the same particles as those which can be included in the above described optical signal transmitting region and the like can be cited.

In addition, in the case where particles as those described above are included in the above described underfill, it is desirable for the lower limit of the amount of the particles mixed in to be 20% by weight, and it is desirable for the upper limit to be 70% by weight. This is because an amount in this range is usually appropriate for matching the coefficient of thermal expansion with the package substrates or the optical elements, and provides the fluidity required at the time of filling.

A more desirable lower limit is 30% by weight, and a more desirable upper limit is 60% by weight.

In addition, insulating layers and conductor circuits are layered in the above described multilayer printed circuit board, and it is desirable for a penetrating via hole or a non-penetrating via hole to be further formed as a via hole for connecting conductor circuits which sandwich an insulating layer.

In the case where a penetrating via hole is formed, conductor circuits in different layers can be connected in a simple structure and collectively, even when the optical circuits are formed in an inner layer (between insulating layers) of the multilayer printed circuit board.

In addition, in the case where a non-penetrating via hole is formed, the diameter of the via hole can be made small, which is appropriate for increasing the density of wires (circuits) on the multilayer printed circuit board.

Here, one or both of a non-penetrating via hole and a penetrating via hole can be formed in accordance with the design of the multilayer printed circuit board, and there is great freedom in design for conductor circuits, so that increase in the density of wires (circuits) can be achieved, even when the optical circuits are in an inner layer, when these are formed.

In addition, in the case where a non-penetrating via hole is formed as described above and the above described optical circuits have a core and a clad, desirably, it is visually confirmed that the above described core and a portion of the above described non-penetrating via hole are superposed on one another when viewed in the direction perpendicular to one main surface of said printed circuit board.

In this case, it is not necessary to wire optical circuits in such a manner that the optical circuits detour around portions where non-penetrating via holes are not formed, and thus, optical circuits can be formed in a layer where non-penetrating via holes are not formed, which is appropriate for wiring the optical circuits and the conductor circuits with high density.

Here, in this case, the up-and-down positional relationship between the above described core and the above described non-penetrating via hole is not important.

In addition, in a multilayer printed circuit board according to the present invention, in the case where an optical circuit (portion having optical transmission performance in the optical circuit) is exposed from the side of a multilayer printed circuit board, in the case where an optical circuit is formed on the surface of a multilayer printed circuit board, or in the case where an optical part (optical connector and the like) is mounted on the surface of a multilayer printed circuit board, the above described multilayer printed circuit board makes signal transmission between package substrates mounted on the multilayer printed circuit board, signal transmission within the multilayer printed circuit board and signal transmission between apparatuses (routers, address translators, switching apparatuses and the like) possible for an optical signal, in addition to signal transmission between multilayer printed circuit boards within an apparatus.

Next, specific embodiments of the multilayer printed circuit boards according to the present invention are described in reference to the FIGS. 1 to 15.

FIG. 1 is a cross-section view schematically showing an embodiment of a multilayer printed circuit board according to the present invention.

As shown in FIG. 1, in a multilayer printed circuit board 100, a substrate (insulating layer) 121a where conductor circuits 125 are formed on the two surfaces and an optical waveguide 150a is formed and layered on one surface, and a substrate (insulating layer) 121b where conductor circuits 125 are formed on the two side of the surfaces and an optical waveguide 150b is formed and layered on one surface are placed and layered by interposing an insulating layer 122 comprising an adhesive insulating material, so that optical waveguides 150a and 150b face each other.

In addition, in the multilayer printed circuit board 100, conductor circuits sandwiching each of substrates 121a and 121b are connected through non-penetrating via holes 127, and conductor circuits sandwiching the entire substrate and insulating layer 122, that is to say, conductor circuits which are formed on the outside of substrates 121a and 121b (side opposite to the side where optical waveguides are formed) are connected through penetrating via holes 129.

In addition, optical signal transmitting regions 142a to 142d are formed in each of the substrates 121a and 121b, and one end of each of the optical signal transmitting region 142a to 142d is optically connected to either an optical waveguide 150a or 150b. Accordingly, optical path conversion mirrors 153 are formed in optical waveguides 150a and 150b in locations corresponding to the respective optical signal transmitting regions 142a to 142d. In addition, a metal vapor deposition layer is formed in optical path conversion mirrors 153.

In addition, solder resist layers 134 which are transparent to transmission light are formed on the outside of substrates 121a and 121b, and furthermore, light receiving elements 138a and 138b and light emitting elements 139a and 139b are mounted. In addition, solder bumps 137 are formed at solder resist layers 134, and various electronic parts can be mounted by interposing these solder bumps 137.

Here, the solder resist layer transparent to transmission light means that the transmittance of transmission light is 60%/30 μm or more in the case where the thickness of the solder resist layer is 30 μm.

In the multilayer printed circuit board 100 having this configuration, optical signals from the light emitting element 139a are transmitted to the light receiving element 138a via an optical signal transmitting region 142b, an optical waveguide 150a and an optical signal transmitting region 142a, and optical signals from the light emitting element 139b are transmitted to the light receiving element 138b via an optical signal transmitting region 142d, an optical waveguide 150b and an optical signal transmitting region 142c.

In this manner, signal transmission within the substrate can be achieved through optical signals in the multilayer printed circuit board 100.

In addition, though optical waveguides are formed on both substrates 121a and 121b in the multilayer printed circuit board 100, an optical waveguide may be formed on only one of the substrates.

Figure 2:
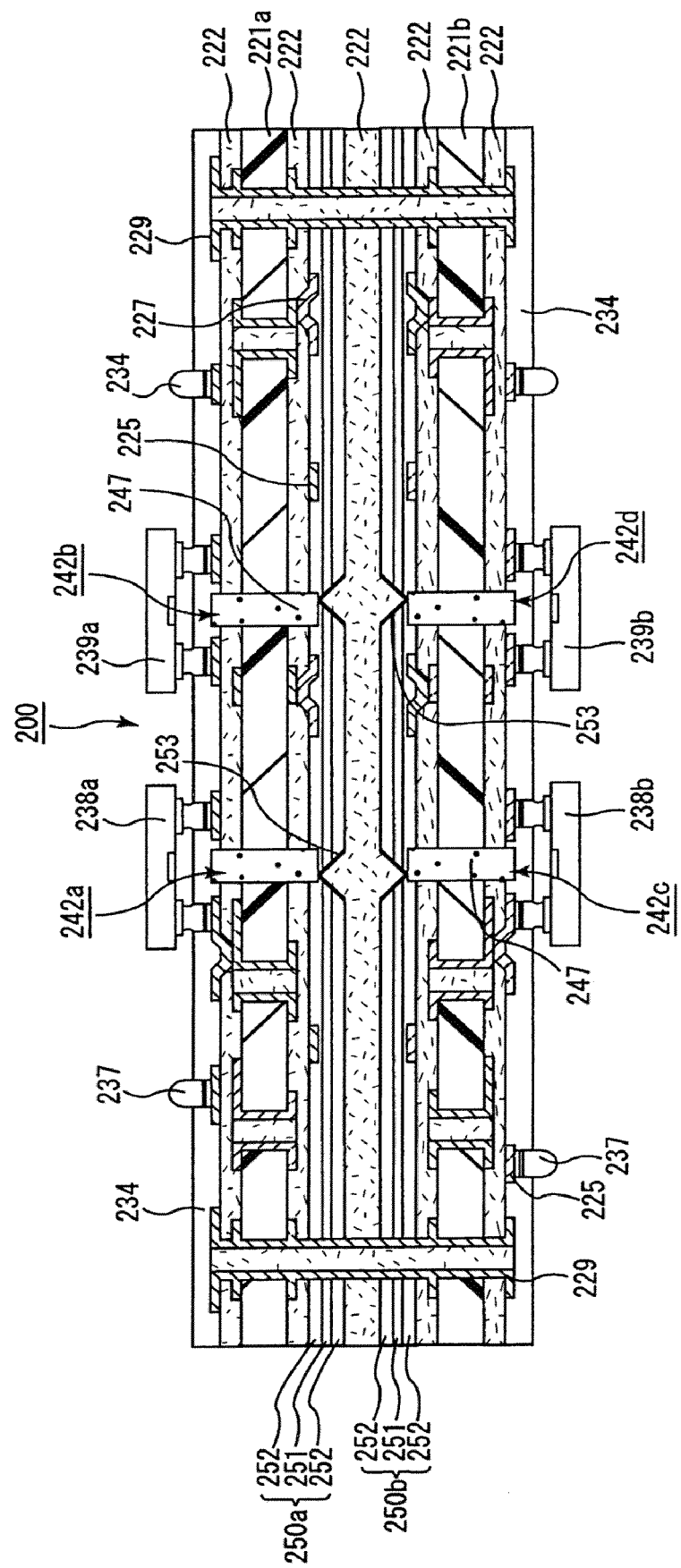
FIG. 2 is a cross section view schematically showing a multilayer printed circuit board according to another embodiment of the present invention.

FIG. 2 is a cross section view schematically showing a multilayer printed circuit board according to another embodiment of the present invention.

As shown in FIG. 2, in a multilayer printed circuit board 200, a substrate (insulating layer) 221a where conductor circuits 225 and insulating layers 222 are formed and layered on both sides, and furthermore, an optical waveguide 250a is formed and layered on one side, and a substrate (insulating layer) 221b where conductor circuits 225 and insulating layers 222 are formed and layered on both sides, and furthermore, an optical waveguide 250b is formed and layered on one side, are layered on top of each other by interposing an insulating layer 222 comprising an adhesive insulating material so that optical waveguides 250a and 250b are disposed so as to face each other.

In addition, in the multilayer printed circuit board 200, conductor circuits sandwiching each of substrates 221a and 221b are connected through non-penetrating via holes 227, and conductor circuits sandwiching the entire substrate and an insulating layer 222, that is to say, conductor circuits formed on the outside of each of the substrates 221a and 221b (side opposite to the side where optical waveguides are formed) are connected through penetrating via holes 229.

In addition, optical signal transmitting regions 242a to 242d are formed in each of the substrates 221a and 221b, and one end of each optical signal transmitting region 242a to 242d is optically coupled to either optical waveguide 250a or 250b. Accordingly, optical path conversion mirrors 253 are respectively formed in each of the optical waveguides 250a and 250b in the respective locations corresponding to the optical signal transmitting regions 242a to 242d. In addition, a metal vapor deposition layer is formed on optical path conversion mirrors 253.

In addition, solder resist layers 234 which are transparent to transmission light are formed on the outside of each of the substrates 221a and 221b, and furthermore, light receiving elements 238a and 238b and light emitting elements 239a and 239b are mounted. In addition, solder bumps 237 are formed at solder resist layers 234, and various electronic parts can be mounted by interposing these solder bumps.

In the multilayer printed circuit board 200 having this configuration, optical signals from the light emitting element 239a are transmitted to the light receiving element 238a via an optical signal transmitting region 242b, an optical waveguide 250a and an optical signal transmitting region 242a, and optical signals from the light emitting element 239b are transmitted to the light receiving element 238b via an optical signal transmitting region 242d, an optical waveguide 250b and an optical signal transmitting region 242c.

In this manner, in the multilayer printed circuit board 200, signal transmission within the substrate can be achieved through optical signals.

Figure 3:
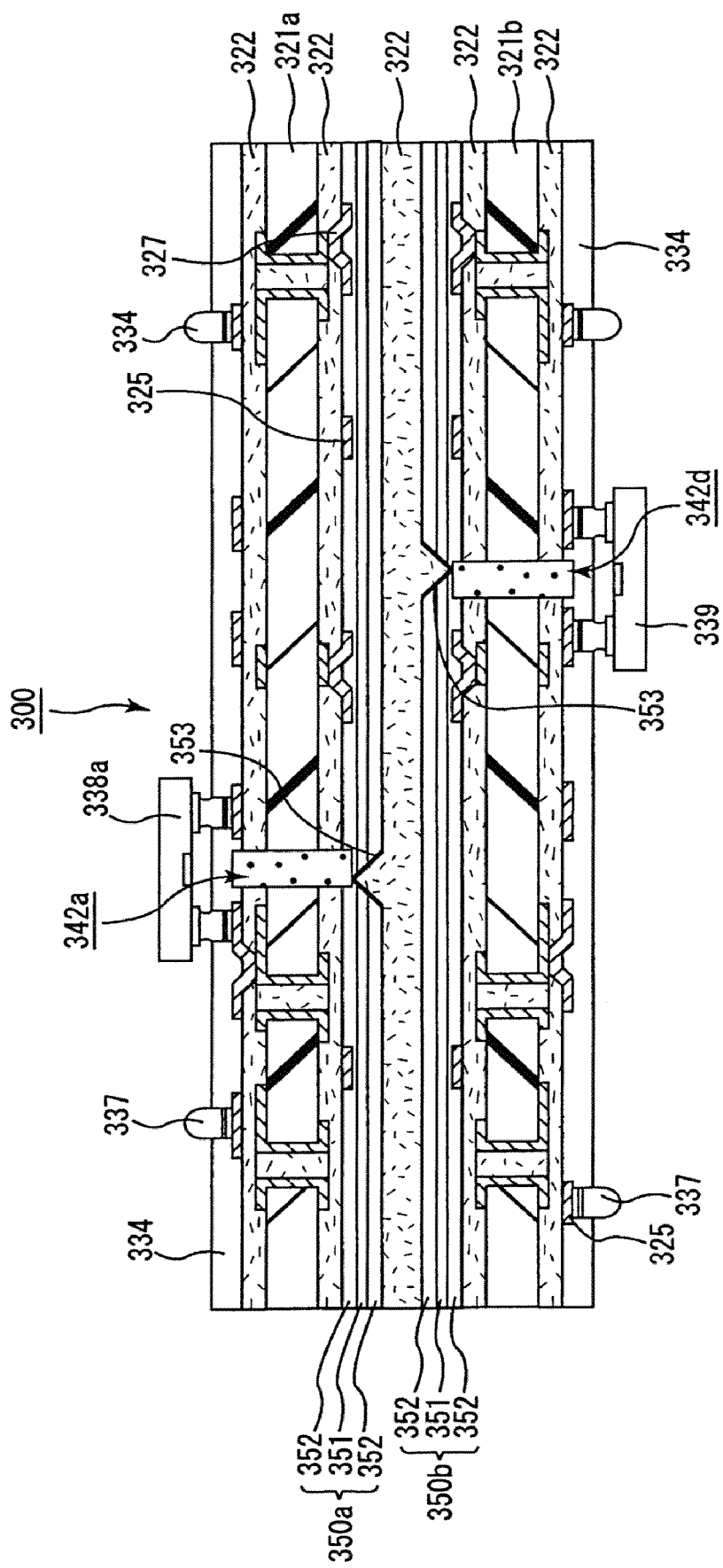
FIG. 3 is a cross section view schematically showing a multilayer printed circuit board according to another embodiment of the present invention.

FIG. 3 is a cross section view schematically showing a multilayer printed circuit board according to another embodiment of the present invention.

A multilayer printed circuit board 300 shown in FIG. 3 has approximately the same configuration as the multilayer printed circuit board 200 shown in FIG. 2. Here, the functions are different, and accordingly, the configuration is slightly different.

That is to say, the multilayer printed circuit board 200 allows signal transmission within the substrate to be achieved through optical signals, as described above, while the multilayer printed circuit board 300 allows signal transmission between substrates to be achieved through optical signals, and accordingly, optical elements and optical waveguides are formed. Specifically, optical signals emitted from a light emitting element 339 are transmitted to an external substrate, not shown, from a side of the multilayer printed circuit board via an optical waveguide 350b after the optical path is converted by an optical path conversion mirror 353 in the configuration, and in addition, optical signals transmitted from an external substrate (not shown) are transmitted to a light receiving element 338 via an optical waveguide 350a (including optical path conversion mirror 353) in the configuration.

Here, penetrating via holes are formed, though not shown in FIG. 3.

In addition, the configuration of substrates (insulating layers) 321a and 321b, conductor circuits 325, non-penetrating via holes 327, insulating layers 322 and solder resist layers 334 is the same as in the multilayer printed circuit board 200 shown in FIG. 2.

Thus, a multilayer printed circuit board according to the present invention may allow signal transmission between substrates to be achieved through optical signals.

In addition, in the case where a portion of an optical waveguide which functions as an optical path is exposed from a side of a multilayer printed circuit board as the multilayer printed circuit board 300 shown in FIG. 3, an optical fiber array can be connected, or an optical connector, such as an FC connector, an MT connector or an MPO connector, can be connected to the side of the substrate, and thereby, optical signals can be transmitted to an external substrate using an optical fiber. Here, as the method for connecting these to the side of the multilayer printed circuit board, connection through active alignment by using an optical adhesive and connection through passive alignment by using a guide pin for a guide hole formed on a side or the upper surface of the multilayer printed circuit board are possible.

In addition, the optical connector of, for example, a backplane board where an optical connector is provided and an optical waveguide can be optically connected by inserting the above described multilayer printed circuit board into the backplane board.

Figure 4:
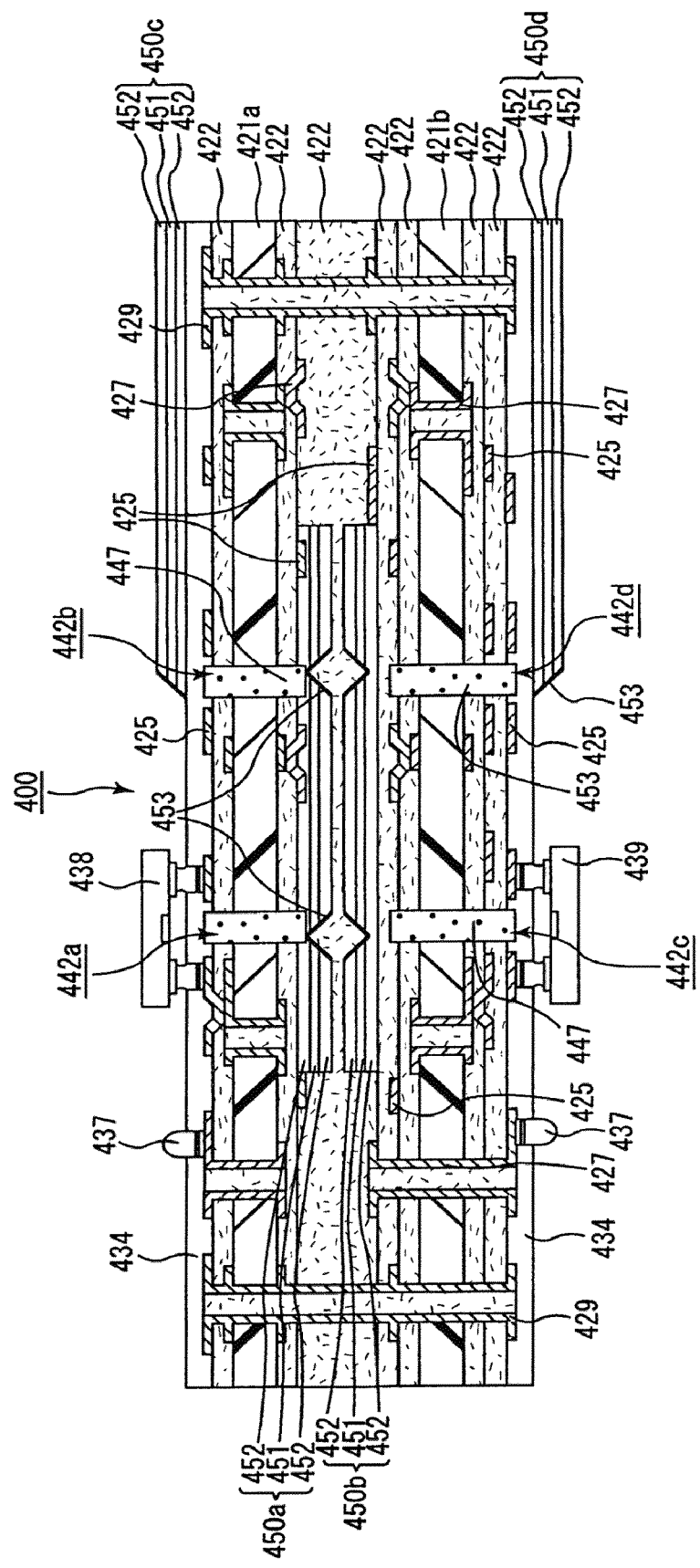
FIG. 4 is a cross section view schematically showing a multilayer printed circuit board according to another embodiment of the present invention.

FIG. 4 is a cross section view schematically showing a multilayer printed circuit board according to another embodiment of the present invention.

As shown in FIG. 4, in a the multilayer printed circuit board 400, a substrate (insulating layer) 421a where conductor circuits 425 and insulating layers 422 are alternately formed and layered on the two sides, and furthermore, an optical waveguide 450a is formed and layered in a portion on one side, and a substrate (insulating layer) 421b where conductor circuits 425 and insulating layers 422 are alternately formed and layered on the two sides, and furthermore, an optical waveguide 450b is formed and layered in a portion on one side are disposed so that optical waveguides 450a and 450b face each other and layered on top of each other by interposing an insulating layer 422 comprising an adhesive insulating material.

Here, each of the optical waveguides 450a and 450b are formed of a core 451 and a clad 452. In addition, the optical waveguides 450a and 450b are formed in a portion of the space between insulating layers instead of in the entirety of the space between insulating layers.

In addition, in the multilayer printed circuit board 400, conductor circuits sandwiching each of substrates 421a and 421b, conductor circuits sandwiching an insulating layer 422 formed and layered on a substrate and conductor circuits sandwiching both a substrate and an insulating layer are connected through non-penetrating via holes 427, while conductor circuits sandwiching all of the substrates and insulating layers 422, that is to say, conductor circuits which are respectively formed on the outside of each of the substrates 421a and 421b (on the side opposite to the side where optical waveguides are formed) are connected through penetrating via holes 429.

In addition, optical signal transmitting regions 442a to 442d are formed in each of the substrates 421a and 421b, and one end of each of the optical signal transmitting regions 442a to 442d is optically connected to either an optical waveguide 450a or 450b. Accordingly, optical path conversion mirrors 453 are formed in each of the optical waveguides 450a and 450b, in locations corresponding to each of the optical signal transmitting regions 442a to 442d. In addition, a metal vapor deposition layer is formed on optical path conversion mirrors 253.

Furthermore, solder resist layers 434 which are transparent to transmission light are formed in the outermost layers of the multilayer printed circuit board 400, and an optical waveguide 450c which is optically connected to the side of opposite to the side where an optical signal transmitting region 442b is optically connected to an optical waveguide 450a is formed on a solder resist layer 434 on the substrate 421a side, and in addition, an optical waveguide 450d which is optically connected to the side of an optical signal transmitting region 442d opposite to the side which is optically connected to an optical waveguide 450b is formed on a solder resist layer 434 on the substrate 421b side.

Here, optical waveguides 450c and 450d are also formed of a core 451 and a clad 452. A metal vapor deposition layer is formed on each of the optical path conversion mirrors 453 in optical waveguides 450c and 450d.

According to the present invention, in the case where optical path conversion mirrors are formed, it is not always necessary to form a metal vapor deposition layer. However, in the case where no metal vapor deposition layer is formed, transmission loss during transmission becomes great due to the optical path conversion mirrors, and therefore, it is desirable to form a metal vapor deposition layer.

In addition, in the case where an optical waveguide is formed in an outermost layer of the multilayer printed circuit board, the optical waveguide may be formed on the entire surface or a partial surface thereof.

Each of a light receiving element 438 and a light emitting element 439 are mounted on solder resist layers 434. In addition, solder bumps 437 are formed at solder resist layers 434, so that various electronic parts can be mounted by interposing these solder bumps.

In the multilayer printed circuit board 400 having this configuration, optical signals from the light emitting element 439 are transmitted to an external substrate (not shown) via an optical signal transmitting region 442c, an optical waveguide 450b, an optical signal transmitting region 442d and an optical waveguide 450d, and in addition, optical signals transmitted from the external substrate (not shown) are transmitted to the light receiving element 438 via an optical waveguide 450c, an optical signal transmitting region 442b, an optical waveguide 450a and an optical signal transmitting region 442a.

Accordingly, in the multilayer printed circuit board 400, signal transmission between substrates can be achieved through optical signals.

In the multilayer printed circuit board 400 shown in FIG. 4, optical signals emitted from the light emitting element are transmitted to the optical waveguide formed on the surface of the multilayer printed circuit board via the optical waveguide formed inside the multilayer printed circuit board (between insulating layers), and in addition, optical signals which are transmitted to the optical waveguide formed on the surface of the multilayer printed circuit board from the outside are transmitted to the light receiving element via the optical waveguide formed inside the multilayer printed circuit board in the configuration.

Accordingly, the formation of the optical waveguides on the surface of the multilayer printed circuit board facilitates connection with an optical part, such as an optical connector or an optical fiber array, and in addition, the regions occupied by the optical waveguides on the surface of the multilayer printed circuit board are small, and thus, electronic parts can be mounted with high density.

Figure 5:
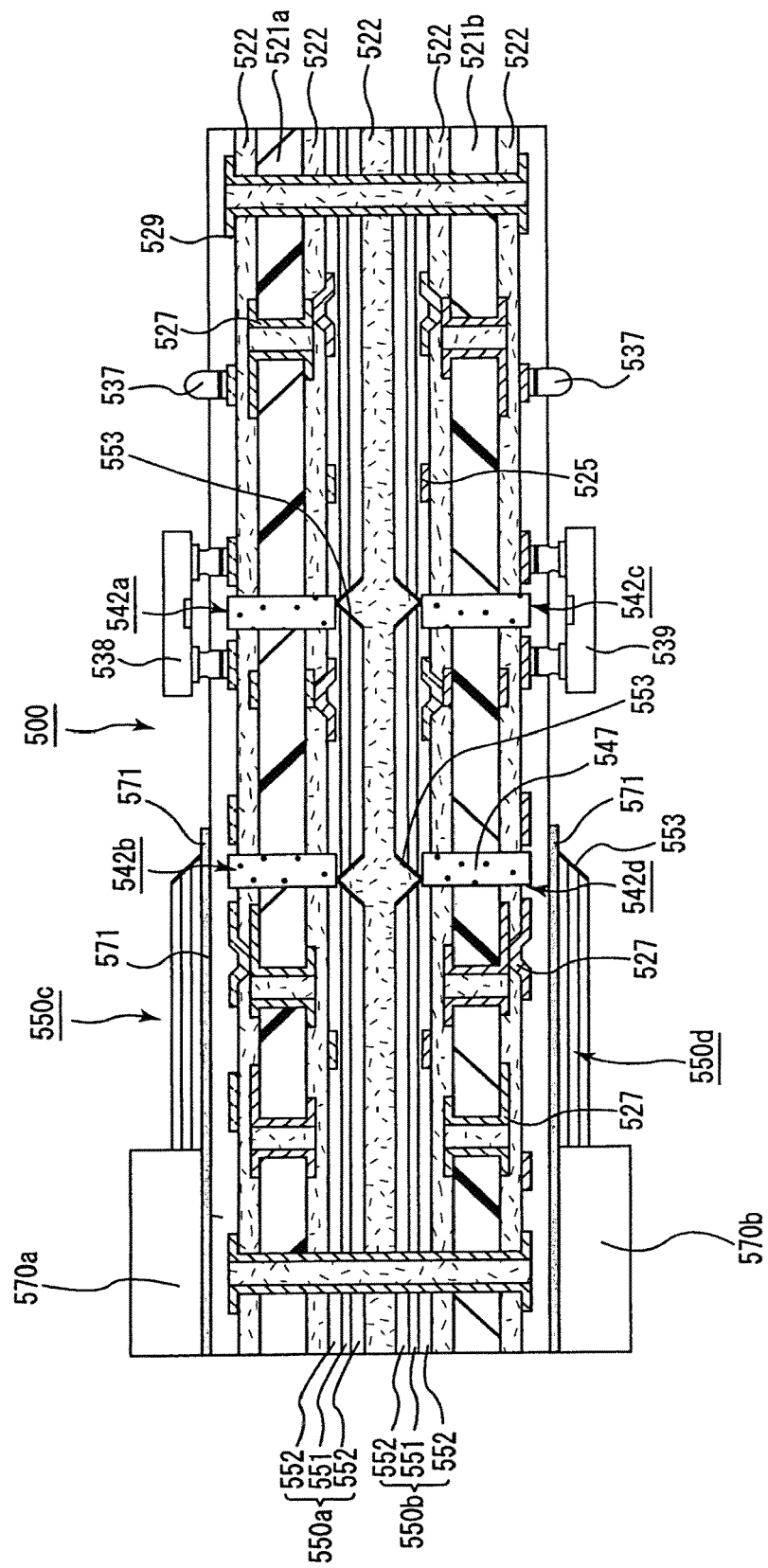
FIG. 5 is a cross section view schematically showing a multilayer printed circuit board according to another embodiment of the present invention.

FIG. 5 is a cross section view schematically showing a multilayer printed circuit board according to another embodiment of the present invention.

As shown in FIG. 5, in a multilayer printed circuit board 500, a substrate (insulating layer) 521a where conductor circuits 525 and insulating layers 522 are alternately formed and layered on the two sides, and furthermore, an optical waveguide 550a is formed and layered in a portion on one side, and a substrate (insulating layer) 521b where conductor circuits 525 and insulating layers 522 are alternately formed and layered on the two sides, and furthermore, an optical wave guide 550b is formed and layered in a portion on one side are disposed so that optical waveguides 550a and 550b face each other and layered by interposing an insulating layer 522 comprising an adhesive insulating material.

Here, optical waveguides 550a and 550b are respectively formed of a core 551 and a clad 552.

In addition, in the multilayer printed circuit board 500, conductor circuits sandwiching each of substrates 521a and 521b, conductor circuits sandwiching an insulating layer 522 which is formed and layered on a substrate, and conductor circuits sandwiching both a substrate and an insulating layer are connected through non-penetrating via holes 527, while conductor circuits sandwiching all of the substrates and insulating layers 522, that is to say, conductor circuits formed outside the respective substrates 520a and 521b (on the side opposite to the side where optical waveguides are formed) are connected through penetrating via holes 529.

In addition, optical signal transmitting regions 542a to 542d are formed in each of the substrates 521a and 521b, and one end of each of the optical signal transmitting regions 542a to 542d is optically connected to either an optical waveguide 550a or 550b. Accordingly, optical path conversion mirrors 553 are formed in optical waveguides 550a and 550b in locations corresponding to each of the optical signal transmitting regions 542a to 542d. In addition, a metal vapor deposition layer is formed on optical path conversion mirrors 553.

Furthermore, solder resist layers 534 which are transparent to transmission light are formed in the outermost layers of the multilayer printed circuit board 500, and an optical waveguide 550c which is optically connected to the side opposite to the side where an optical signal transmitting region 542b is optically connected to an optical waveguide 550a is formed on the solder resist layer 534 on the substrate 521a side, and an optical waveguide 550c is further connected to an optical connector 570a.

In addition, the optical waveguide 550c and the optical connector 570a are fixed to a solder resist layer 534a by interposing an adhesive layer 571 which is transparent to transmission light.

In addition, an optical waveguide 550d which is optically connected to the side opposite to the side where an optical signal transmitting region 542d is optically connected to an optical waveguide 550b is formed on the solder resist layer on the substrate 521b side, and an optical waveguide 550d is further connected to an optical connector 570b. In addition, the optical waveguide 550d and the optical waveguide 570b are secured by interposing an adhesive layer 571.

Here, the optical waveguides 550c and 550d are also formed of a core 551 and a clad 552.

Each of a light receiving element 538 and a light emitting element 539 are mounted on solder resist layers 534. In addition, solder bumps 537 are formed at solder resist layers 534, so that various electronic parts can be mounted by interposing these solder bumps.

In the multilayer printed circuit board 500 having this configuration, optical signals from the light emitting element 539 are transmitted to an optical connector 570b via an optical signal transmitting region 542c, an optical waveguide 550b, an optical signal transmitting region 542d and an optical waveguide 550d, and furthermore, connected to an external substrate and the like (not shown) via this optical connector 570. In addition, optical signals from an optical connector 570a which is connected to the external substrate and the like (not shown) is transmitted to a light receiving element 538 via an optical waveguide 550c, an optical signal transmitting region 542b, an optical waveguide 550a and an optical signal transmitting region 542a.

Accordingly, in the multilayer printed circuit board 500, signal transmission between substrates can be achieved through optical signals.

Here, an optical circuit such as an optical waveguide, an optical fiber sheet and an optical waveguide may be connected to an optical connector in connecting to an external substrate and the like.

Here, an optical fiber array to which an optical fiber ribbon is connected may be attached to an optical element according to the present invention instead of an optical connector.

Figure 6:
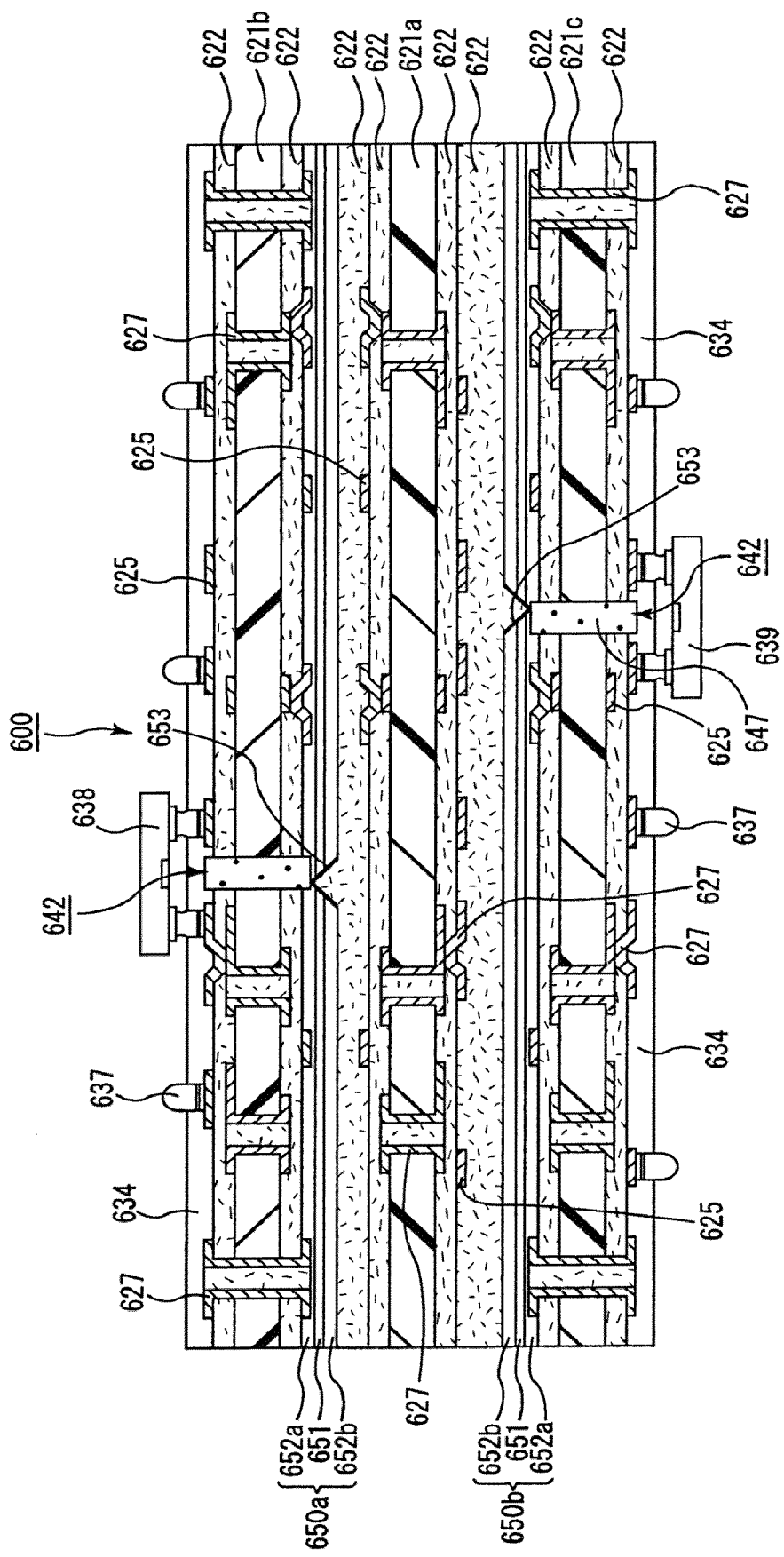
FIG. 6 is a cross section view schematically showing a multilayer printed circuit board according to another embodiment of the present invention.

FIG. 6 is a cross section view schematically showing a multilayer printed circuit board according to another embodiment of the present invention.

Though a multilayer printed circuit board 600 shown in FIG. 6 has approximately the same function as the multilayer printed circuit board 300 shown in FIG. 3, the structure is slightly different.

That is to say, in the multilayer printed circuit board 600, conductor circuits and insulating layers are formed and layered by interposing insulating layers 622 comprising an adhesive insulating material on both sides of a substrate (insulating layer) 621*a*, where conductor circuits 625 and insulating layers 622 are layered on the two surfaces, and furthermore, substrates (insulating layers) 621*b* and 621*c* on which optical waveguides are formed are layered.

Here, the configuration of the substrates 621*b* and 621*c* is the same as that of the substrates 321*a* and 321*b* which form the multilayer printed circuit board 300 shown in FIG. 3.

In addition, though not shown, penetrating via holes are formed.

In the multilayer printed circuit board 600 having this configuration, optical signals emitted from a light emitting element 639 are transmitted to an external substrate and the like (not shown) via an optical signal transmitting region 642 and an optical waveguide 650*b*, and optical signals from the external substrate and the like are transmitted to a light receiving element 638 via an optical waveguide 650*a* and an optical signal transmitting region 642.

Figure 7:
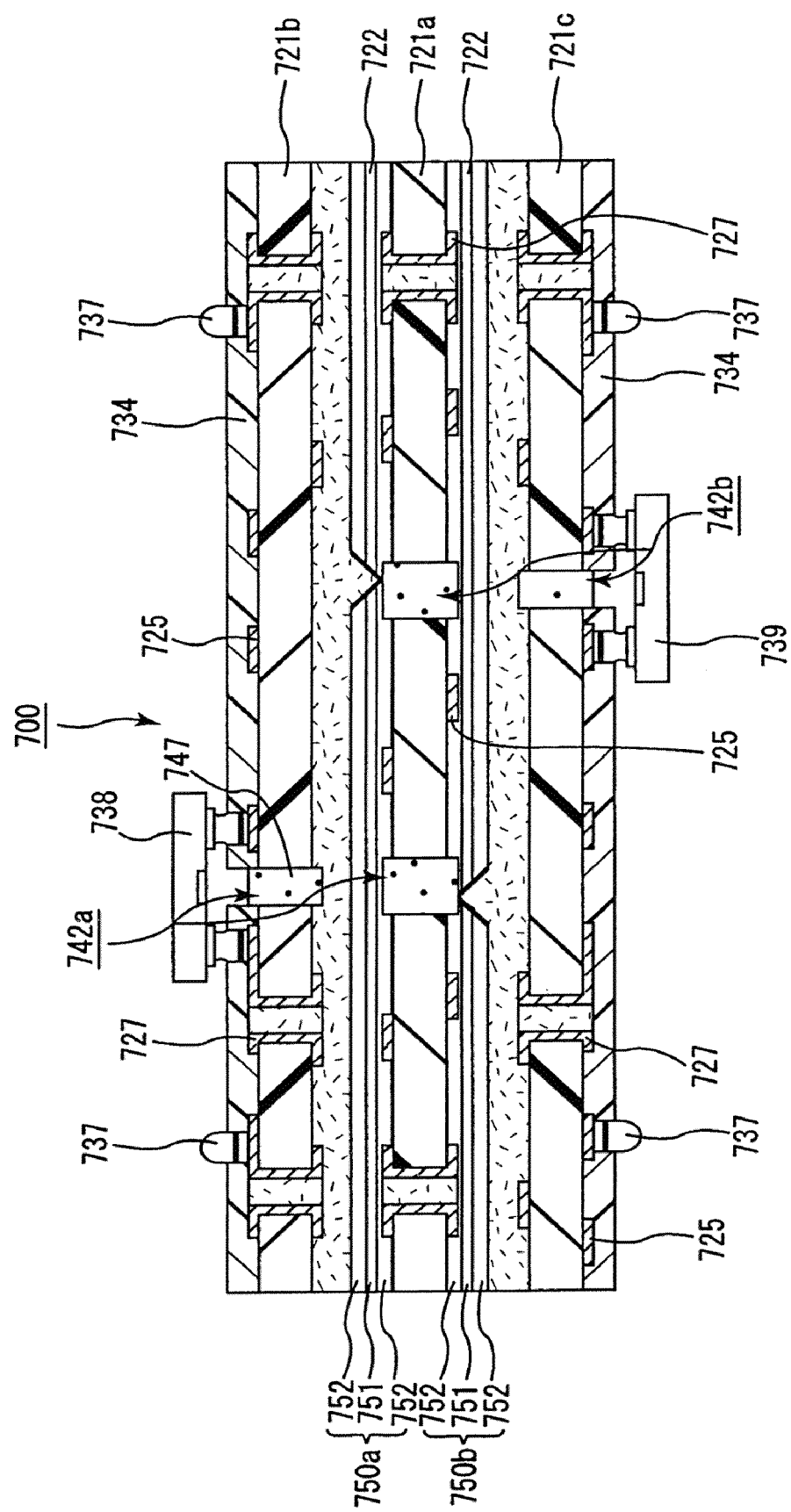
FIG. 7 is a cross section view schematically showing a multilayer printed circuit board according to another embodiment of the present invention.

FIG. 7 is a cross section view schematically showing a multilayer printed circuit board according to another embodiment of the present invention.

As shown in FIG. 7, in a multilayer printed circuit board 700, a substrate (insulating layer) 721*a* where conductor circuits 725 and insulating layers 722 are formed and layered on the two surfaces, and furthermore, optical waveguides 750*a* and 750*b* are formed and layered on the two surfaces, and substrates (insulating layers) 721*b* and 721*c* where conductor circuits 725 are formed on the two surfaces are layered in such a manner that the substrates 721*b* and 721*c* sandwich a substrate 721*a*, which is at the center, by interposing insulating layers 722 comprising an adhesive insulating material.

In addition, in the multilayer printed circuit board 700, conductor circuits sandwiching each of substrates 721*a* to 721*c* are connected through non-penetrating via holes 727.

In addition, though not shown, conductor circuits sandwiching all of the substrates and insulating layers 722, that is to say, conductor circuits formed on the outside of the respective substrates 721*a* and 721*b* (on the side opposite to the side where optical waveguides are formed) are connected through penetrating via holes.

In addition, an optical signal transmitting region 742*a* is formed in the substrates 721*a* and 721*b*, and an optical signal transmitting region 742*b* is formed in the substrates 721*a* and 721*c*. Here, these optical signal transmitting regions 742*a* and 742*b* cross the optical waveguides and the insulating layers comprising an adhesive insulating material.

Furthermore, one end of each of the optical signal transmitting region 742*a* or 742*b* is optically connected to either an optical waveguide 750*a* or 750*b*. Accordingly, optical path conversion mirrors 753 are formed in each of the optical waveguides 750*a* and 750*b* in locations corresponding to each of the optical signal transmitting region 742*a* or 742*b*. In addition, a metal vapor deposition layer is formed on optical path conversion mirrors 753.

In addition, solder resist layers 734 are formed on the outside of the respective substrates 721*a* and 721*b*, and furthermore, each of a light receiving element 738 and a light emitting element 739 are mounted. In addition, solder bumps 737 are formed at solder resist layers 734, and various electronic parts can be mounted by interposing these solder bumps.

Here, openings are provided in portions which form optical signal transmitting regions in solder resist layers 734, so that optical signals can be transmitted.

In the multilayer printed circuit board 700 having this configuration, optical signals from a light emitting element 739 are transmitted to an external substrate and the like (not shown) via an optical signal transmitting region 742*b* and an optical waveguide 750*a*, and optical signals transmitted from the external substrate and the like (not shown) are transmitted to a light receiving element 738 via an optical waveguide 750*b* and an optical signal transmitting region 742*a*.

In this multilayer printed circuit board 700, signal transmission between and substrates can be achieved through optical signals.

Figure 8:
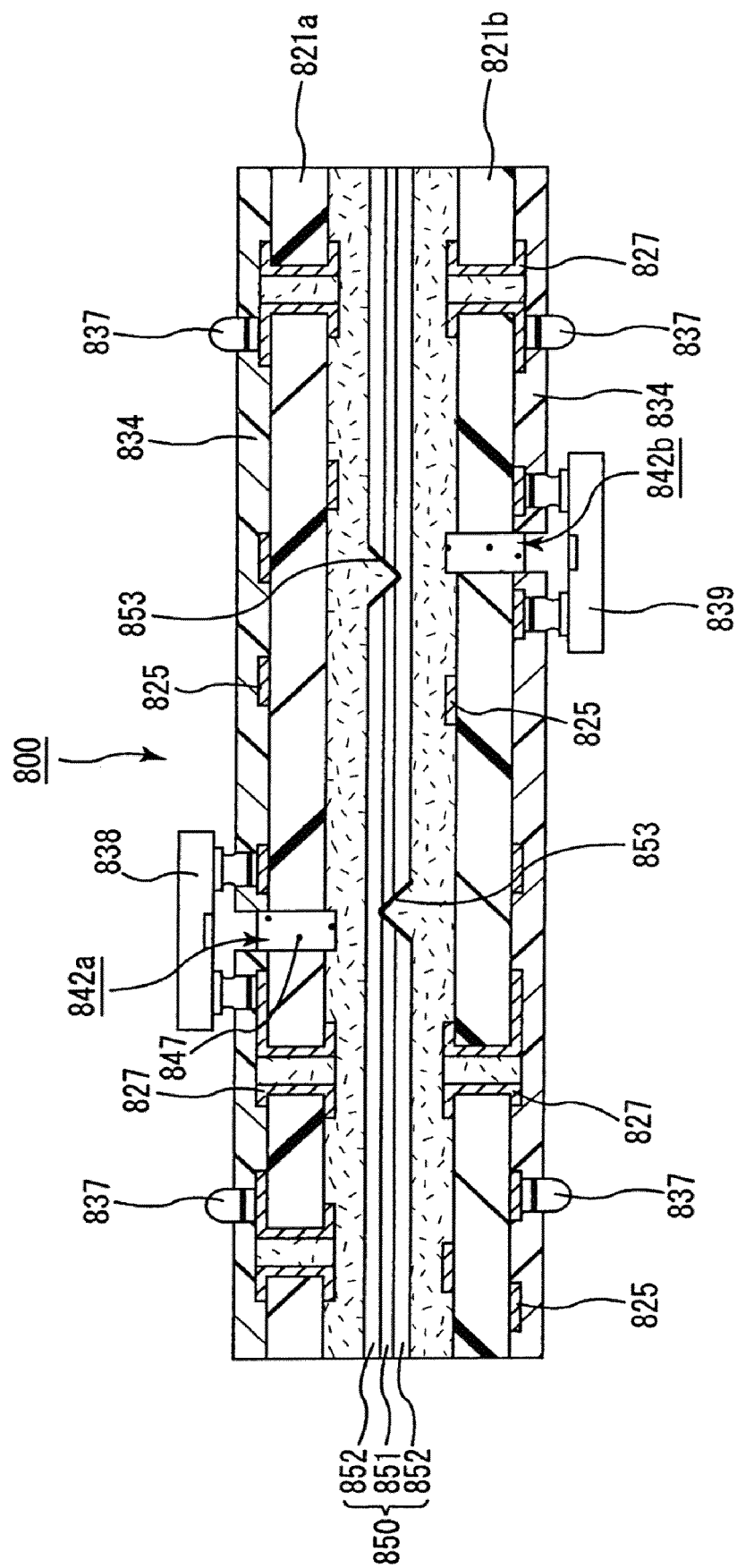
FIG. 8 is a cross section view schematically showing a multilayer printed circuit board according to another embodiment of the present invention.

FIG. 8 is a cross section view schematically showing a multilayer printed circuit board according to another embodiment of the present invention.

As shown in FIG. 8, in a multilayer printed circuit board 800, substrates (insulating layers) 821*a* and 821*b* where conductor circuits 825 are formed on the two surfaces and an optical waveguide 850 comprising a core 851 and a clad 852 are formed and layered, in such a manner that the substrates 821*a* and 821*b* sandwich an optical waveguide 850 by interposing insulating layers 822 comprising an adhesive insulating material.

In addition, in the multilayer printed circuit board 800, conductor circuits sandwiching each of substrates 821*a* and 821*b* are connected through non-penetrating via holes 827.

In addition, optical signal transmitting regions 842*a* and 842*b* are formed in the substrates 821*a* and 821*b* in such a manner that one end of each of the optical signal transmitting regions 842*a* and 842*b* is optically connected to an optical waveguide 850 by interposing insulating layers 822. Accordingly, the insulating layers 822 are formed of an adhesive insulating material which is transparent to transmission light. In addition, optical path conversion mirrors 853 is formed on the optical waveguide 850 in locations corresponding to the optical signal transmitting regions 842*a* and 842*b*, respectively. In addition, a metal vapor deposition layer is formed on the optical path conversion mirrors.

In addition, solder resist layers 834 are respectively formed on the outer layers of substrates 821*a* and 821*b*, and furthermore, each of a light receiving element 838 and a light emitting element 839 are mounted on the outside. In addition, solder bumps 837 are formed at solder resist layers 834, so that various electronic parts can be mounted, by interposing these solder bumps.

Furthermore, though not shown, conductor circuits sandwiching substrates 821*a* and 821*b*, optical waveguide 850 and insulating layers 822, that is to say, the conductor circuits formed on the outer layer side of the substrates 821*a* and 821*b*, are connected through penetrating via holes (not shown).

In the multilayer printed circuit board 800 having this configuration, optical signals from a light emitting element 839 is transmitted to the external substrate and the like (not shown) via optical signal transmitting regions 842*b* and optical waveguides 850, and in addition, optical signals transmitted from the external substrate and the like (not shown) are transmitted to a light receiving element 838 via the optical waveguides 850 and an optical signal transmitting region 842*a*.

In addition, as shown in FIGS. 7 and 8, in the case where openings for an optical path are formed in the solder resist layers, the solder resist layers may not necessarily be transparent to communication light.

Figure 9:
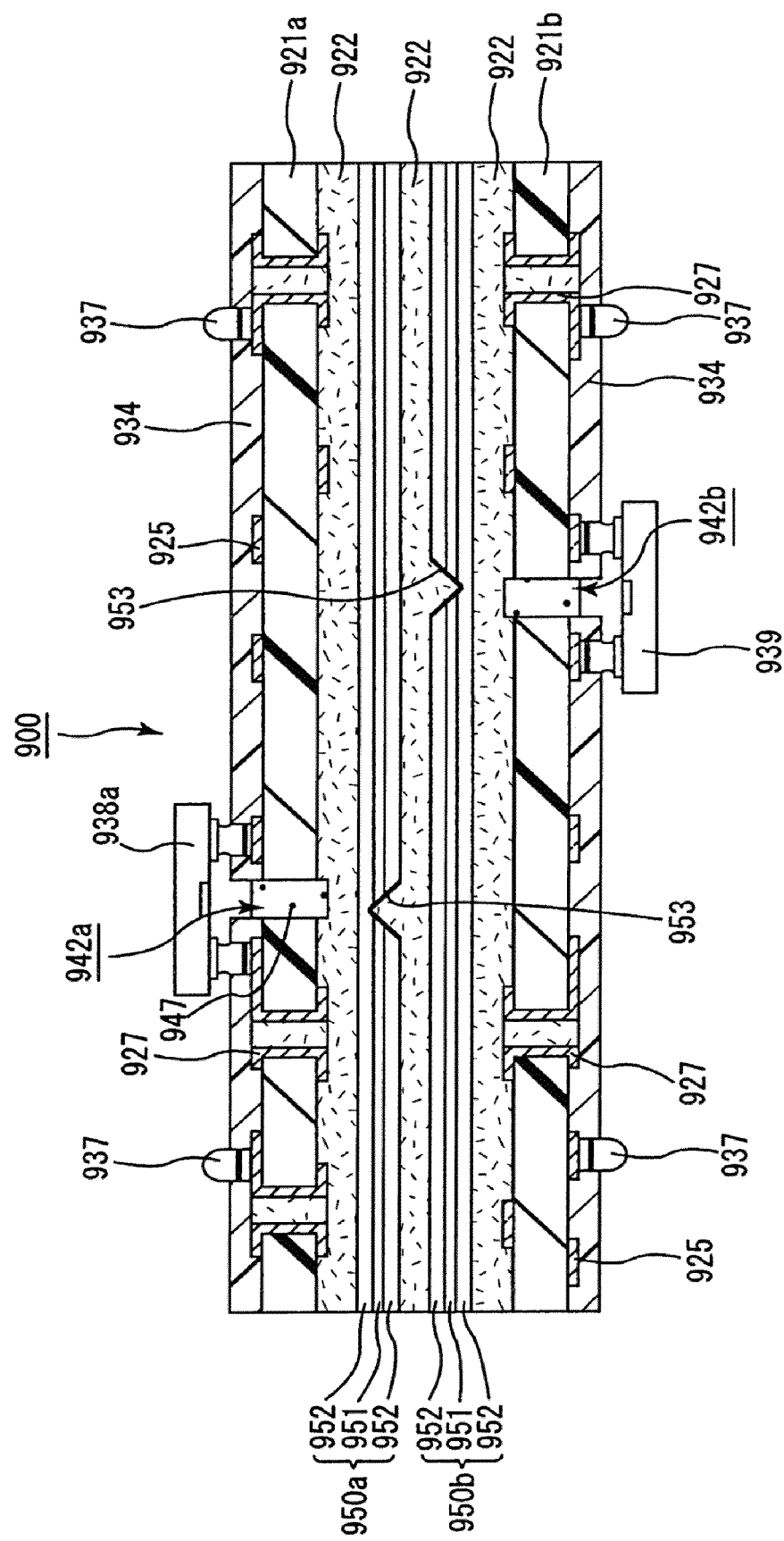
FIG. 9 is a cross section view schematically showing a multilayer printed circuit board according to another embodiment of the present invention.

FIG. 9 is a cross section view schematically showing a multilayer printed circuit board according to another embodiment of the present invention.

As shown in FIG. 9, a multilayer printed circuit board 900 has substrates (insulating layers) 921*a* and 921*b* where conductor circuits 925 are formed on the two surfaces and optical waveguide films 950*a* and 950*b* comprising a core 951 and a clad 952, where optical fiber sheets 950a and 950b are layered so as to sandwich an insulating layer 922 comprising an adhesive insulating material, and furthermore, substrates 921a and 921b are formed and layered on both sides of this by interposing insulating layers 922 comprising an adhesive insulating material.

In addition, in the multilayer printed circuit board 900, conductor circuits sandwiching each of substrates 921a and 921b are connected through non-penetrating via holes 927.

In addition, optical signal transmitting regions 942a and 942b are formed in each of the substrates 921a and 921b, and an end of each of the optical signal transmitting regions 942a and 942b is optically connected to optical waveguide film 950a or 950b by interposing an insulating layer 922.

In addition, optical path conversion mirrors 953 are formed in optical waveguide films 950a and 950b in locations corresponding to each of the optical signal transmitting regions 942a and 942b. In addition, a metal vapor deposition layer is formed on the optical path conversion mirrors.

In addition, solder resist layers 934 are formed on the outside of each of the substrates 921a and 921b, and furthermore, each of a light receiving element 938 and a light emitting element 939 are mounted. In addition, solder bumps 937 are formed at solder resist layers 934, and various electronic parts can be mounted by interposing these solder bumps.

Furthermore, though not shown, conductor circuits sandwiching substrates 921a and 921b and optical waveguide films 950a and 950b and insulating layers 922, that is to say, conductor circuits formed on the outside of each of the substrates 921a and 921b are connected through penetrating via holes (not shown).

In the multilayer printed circuit board 900 having this configuration, optical signals from the light emitting element 939 are transmitted to an external substrate and the like (not shown) via an optical signal transmitting region 942b and an optical waveguide film 950b, and in addition, optical signals transmitted from the external substrate and the like (not shown) are transmitted to the light receiving element 938 via an optical waveguide film 950a and an optical signal transmitting region 942a.

Figure 10:
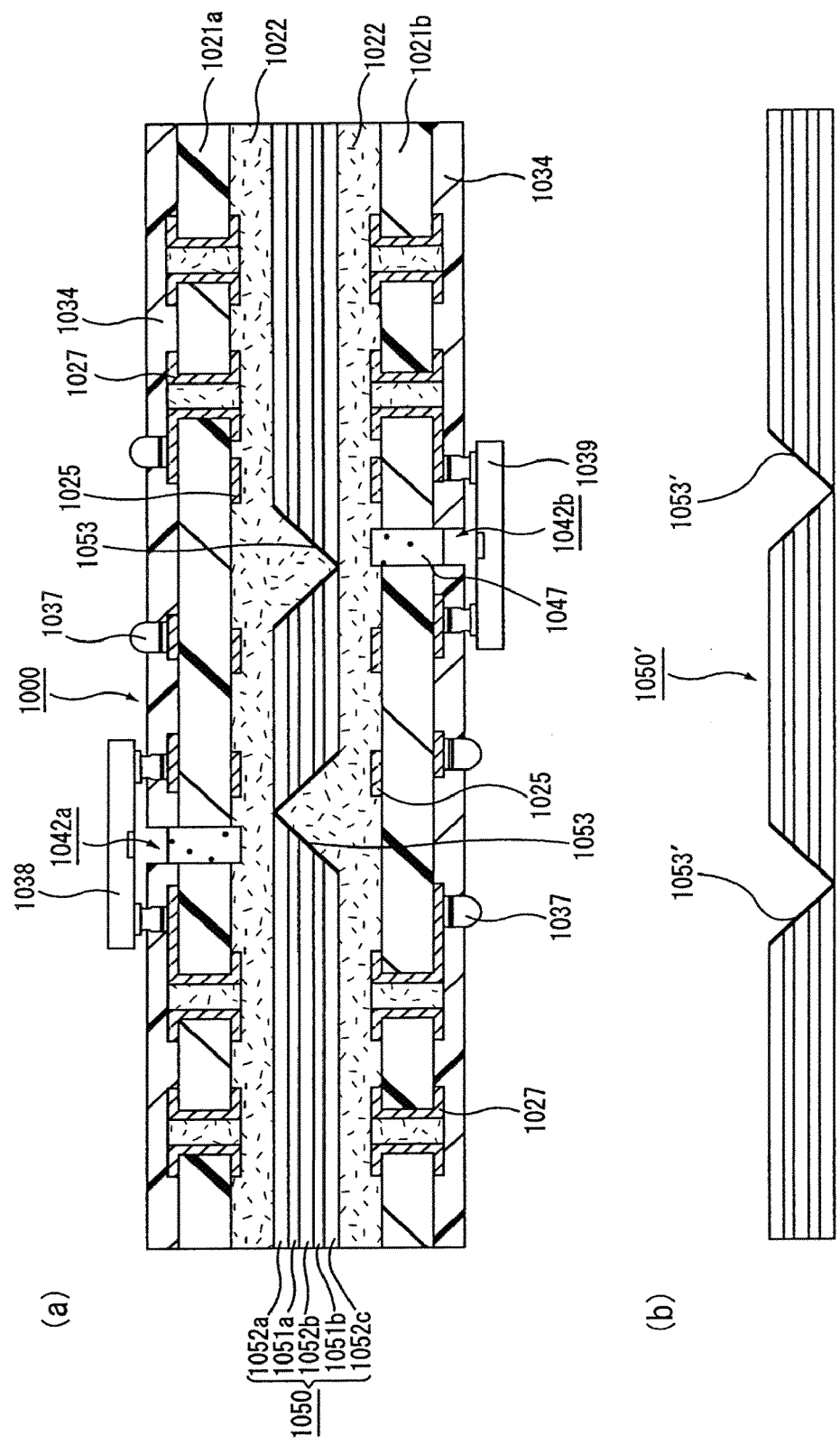
FIG. 10 is a cross section view schematically showing a multilayer printed circuit board according to another embodiment of the present invention.

FIG. 10 is a cross section view schematically showing a multilayer printed circuit board according to another embodiment of the present invention.

A multilayer printed circuit board 1000 shown in FIG. 10(a) has the same configuration as the multilayer printed circuit board 800 shown in FIG. 8, except that the configuration of the optical waveguides is different.

That is to say, in the multilayer printed circuit board 800, optical waveguide 850 comprising a core and a clad formed so as to surround the core is used as an optical waveguide, while in the multilayer printed circuit board 1000, an optical waveguide 1050 where cores 1051a and 1051b and clads 1052a, 1052b and 1052c are alternately layered is used as an optical waveguide.

In the multilayer printed circuit board 1000 using this optical waveguide 1050, optical signals can be transmitted between substrates in the same manner as in the multilayer printed circuit board 800 shown in FIG. 8.

In addition, though optical path conversion mirrors 1053 of which the vertices are directed in different directions, upward and downward, are formed in the optical waveguide 1050, the direction of optical path conversion mirrors 1053 is not limited to this, and as shown in FIG. 10(b), the optical waveguide 1050' where the optical path conversion mirrors 1053' of which the vertices are directed in the same direction are formed can also be used in the multilayer printed circuit board according to the present invention, and in this case, optical elements can be mounted on the same surface of the multilayer printed circuit board.

Figure 11:
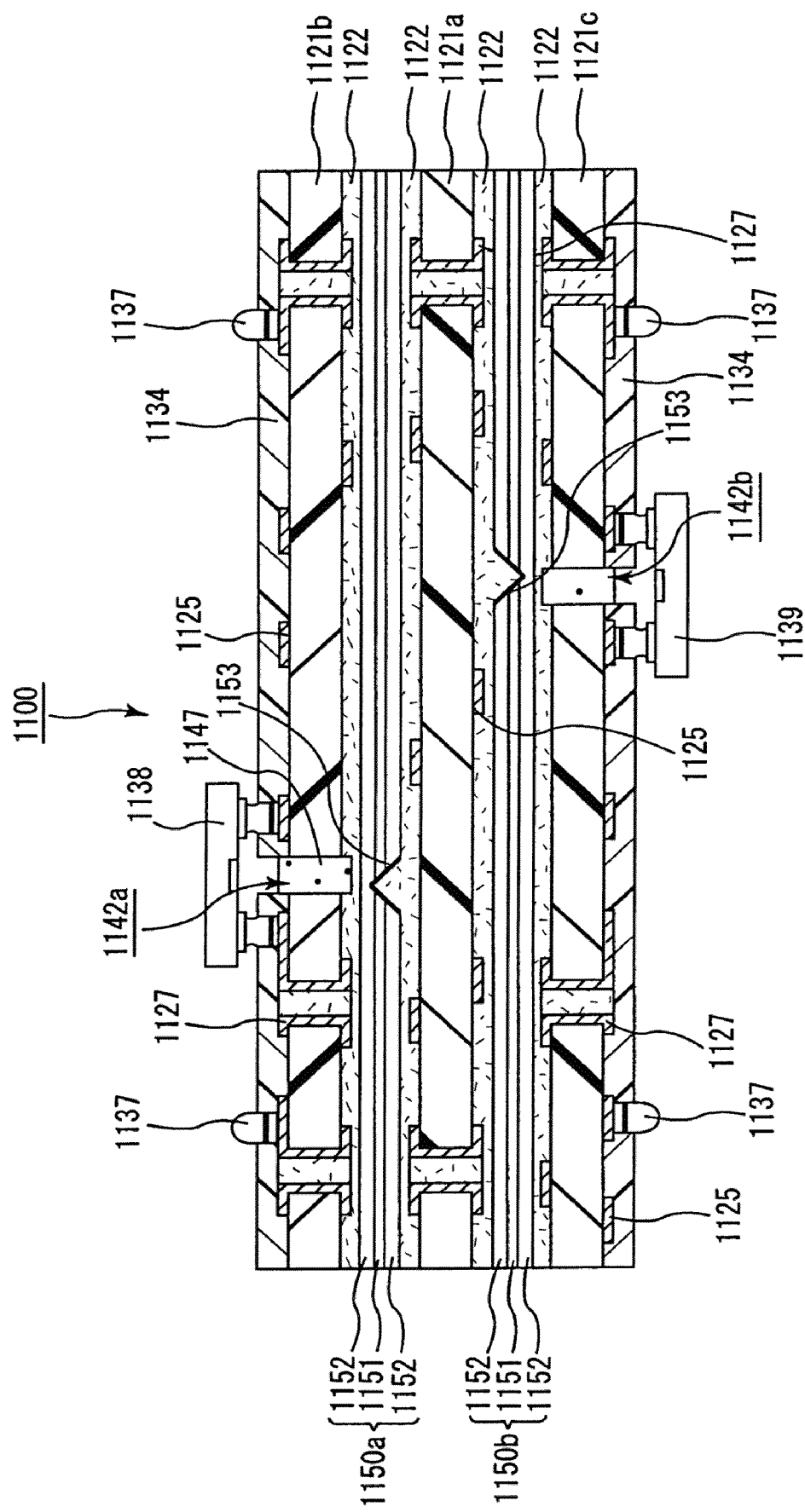
FIG. 11 is a cross section view schematically showing a multilayer printed circuit board according to another embodiment of the present invention.

FIG. 11 is a cross section view schematically showing a multilayer printed circuit board according to another embodiment of the present invention.

As shown in FIG. 11, in a multilayer printed circuit board 1100, substrates (insulating layers) 1121a to 1121c where conductor circuits 1125 are formed on the two surfaces and optical waveguides 1150a and 1150b comprising a core 1151 and a clad 1152 are layered by interposing insulating layers 1122 comprising an adhesive insulating material, in such a manner that the substrates and the optical waveguides are alternately layered.

In addition, in the multilayer printed circuit board 1100, conductor circuits sandwiching each of the substrates 1121a to 1121c are connected through non-penetrating via holes 1127.

In addition, optical signal transmitting regions 1142a and 1142b are respectively formed in substrates 1121b and 1121c, and one end of each of the optical signal transmitting regions 1142a and 1142b is optically connected to an optical element 1150a or 1150b by interposing an insulating layer 1122.

In addition, optical path conversion mirrors 1153 are formed in optical elements 1150a and 1150b in locations corresponding to each of the optical signal transmitting regions 1142a and 1142b. In addition, a metal vapor deposition layer is formed on the optical path conversion mirrors.

In addition, solder resist layers 1134 are formed on the outside of each of the substrates 1121b and 1121c, and furthermore, each of a light receiving element 1138 and a light emitting element 1139 are mounted. In addition, solder bumps 1137 are formed at solder resist layers 1134, and various electronic parts can be mounted by interposing these solder bumps.

Furthermore, though not shown, conductor circuits formed outside substrates 1121b and 1121c are connected through penetrating via holes.

In the multilayer printed circuit board 1100 having this configuration, optical signals from the light emitting element 1139 are transmitted to an external substrate and the like (not shown) via an optical signal transmitting region 1142b and an optical waveguide 1150b, and optical signals transmitted from an external substrate and the like (not shown) are transmitted to the light receiving element 1138 via the optical waveguide and an optical signal transmitting region 1142a.

Figures 1, 12:
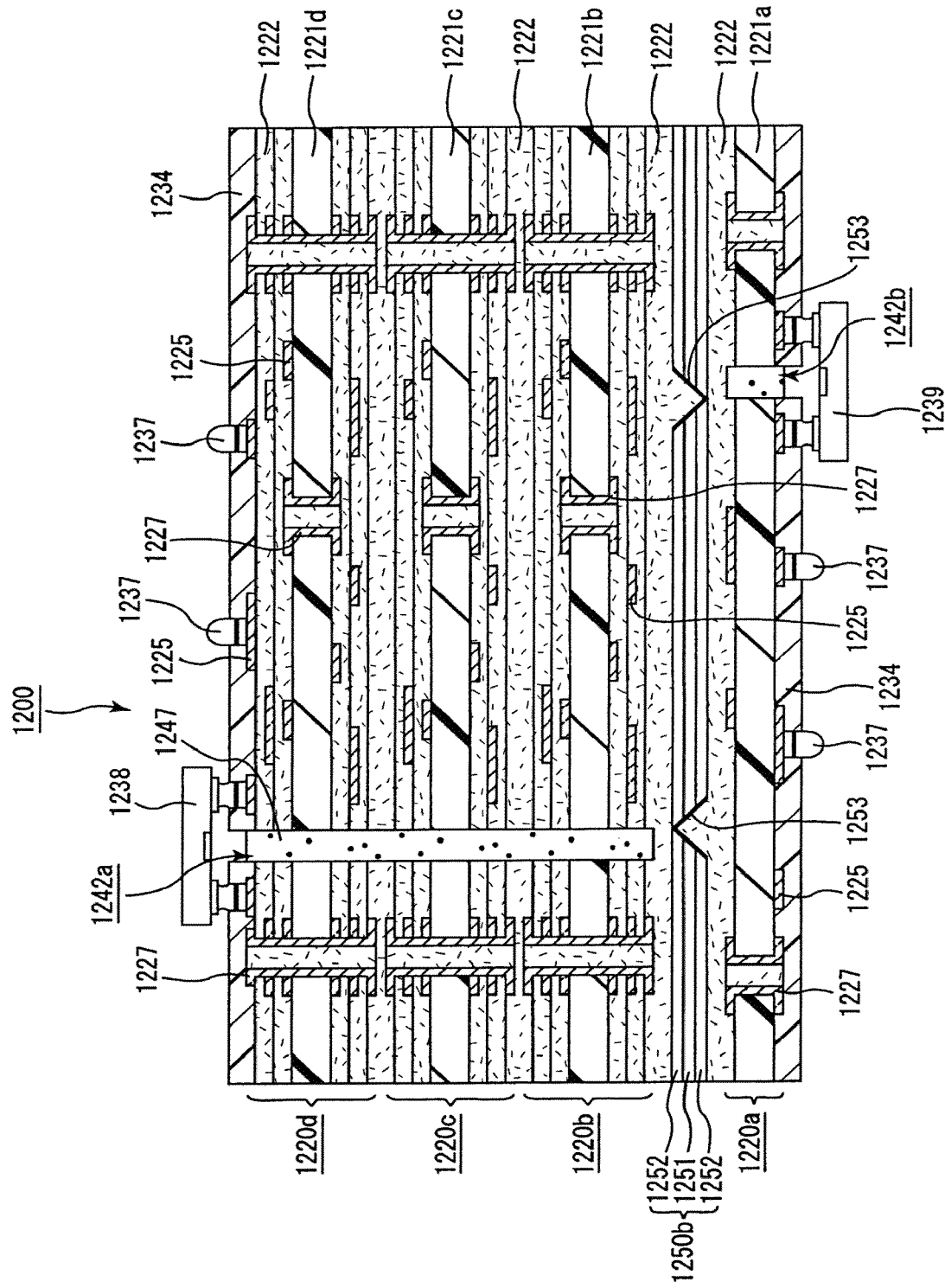
Figures 2, 12:
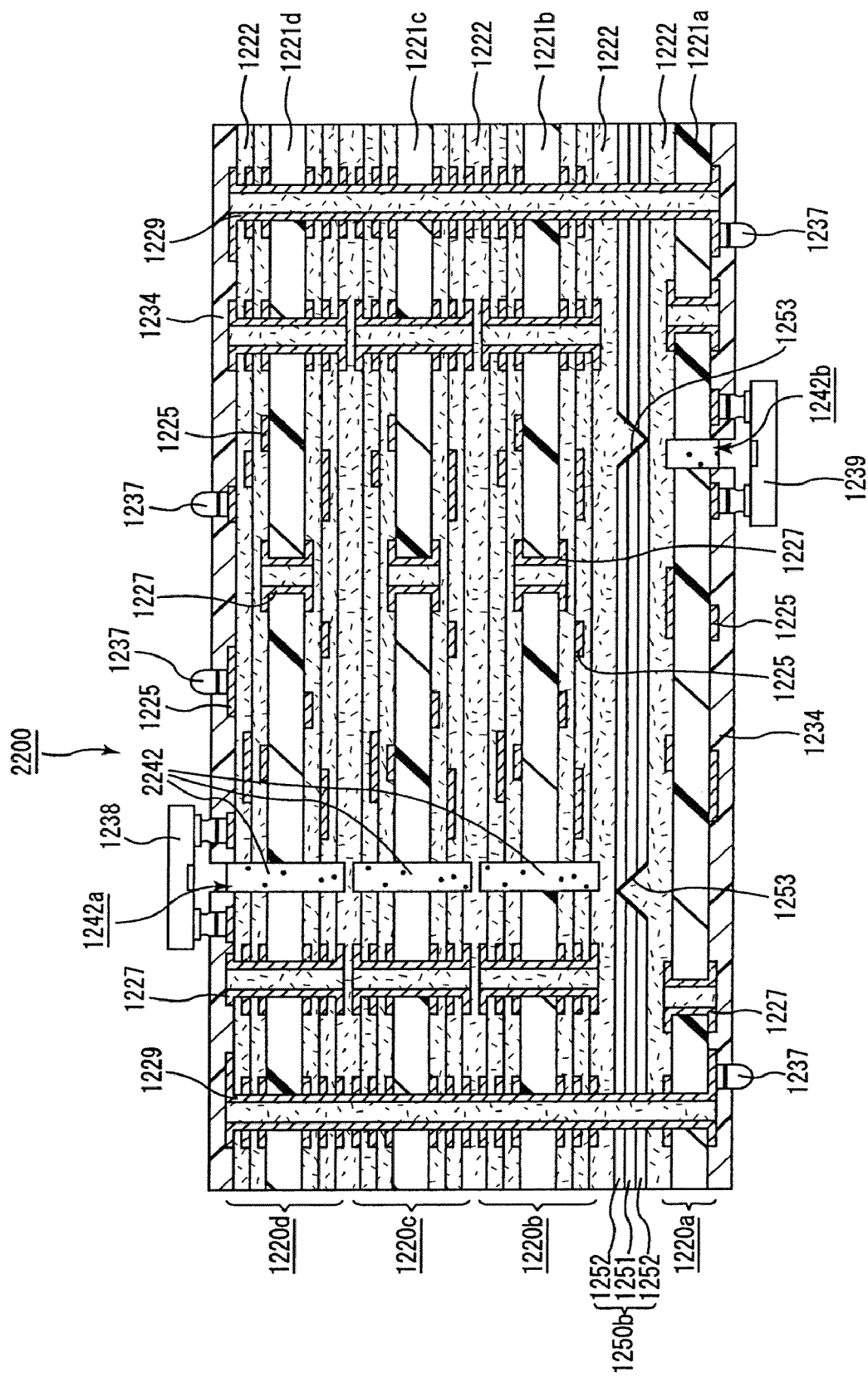

FIGS. 12-1 and 12-2 are the respective cross section views schematically showing a multilayer printed circuit board according to another embodiment of the present invention.

As shown in FIG. 12-1, in a multilayer printed circuit board 1200, a two-layer board 1220a comprising a substrate 1221a (insulating layer) where conductor circuits 1225 are formed on the two surfaces, and six-layer boards 1220b to 1221d comprising substrates 1221b to 1221d where conductor circuits 1225 and insulating layers 1222 are formed and layered on the two surfaces are formed and layered on the two surfaces of an optical waveguide 1250 comprising a core 1251 and a clad 1252 by interposing insulating layers 1222 comprising an adhesive insulating material.

Here, two-layer board 1220a is layered on one side of optical waveguide 1225 (lower part in the figure) by interposing an insulating layer 1222, and six-layer boards 1220b to 1220d are layered on the other by interposing insulating layers 1222. Accordingly, an eighteen-layer board is formed on the other side of optical waveguide 1225 (upper part in the figure).

In addition, in a multilayer printed circuit board 1200, conductor circuits sandwiching each of substrates 1221a to 1221d are connected through non-penetrating via holes 1227.

In addition, optical signal transmitting regions 1242a and 1242b are formed in two-layer board 1121a and the eighteen-layer board, where six-layer boards 1220b to 1220d are layered, and one end of each of optical signal transmitting regions 1242a and 1242b is optically connected to the optical waveguide 1250 by interposing an insulating layer 1222. Accordingly, insulating layers 1222 are formed of an adhesive insulating material which is transparent to transmission light. In addition, optical path conversion mirrors 1253 are formed in the optical waveguide 1250 in locations corresponding to each of the optical signal transmitting regions 1242a and 1242b. In addition, a metal vapor deposition layer is formed on the optical path conversion mirrors.

In addition, solder resist layers 1234 are formed on the outside of each of the two-layer board 1121a and the six-layer board 1220d, and furthermore, each of a light receiving element 1238 and a light emitting element 1239 are mounted. In addition, solder bumps 1237 are formed at solder resist layers 1234, and various electronic parts and the like can be mounted by interposing these solder bumps.

Furthermore, though not shown, conductor circuits sandwiching the two-layer board 1121a, the six-layer boards 1220a to 1220d, the optical waveguide 1250 and insulating layers 1220 which intervene between these, that is to say, conductor circuits formed outside each of the two-layer board 1121a and the six-layer board 1220d are connected through penetrating via holes (not shown).

In the multilayer printed circuit board 1200 having this configuration, optical signals from the light emitting element 1239 are transmitted to an external substrate and the like (not shown) via an optical signal transmitting region 1242b and the optical waveguide 1250, and in addition, optical signals transmitted from the external substrate and the like (not shown) are transmitted to the light receiving element 1238 via the optical waveguide 1250 and the optical signal transmitting region 1242a.

In this manner, in the multilayer printed circuit board according to the present invention, a plurality of multilayer boards may be layered on top of each other, and it is not necessary for the number of layered insulating layers to be the same on both sides sandwiching the optical circuits.

This embodiment is appropriate for transmission of optical signals through a multilayer board having many layers. This is because multilayer boards having many layers have a great number of electrical circuits (conductor circuits), and thus, circuits with high density is required, and the conductor circuits are mostly coupled in the portion of the eighteen-layer board (three pieces of six-layer boards are layered), and pads and conductor circuits for mounting optical elements and electronic parts are provided in the portion of the two-layer board, and thus, bad influences that there is less freedom in design due to the formation of the optical waveguide in an inner layer (between insulating layers) can be minimized. Of course, the number of layers in the multilayer board having many layers is not limited to twenty (18 layers+2 layers).

A multilayer printed circuit board 2200 shown in FIG. 12-2 has approximately the same configuration as the multilayer printed circuit board 1200 shown in FIG. 12-1, except that the configuration of the optical signal transmitting regions is different. Accordingly, only the configuration of optical signal transmitting region 1242a is described in detail here.

The optical signal transmitting regions formed in the multilayer printed circuit board 1200 collectively penetrate through the eighteen-layer board, while an optical signal transmitting region 1242a is formed in the multilayer printed circuit board 2200 with an optical link to an optical waveguide 2242 formed so as to penetrate only through the respective six-layer boards 1220b to 1220d by interposing an insulating layer 1222.

In addition, insulating layers 1222 interposing six-layer boards are transparent to transmission light.

Here, as shown in the figure, in the multilayer printed circuit board 2200, conductor circuits formed outside each of substrates 1221a and 1221d are connected through penetrating via holes 1229.

In the multilayer printed circuit board 2200 having this configuration, optical signals from a light emitting element 1239 are transmitted to a light receiving element 1238 via an optical signal transmitting region 1242b, an optical waveguide 1250 and an optical signal transmitting region 1242a. Here, optical path conversion mirrors 1253 are formed, so that optical signals can be transmitted between the light emitting element 1239 and the light receiving element 1238.

This embodiment is also appropriate for transmission of optical signals in a multilayer board having many layers.

In addition, the multilayer printed circuit board 1200 shown in FIG. 12-1 and the multilayer printed circuit board 2200 shown in FIG. 12-2 have different configurations in the optical signal transmitting regions, and these multilayer printed circuit boards having these configurations can be respectively manufactured by slightly changing the manufacturing process.

That is to say, the multilayer printed circuit boards are both manufactured by layering circuit boards and an optical waveguide film by interposing prepregs, and here, when the multilayer printed circuit board 1200 is manufactured, three six-layer boards, for example, are layered in accordance with a pin lamination method and the like so as to form an eighteen-layer board, optical signal transmitting regions are formed so as to collectively penetrate through this eighteen-layer board, and after that, the eighteen-layer board, an optical waveguide film and a two-layer board are layered by interposing prepregs in accordance with a pin lamination method and the like, and thus, the multilayer printed circuit board 1200, which is a twenty-layer board, can be manufactured. In addition, when the multilayer printed circuit board 2200 is manufactured, three pieces of six-layer boards, for example, are formed, and after that, optical signal transmitting regions are formed in each of the six-layer boards, and two six-layer boards as those above, one piece of six-layer board on which an optical waveguide is formed in advance, and a two-layer board are layered by interposing prepregs in accordance with a pin lamination method and the like, and thus, the multilayer printed circuit board 2200, which is a twenty-layer board, can be manufactured.

In addition, though the embodiment shown in FIG. 12-1 is for transmitting optical signals between substrates, and the embodiment shown in FIG. 12-2 is for transmitting optical signals within a substrate, an embodiment as that shown in FIG. 12-1 may be provided for transmitting optical signals within a substrate and an embodiment as that shown in FIG. 12-2 may be provided for transmitting optical signals between substrates.

Figure 13:
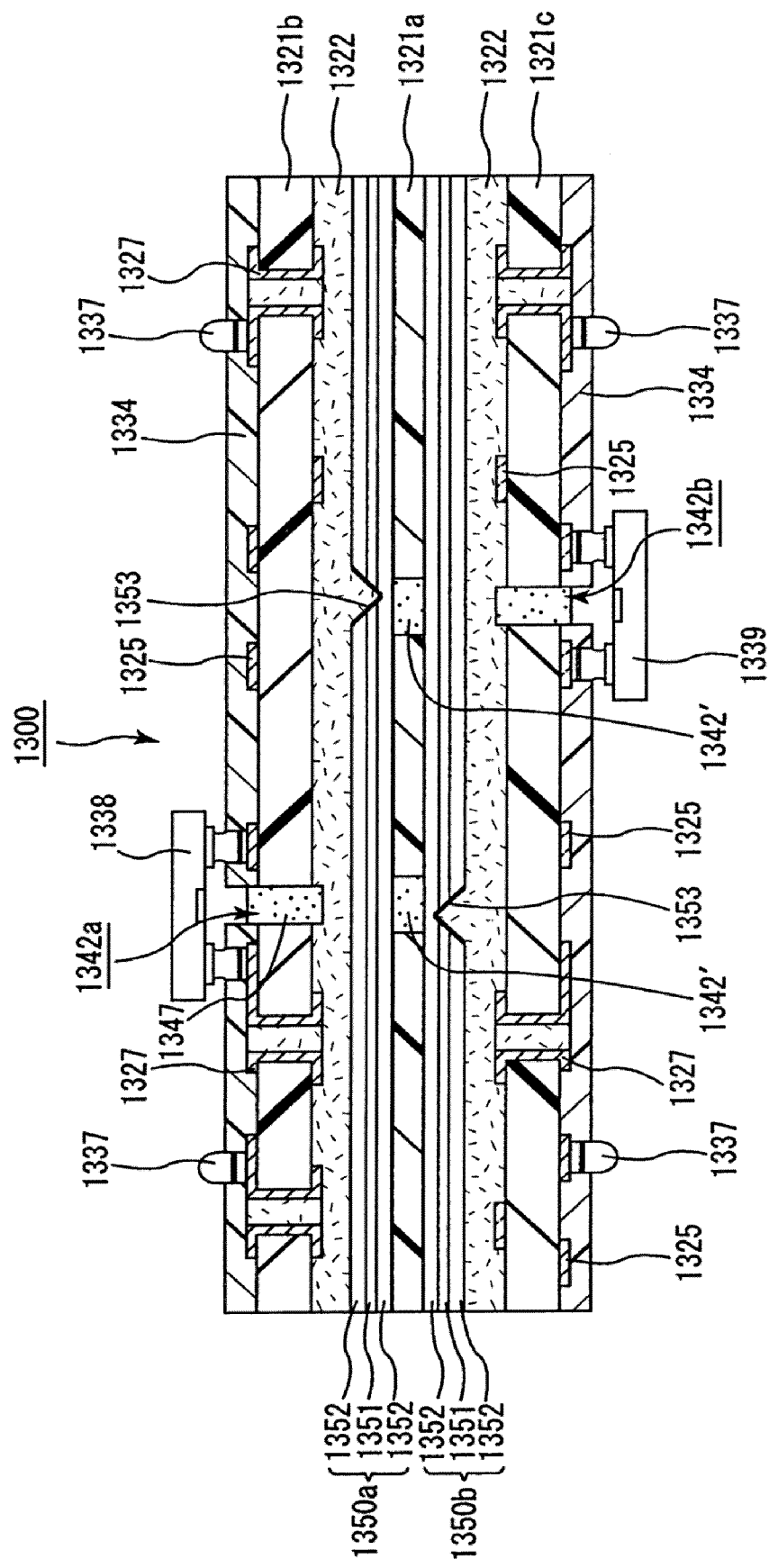
FIG. 13 is a cross section view schematically showing a multilayer printed circuit board according to another embodiment of the present invention.

FIG. 13 is a cross section view schematically showing a multilayer printed circuit board according to another embodiment of the present invention.

As shown in FIG. 13, in a multilayer printed circuit board 1300, a substrate (insulating layer) 1321a where optical waveguides 1350a and 1350b comprising a core 1351 and a clad 1352 are formed on the two surfaces and substrates (insulating layers) 1321*b* and 1321*c* where conductor circuits 1325 are formed on the two surfaces are layered by interposing insulating layers 1322 comprising an adhesive insulating material in such a manner that the substrates 1321*b* and 1321*c* sandwich the substrate 1321*a*, which is at the center.

In addition, in the multilayer printed circuit board 1300, conductor circuits sandwiching each of the substrates 1321*a* to 1321*c* are coupled through non-penetrating via holes 1327.

In addition, openings 1342' filled in with a resin that is transparent to transmission light which function as portions of optical signal transmitting regions 1342*a* and 1342*b* are formed in the substrate 1321*a*, optical signal transmitting regions 1342*a* and 1342*b* are formed in substrates 1321*b* and 1321*c* in such a manner that one end of the optical signal transmitting regions 1342*a* and 1342*b* is optically connected to optical elements 1350*a* and 1350*b*.

In addition, optical path conversion mirrors 1353 are formed in optical elements 1350*a* and 1350*b*, in locations corresponding to each of the optical signal transmitting regions 1342*a* and 1342*b*. In addition, a metal vapor deposition layer is formed on the optical path conversion mirrors.

In addition, solder resist layers 1334 are formed outside the respective substrates 1321*b* and 1321*c*, and furthermore, each of a light receiving element 1338 and a light emitting element 1339 are respectively mounted. In addition, solder bumps 1337 are formed at solder resist layers 1334, and various electronic parts can be mounted by interposing these solder bumps.

Furthermore, though not shown, conductor circuits formed outside substrates 1321*b* and 1321*c* are connected through penetrating via holes.

In the multilayer printed circuit board 1300 having this configuration, optical signals from the light emitting element 1339 are transmitted to an external substrate and the like (not shown) via an optical signal transmitting region 1342*b* and an optical waveguide 1350*b*, and in addition, optical signals transmitted from the external substrate and the like (not shown) are transmitted to the light receiving element 1338 via an optical waveguide and an optical signal transmitting region 1342*a*.

In addition, in the multilayer printed circuit board 1300, though openings filled in with a resin that is transparent to transmission light which function as portions of optical signal transmitting regions are formed in a substrate 1321*a*, it is not necessary to form openings in the case where a substrate of which the material is transparent to transmission light, for example, a glass substrate, a transparent resin substrate, or the like is used as the substrate 1321*a*.

Figure 14:
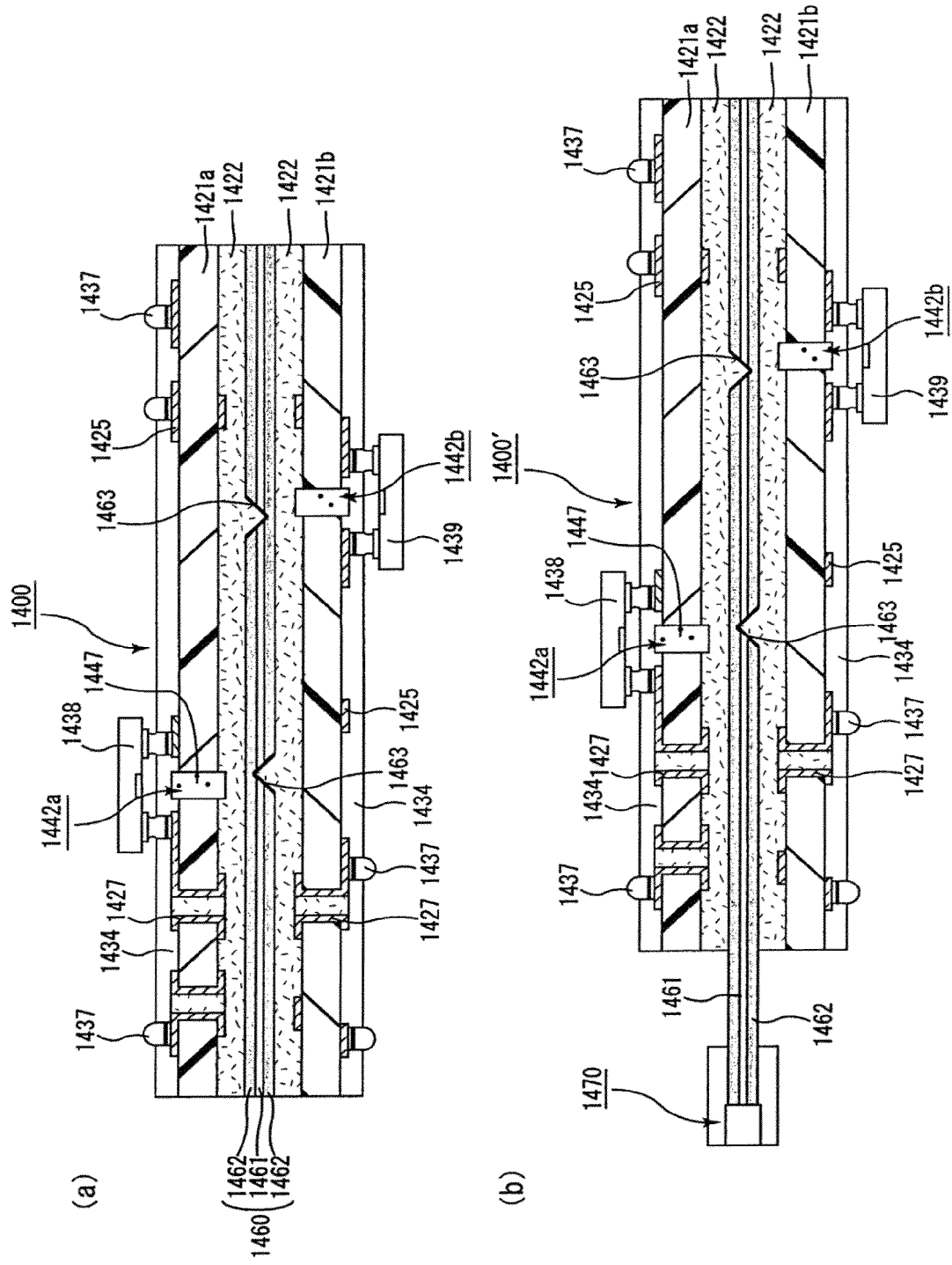
FIG. 14 is a cross section view schematically showing a multilayer printed circuit board according to another embodiment of the present invention.

FIG. 14 is a cross section view schematically showing a multilayer printed circuit board according to another embodiment of the present invention.

A multilayer printed circuit board 1400 shown in FIG. 14 has the same configuration as the multilayer printed circuit board 800 shown in FIG. 8, except that an optical fiber sheet 1460 where the surroundings of an optical fiber 1461 is covered with a cover resin layer 1462 is formed instead of an optical waveguide 850.

Accordingly, the multilayer printed circuit board 1400 also enables transmission of optical signals to and from an external substrate.

Specifically, as shown in FIG. 14(*b*), the portion of the optical fiber sheet 1460 exposed from a side of the multilayer printed circuit board 1400 extends outward so as to be connected to an optical connector 1470, for example, and thus, transmission of optical signals to and from an external substrate and the like (not shown) becomes possible.

Figure 15:
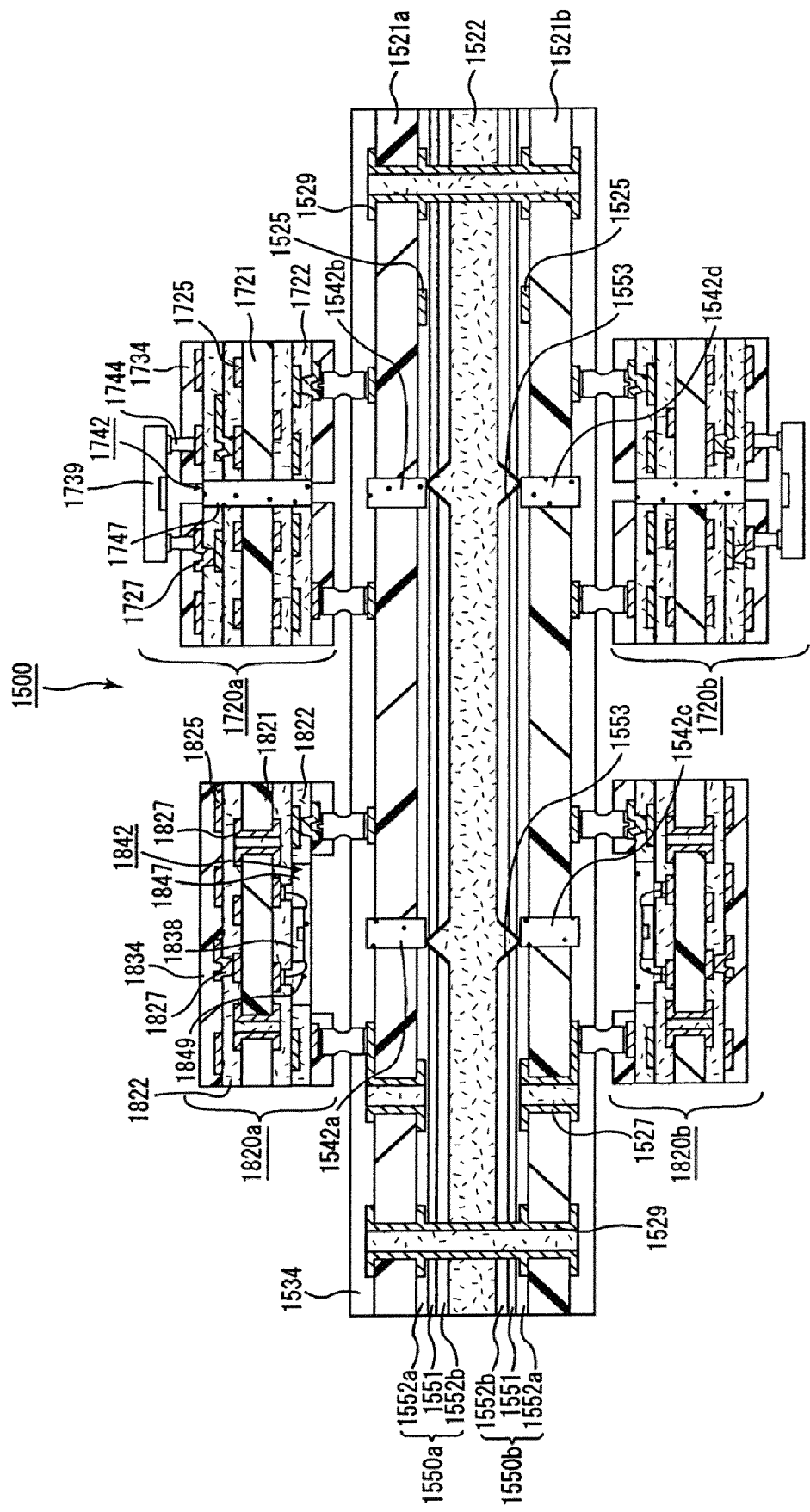
FIG. 15 is a cross section view schematically showing a multilayer printed circuit board according to another embodiment of the present invention.

FIG. 15 is a cross section view schematically showing a multilayer printed circuit board according to another embodiment of the present invention.

The multilayer printed circuit board shown in FIG. 15 has the same configuration as the multilayer printed circuit board shown in FIG. 1, except that package substrates mounted with an optical element are mounted instead of optical elements.

That is to say, package substrates 1820*a* and 1820*b* on which light receiving elements 1838 are mounted are mounted instead of light receiving elements 138, and package substrates 1720*a* and 1720*b* on which light emitting elements 1739 are mounted are mounted instead of light receiving elements 139.

In a package substrate 1720, conductor circuits 1725 and insulating layers 1722 are layered on both sides of a substrate 1721, solder resist layers 1734 are formed as the outermost layers, and furthermore, an optical signal transmitting region 1742 which penetrates through the substrates, the insulating layers and the solder resist layers is formed, and a light emitting element 1739 is mounted. In addition, a portion of the optical signal transmitting region 1742 is filled in with a resin composite 1747.

In addition, in a package substrate 1820, conductor circuits 1825 and insulating layers 1822 are layered on both sides of a substrate 1821, solder resist layers 1834 are formed as the outermost layers, and an optical signal transmitting region 1842 in recess form is formed in a portion of an insulating layer and a solder resist layer.

In addition, a light receiving element 1838 is mounted inside the optical signal transmitting region 1842 through wire bonding 1849.

In this multilayer printed circuit board 1500 also, optical signals can be transmitted between a light emitting element and a light receiving element in the same manner as in the multilayer printed circuit board 100 shown in FIG. 1.

Here, the lead parts of the package substrates mounted on the multilayer printed circuit board according to the present invention are not particularly limited, and they may be SOPS, QFPs and the like.

In addition, in the embodiments shown in FIGS. 1 to 15, optical fiber sheets may be formed as optical circuits instead of optical waveguides, or conversely, optical waveguides may be formed instead of optical fiber sheets.

In addition, though optical elements are mounted directly in the embodiments shown in FIGS. 1 to 14, package substrates on which optical elements are mounted may be mounted instead of the optical elements.

As described above, as embodiments of the multilayer printed circuit boards according to the present invention, (1) an embodiment where insulating layers where conductor circuits are formed on the two surfaces and an optical waveguide is formed on at least one surface are layered by interposing an insulating layer comprising an adhesive insulating material, (2) an embodiment where insulating layers where conductor circuits are formed on the two surfaces are layered on the two surfaces of an optical waveguide film or an optical fiber sheet by interposing insulating layers comprising an adhesive insulating material, and (3) an embodiment where insulating layers where conductor circuits are formed on the two surfaces are layered on the two surfaces of an insulating layer where an optical waveguide is formed on at least one surface by interposing insulating layers comprising an adhesive insulating material, and the like can be cited as examples, and the relationship between these and the multilayer printed circuit boards shown in FIGS. 1 to 15 is briefly described in the following. As multilayer printed circuit boards corresponding to the above described embodiment (1), the multilayer printed circuit boards shown in FIGS. 1 to 6, 11 and 15 can be cited; as multilayer printed circuit boards corresponding to the above described embodiment (2), the multilayer printed circuit boards shown in FIGS. 8 to 12 and 14 can be cited; and as multilayer printed circuit boards corresponding to the above described embodiment (3), the multilayer printed circuit boards shown in FIGS. 7 and 13 can be cited.

In the following, the effects of the above described embodiments are briefly described.

In the case where a multilayer printed circuit board where an optical waveguide is formed between insulating layers is manufactured, it is possible to make an optical waveguide be in an internal layer in accordance with a build-up method, where insulating layers and conductor circuits are alternately layered on one another. However, since it is necessary to carry out a curing process many times in an oven and the like when insulating layers are formed, the thermal history for the optical waveguide (total time during which heat is applied) becomes long. In addition, there are cases where the more heat is applied to the optical waveguide, the greater the loss in light transmission becomes. In addition, as the thermal history becomes long, it becomes easier for problems to occur in terms of the reliability, such that cracking occurs due to the difference in the coefficient of thermal expansion between the substrates, the insulating layers and the conductor circuits.

In contrast to this, the multilayer printed circuit board according to the above described embodiment (1) can be manufactured by forming the respective portions of the multilayer printed circuit board in advance, layering these collectively, and after that, pressing the layers, and therefore, the thermal history can be shortened and the loss in light transmission can be reduced, and thus, a multilayer printed circuit board having high reliability can be provided.

In addition, the above described collective layering can be carried out in accordance with a pin lamination method, and in this case, precision of positioning the optical waveguide and the conductor circuits can be improved. Specifically, the clearance between the guide pins and guide holes is made as small as possible when guide holes are formed on the basis of alignment marks which are formed at the same time as conductor circuits, and to form the optical waveguide, the core of the optical waveguide and optical path conversion mirrors are formed in an optical signal transmitting region on the basis of alignment marks which are formed at the same time as conductor circuits, and thereby, precision of positioning for optical coupling between an optical element which is mounted on the substrate and the optical waveguide can be improved.

In addition, in the multilayer printed circuit board according to the above described embodiment (2), it is not necessary to form an optical waveguide directly on an insulating layer of the multilayer printed circuit board, and optical circuits can simply be formed between insulating layers using an optical waveguide film and an optical fiber sheet which have been separately manufactured in advance. In addition, the optical waveguide film and the optical fiber sheet can be positioned by inserting guide pins into guide holes, and therefore, positioning can be carried out with high precision through passive alignment, and furthermore, guide holes are formed in the periphery of the portion where optical signals are transmitted from the optical waveguide film and the optical fiber sheet (optical path converting portion on entrance side, core, and optical path converting portion on exit side), so that guide pins are inserted, and thereby, the above described optical waveguide film and the like can be prevented from expanding or shrinking when the optical waveguide film and the optical fiber sheet are pressed, and thus, the precision for positioning can further be improved.

In addition, the optical waveguide film and the optical fiber sheet may be formed on the entire surface between insulating layers, partially formed or formed in the size greater than that of the multilayer printed circuit board in a plan view. In the case where the size is greater than that of the multilayer printed circuit board in a plan view, an optical connector can be directly attached to an end portion of the optical waveguide film and the like.

Usually, when an optical connector is attached, an optical connector or a fiber array to which an optical connector is attached is secured to an optical circuit on an end surface or on top of the multilayer printed circuit board through adhesion, through passive alignment, and in this case, a problem arises, such that the portion secured through adhesion may break or the connection loss may increase when an external force is applied. In the case where an optical connector is attached directly in an end portion of the optical waveguide film and the like, however, no connection portion is necessary, and thus, no such problem as described above arises, which leads to increase in the reliability.

In addition, the above described embodiment (3) is particularly useful in the case where the optical waveguide is as thin as 90 μm to 300 μm.

This is because when a thin optical waveguide (optical waveguide film) is formed through laminating press, the optical waveguide film in some cases transforms (changes in form) due to heat and is fixed with an adhesive in a changed state at the time of pressing, and the transmission loss may increase when the optical waveguide transforms (changes in form) and bends in this manner. Furthermore, there is a possibility that expansion or shrinking of the optical waveguide film may be great and the precision for positioning may be lowered.

In contrast to this, in the case where the optical waveguide is formed on an insulating layer in advance, as in the above described embodiment (3), the effects of heat (change in form, expansion or shrinking) at the time of laminating press can be reduced, and the precision for positioning can be improved and loss can be reduced.

In addition, it is desirable for the multilayer printed circuit board according to the present invention to be formed so that the above described optical signal transmitting regions penetrate through the insulating layer in one outermost layer, and for conductor circuits and/or pads to be formed in locations on the outside of the insulating layer in the other outermost layer along the extension line of the above described optical signal transmitting regions on the side which is optically coupled with the above described optical circuit.

This is described in reference to the drawing.

Figure 28:
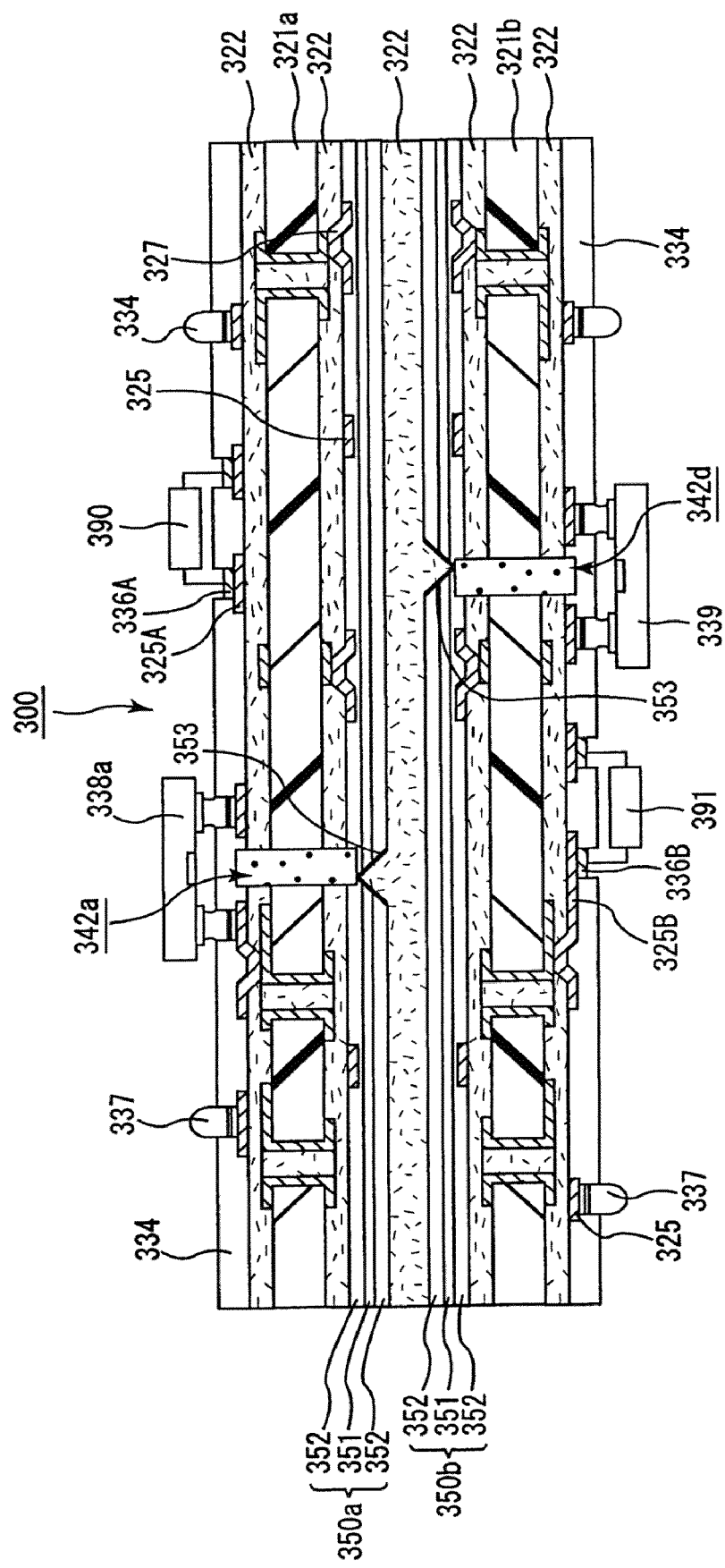
FIG. 28 is a cross section view schematically showing a multilayer printed circuit board according to another embodiment of the present invention.

FIG. 28 is a cross section view schematically showing a multilayer printed circuit board to another embodiment of the present invention.

In FIG. 28, an SMD type condenser 390 and a QFP type LSI 391 are mounted on the surface of a multilayer printed circuit board 300 shown in FIG. 3.

In addition, in the multilayer printed circuit board 300, a conductor circuit 325B and pads 336B for mounting the QFP type LSI 391 are formed on the outside of an insulating layer 332 in an outermost layer along the extension line of an optical signal transmitting region 342*a* on the side where an optical waveguide 350*a* is formed, and in addition, a conductor circuit 325A and pads 336A for mounting the SMD type condenser 390 are formed on the outside of an insulating layer 322 in an outermost layer along the extension line of an optical signal transmitting region 342*b* on the side where an optical waveguide 350*b* is formed.

In this manner, an optical waveguide is formed between insulating layers in the multilayer printed circuit board according to the present invention, and therefore, an optical element or a package substrate on which an optical element is mounted can be mounted on the surface of the multilayer printed circuit board on the side from which an end portion of an optical signal transmitting region is exposed along the extension line of the optical signal transmitting region, various electronic parts can be mounted on the surface of the multilayer printed circuit board along the extension line on the side of the optical signal transmitting region where the optical waveguide is formed, and conductor circuits and pads having a fine pattern can be formed on the insulating layers in the outermost layers. Accordingly, there is great freedom in design, and the multilayer printed circuit board is appropriate for miniaturization and mounting with high density.

Here, this is the same in the case where optical elements and the like are mounted on the two surfaces of the multilayer printed circuit board.

In addition, in the case where pads are formed on the insulating layer along the extension line of an optical signal transmitting region on the side where the optical waveguide is formed, all areas of one pad may be located along the extension line, or a portion of one pad may be located along the extension line.

Next, a method for manufacturing a multilayer printed circuit board according to the present invention is described following the order of processes.

(1) First, an insulating substrate (insulating layer which becomes a base) is used as a starting material, and a conductor circuit and a solid conductor layer are formed on this insulating substrate. Here, a conductor circuit may be formed on one surface of the insulating substrate, and a solid conductor layer may be formed on the other surface.

The above described insulating substrate is not particularly limited, and resin substrates such as glass epoxy substrates, bismaleimide-triazine (BT) resin substrates, copper-clad laminates and RCC substrates, ceramic substrates such as aluminum nitride substrates, silicon substrates, glass substrates, and the like can be cited as examples.

The above described conductor circuits can be formed for example, by carrying out an etching process after the formation of a solid conductor layer on the surface of the above described insulating substrate through an electroless plating process.

In addition, non-penetrating via holes for connecting conductor circuits sandwiching the above described insulating substrate may be formed. In addition, the surface of the conductor circuits may be roughened through an etching process and the like if necessary after the formation of the conductor circuits.

The above described non-penetrating via holes can be formed by drilling holes or the like in the above described insulating substrate and carrying out a plating process on the wall surface of the holes.

(2) Next, an insulating layer and optical circuits are formed and layered on an insulating substrate on which a conductor circuit and a solid conductor layer are formed in the above described process (1).

Here, the insulating layer can be formed by carrying out the below described process (a) (process for forming an insulating layer). In addition, in the case where an insulating layer is formed as described above, it is desirable to form a conductor circuit through layering by carrying out the below described process (b) (process for forming a conductor circuit), and to form via holes.

In addition, optical circuits can be formed by carrying out the below described process (c) (process for providing optical circuits). In addition, in the case where optical circuits are formed, an optical signal transmitting region may be formed in the insulating substrate, if necessary.

Furthermore, an insulating layer and optical circuits may both be formed, and in this case, the order of formation thereof is not important. In addition, in this case, an optical signal transmitting region which penetrates through the insulating substrate and the insulating layer may be formed.

First, the process (a) (process for forming an insulating layer) is described.

The above described insulating layer may be formed of a thermosetting resin, a photosensitive resin, a resin where a photosensitive group is attached in a portion of a thermosetting resin, a resin compound which includes any of these and a thermoplastic resin and the like. Here, it is desirable to form the insulating layer having openings for via holes.

Specifically, first, an uncured resin is applied using a roll coater, a curtain coater and the like, or a resin film is made to adhere to the substrate under the application of heat and pressure, whereby a resin layer is formed, and after that, a curing process is carried out if necessary, and openings for via holes are formed through a laser process or a light exposure and developing process, whereby an insulating layer can be formed.

In addition, a resin layer made of a thermoplastic resin as that described above can be formed by making a resin mold in film form adhere to the substrate under application of heat and pressure.

As the above described thermosetting resin, epoxy resins, phenol resins, polyimide resins, polyester resins, bismaleimide resins, polyolefin based resins, polyphenylene ether resins, polyphenylene resins, fluorine resins and the like can be cited as examples.

As the above described photosensitive resin, acrylic resins and the like can be cited as examples.

In addition, the resin prepared by adding a photosensitive group to a part of a thermosetting resin include, for example, resins prepared by allowing a thermosetting group of the above-mentioned thermosetting resin to be acrylated with methacrylic acid or acrylic acid, and the like.

As the above described thermoplastic resin, phenoxy resins, polyether sulfone (PES), polysulfone (PSF), polyphenylene sulfone (PPS), polyphenylene sulfide (PPES), polyphenylene ether (PPE), polyether imide (PI) and the like can be cited as examples.

In addition, as a specific combination for the above described resin compound, phenol resin/polyether sulfone, polyimide resin/polysulfone, epoxy resin/polyether sulfone, epoxy resin/phenoxy resin and the like can be cited as examples. In addition, as a specific combination for the photosensitive resin and the thermoplastic resin, acrylic resin/phenoxy resin, epoxy resin where a portion of an epoxy group is acrylated/polyether sulfone, and the like can be cited as examples.

In addition, it is desirable for the mixture ratio of the thermosetting resin or photosensitive resin and the thermoplastic resin in the above described resin compound to be thermosetting resin or photosensitive resin/thermoplastic resin=(95/5) to (50/50). This is because a high tenacity value can be secured without the heat resistance deteriorating. In addition, the above described insulating layer may be formed of two or more different resin layers.

In addition, the above described insulating layer may be formed of a resin compound for forming a rough surface.

The above described resin compound for forming a rough surface is, for example, an uncured heat resistant resin matrix which is insoluble in a coarsening liquid made of at least one type selected from acid, alkali and oxidants and where a substance which is soluble in the coarsening liquid made of at least one type selected from acid, alkali and oxidants is dispersed.

Here, as for the above described words "insoluble" and "soluble," substances of which the rate of dissolution is relatively high when immersed in the same coarsening liquid for the same period of time are referred to as "soluble," and substances of which the rate of dissolution is relatively low are referred to as "insoluble," for the purpose of convenience.

As the laser used in the above described laser process, carbon dioxide gas lasers, ultraviolet-ray lasers, excimer lasers and the like can be cited as examples. A desmearing process may be carried out if necessary after the creation of openings for via holes.

In addition, in this process, openings for via holes which penetrate through insulating substrates and the insulating layers may be formed if necessary.

Next, the above described process (b) (process for forming a conductor circuit) is described.

Here, a conductor circuit is formed on the surface of the insulating layer. In addition, in the case where openings for via holes are formed in the above described insulating layer, it is desirable to form non-penetrating via holes at the same time.

First, a method for forming conductor circuits in accordance with a semi-additive method is described.

Specifically, a thin film conductor layer is first formed on the surface of the insulating layer through electroless plating or sputtering, and then, a plating resist is formed in a portion of this surface, and after that, an electrolytic plating layer is formed in portions where the plating resist is not formed. Next, the plating resist and the thin film conductor layer beneath the plating resist are removed, and thus, conductor circuits are formed.

As the material for the above described thin film conductor layer, copper, nickel, tin, zinc, cobalt, thallium, lead and the like can be cited as examples. Materials made of copper or copper and nickel are desirable in that they have excellent electrical properties and are economical.

In addition, it is desirable for the thickness of the above described thin film conductor layer to be 0.1 to 2.0 μm.

In addition, the surface of the insulating layer may be coarsened before the formation of the above described thin film conductor layer.

The above described plating resist can be formed by carrying out in a light exposure and developing process after pasting a photosensitive dry film, for example.

In addition, it is desirable for the thickness of the above described electrolytic plating layer to be 5 to 20 μm. Copper plating is desirable as the electrolytic plating for the formation of the above described electrolytic plating layer.

The removing of the plating resist may be carried out by using, for example, an aqueous alkali solution and the like, and the removing of the thin-film conductor layer may be carried out by using a mixed solution of sulfuric acid and hydrogen peroxide, or an etching solution such as sodium persulfate, ammonium persulfate, ferric chloride, and cupric chloride.

In addition, the catalyst on the insulating layer may be removed using an acid or an oxidant if necessary after the formation of the above described conductor circuits. This is because deterioration of the electrical properties can be prevented.

In addition, the above described conductor circuits may be formed in accordance with a subtractive method.

In this case, a thin film conductor layer is formed on the surface of the insulating layer through electroless plating or sputtering, and then, a thick-affixing process of the thin film conductor layer is carried out through electrolytic plating if necessary.

After that, an etching resist is formed in portions on the surface of the conductor layer and the conductor layer is removed from portions where the etching resist is not formed, whereby conductor circuits are formed.

Here, electrolytic plating, etching and the like can be carried out using the same methods as those used in the semi-additive method, for example.

Next, the above described process (c) (process for providing optical circuits) is described.

Here, optical circuits, for example, an optical waveguide or an optical fiber sheet, are formed in predetermined locations on the insulating substrate or the insulating layer (that may be a portion of an insulating substrate or an insulating layer, or may be the entirety thereof).

In the case where optical waveguides are formed as the above described optical circuits, and in the case where the above described optical waveguides are formed using an inorganic material such as silica glass, as the material, formation can be achieved by attaching optical waveguides which have been formed in a predetermined form in advance by interposing an optical adhesive.

In addition, optical waveguides can be formed of an inorganic material as that described above by forming a film from an inorganic material such as $LiNbO_3$ or $LiTaO_3$, in accordance with a liquid-phase epitaxial method, a chemical vapor deposition method (CVD), a molecular beam epitaxial method and the like.

In addition, as the method for forming optical waveguides from a polymer material, (1) a method for pasting an optical waveguide film which has been formed in advance on a glass substrate, a silicon substrate, a resin substrate and the like in film form to an insulating layer, (2) a method for forming optical waveguides directly on the above described insulating layers and the like by sequentially forming a lower clad, a core and an upper clad through layering on the insulating layers and the like can be cited.

Here, the same method can be used as the method for forming optical waveguides in the case where optical waveguides are formed on a glass substrate and also in the case where optical waveguides are formed on an insulating layer.

Here, in the case where an optical waveguide film is formed, a mold release material, such as a silicone resin, may be applied to the glass substrate and the like. In addition, after formation, the optical waveguide film can be removed by using a hydrofluoric acid solution and the like.

Specifically, a method using reactive ion etching, a light exposure and developing method, a molding method, a resist forming method, a method combining any of these and the like can be used.

In accordance with the above described method using a reactive ion etching, (i) first, a lower clad is formed on top of a glass substrate or an insulating layer (hereinafter, simply referred to as glass substrate and the like), (ii) next, a resin composite for a core is applied on top of this lower clad, and furthermore, a curing process is carried out if necessary, whereby a resin layer for forming a core is gained. (iii) Next, a resin layer for forming a mask is formed on the above described resin layer for forming a core, and then, a light exposure and developing process is carried out on this resin layer for forming a mask, whereby a mask (etching resist) is formed on the resin layer for forming a core.

(iv) Next, reactive ion etching is carried out on the resin layer for forming a core, whereby the resin layer for forming a core is removed from portions where the mask is not formed, and thus, a core is formed on the lower clad. (v) Finally, an upper clad is formed over the lower clad so as to cover the above described core, and thus, optical waveguides are gained.

In accordance with this method using reactive ion etching, optical waveguides having high reliability in terms of the dimensions can be formed. In addition, this method is excellent in terms of reproducibility.

In addition, in accordance with the light exposure and developing method, (i) first, a lower clad is formed on top of a glass substrate and the like, (ii) next, a resin composite for a core is applied to this lower clad, and a semi-curing process is carried out if necessary, whereby a layer of a resin composite for forming a core is formed.

(iii) Next, a mask where a pattern which corresponds to the portions where the core is formed is drawn is placed on top of the above described layer of a resin composite for forming a core, and after that, a light exposure and developing process is carried out, whereby a core is formed on top of the lower clad. (iv) Finally, an upper clad is formed over the lower clad so as to cover the above described core, and thus, optical waveguides are gained.

The number of processes is small in this light exposure and developing method, which therefore is appropriate for use at the time of mass production of optical waveguides, and in addition, the number of heating processes is small, and therefore, it is difficult for stress to occur in the optical waveguides.

In addition, in accordance with the above described molding method, (i) first, a lower clad is formed on top of a glass substrate and the like, (ii) next, trenches for forming a core are formed in the lower clad through molding. (iii) Furthermore, the above described trenches are filled in with a resin composite for a core through printing, and after that, a curing process is carried out, whereby a core is formed. (iv) Finally, an upper clad is formed over the lower clad so as to cover the above described core, and thus, optical waveguides are gained.

This molding method is appropriate for use at the time of mass production of optical waveguides, and optical waveguides having a high level of reliability in terms of the dimensions can be formed. In addition, this method is excellent also in terms of reproducibility.

In addition, in accordance with the above described resist forming method, (i) first, a lower clad is formed on top of a glass substrate and the like, (ii) furthermore, a resin composite for a resist is applied on top of this lower clad, and after that, a light exposure and developing process is carried out, whereby a resist for forming a core is formed in portions where the core is not formed on top of the above described lower clad.

(iii) Next, a resin composite for a core is applied to portions where the resist is not formed on top of the lower clad, (iv) furthermore, the resin composite for a core is cured, and after that, the above described resist for forming a core is removed, whereby a core is formed on the lower clad. (v) Finally, an upper clad is formed over the lower clad so as to cover the above described core, and thus, optical waveguides are gained.

This resist forming method is appropriate for use at the time of mass production of optical waveguides, and optical waveguides having a high level of reliability in terms of the dimensions can be formed. In addition, this method is excellent also in terms of reproducibility.

In the case where optical waveguides are formed from a polymer material using these methods, and in the case where optical waveguides where particles are mixed into the cores are formed, a molding method is desirable over a light exposure and developing method. The reason for this is as follows.

That is to say, in the case where a core is formed in accordance with a molding method, where a trench for forming a core is formed in a lower clad through molding, and after that, a core is formed within this trench, particles to be mixed into the core are all put in the core, and therefore, the surface of the core is flat, providing excellent transmission for optical signals, while in the case where a core is formed in accordance with a light exposure and developing method, some particles may protrude from the surface of the core after development, or dents may be formed when particles come off from the surface of the core, and thus, the surface of the core sometimes becomes uneven, and light may not be reflected in a desired direction due to this unevenness, and as a result, the transmission of optical signals may lower.

In addition, though different resin composites are prepared as the resin composite for a core and the resin composite for a clad for the formation of optical waveguides in accordance with the methods for forming optical waveguides described in the above, optical waveguides may be formed in accordance with, for example, a photo-bleaching method, where only a resin composite for a clad is prepared and a core is formed by changing the index of refraction of the resin composite for a clad using a single pulse laser, for example a femtosecond laser, or through exposure to light.

In addition, in the case where optical waveguides are formed directly and in the case where optical waveguides are formed on conductor circuits, it is desirable for a lower clad to be formed so as to be thicker than the conductor circuits. This is because undulation and the like can be prevented from being caused in the optical waveguides.

In addition, in the case where a resin composite for a clad is applied using a spin coater at the time of formation of the lower clad, a lower clad having a flat surface can be formed by applying a large amount and adjusting the rotational speed so that a sufficient amount of the resin composite can be supplied into the space between the conductor circuits.

In addition, at the time of formation of the lower clad, a flattening process may be carried out, in such a manner that after the application of the resin composite for a clad, a film is mounted, and pressure is applied using a flat plate.

Here, the resin composite for an optical waveguide (resin composite for a clad, resin composite for a core) can be applied using a roll coater, a bar coater, a curtain coater and the like, in addition to a spin coater.

In addition, in the case where an optical fiber sheet is formed as optical circuits, an optical fiber sheet that has been manufactured in advance may be pasted in a predetermined location by interposing an adhesive material and the like.

In addition, the optical fiber sheet can be formed by wiring a required number of optical fibers on a base film (cover resin layer) made of a polyimide resin and the like using an optical fiber wiring apparatus, and after that, coating the surroundings of the optical fibers with a protective film (cover resin layer) made of a polyimide resin and the like. Here, a commercially available optical fiber sheet can also be used.

In addition, in the case where optical circuits are formed using an optical waveguide film or an optical fiber sheet, it is difficult to adjust the optical axes because they are in sheet form. Therefore, it is desirable to select a rigid material for the insulating layer to which an optical waveguide film or an optical fiber sheet is pasted, as described above, so that the optical waveguide film and the like can be prevented from bending. This is because positioning becomes easy.

In addition, optical path conversion mirrors are formed in the above described optical circuits.

Though the above described optical path conversion mirrors may be formed before the attachment of the optical circuits to the insulating layer, or may be formed after the attachment of the optical circuits to the insulating layer, it is desirable to form optical path conversion mirrors in advance, except in the case where the optical circuits are formed directly on the insulating layer. This is because work can be easily carried out and there is no risk of other members that form the multilayer printed circuit board; for example the substrate, the conductor circuits, the insulating layers and the like, being scratched or damaged at the time or work. Here, the precision is higher when the optical path conversion mirrors are formed after attachment of the optical circuits to the insulating layer.

The method for forming the above described optical path conversion mirrors is not particularly limited, and conventional, well known methods for formation can be used. Specifically, a machine process using a diamond saw having an end in V shape with an angle of 90°, a cutting instrument or a blade, a process using reactive ion etching, laser ablation and the like can be used. In addition, in the case where optical diverting mirrors are formed at both ends of an optical waveguide film and the like, optical path conversion mirrors may be formed by securing the optical waveguide film and the like to the jig of a polishing machine and then polishing the two ends.

In addition, buried optical path diverting members may be formed instead of optical path conversion mirrors.

In addition, in the case where optical path conversion mirrors are formed in the optical waveguides with an angle of 90 degrees, the angle formed between the surface on which the lower clad makes contact with the substrate or the insulating layer and the surface for diverting the optical path may be 45 degrees or 135 degrees. In addition, a metal vapor deposition layer may be formed on the reflective surface of the above described optical path conversion mirrors. In this case, one or two kinds from among gold, silver, platinum, copper, nickel, palladium, aluminum, chromium and the like may be vapor deposited.

Here, in these processes (1) and (2), a required number of circuit boards where insulating layers and optical circuits are formed and layered on the two surfaces of the insulating substrate are formed.

(3) Two circuit boards, for example, formed through the above described processes (1) and (2) are prepared, and these circuit boards are positioned in accordance with a pin lamination method or a mass lamination method so as to sandwich an adhesive insulating material, and then, the insulating layers and the adhesive insulating material are integrated by pressing these.

As the above described adhesive insulating material, prepregs, glass unwoven cloth prepregs, materials in sheet form such as adhesive films, and resin composites in liquid form can be cited as examples. In addition, as the above described adhesive insulating material, epoxy resins, BT resins and the like can be cited.

In addition, in the case where the above described insulating layers comprise a resin material, it is desirable for the resin which is the material for the insulating layers and the resin for the adhesive insulating material to be the same.

In addition, in the case where a material in sheet form is used, it may be simply disposed so as to interpose two circuit boards, it may be attached to one circuit board in advance, or it may be attached to each of the two circuit boards in advance, before pressing. Here, in the case where it is attached to each of the two circuit boards, two sheets of a material in sheet form are used.

In addition, in the case where a resin composite in liquid form is used, it may be applied to one or both of the circuit boards and cured to a state of B-stage, followed by pressing, or pressing may be carried out in a state where the resin composite in liquid form is applied to one or both of the circuit boards. In addition, particles may be mixed in with the above described resin composite in liquid form.

In some cases, the adhesive insulating material, for example, the above described prepreg, forms a portion of an optical signal transmitting region, and in such cases, it is desirable for the transmittance for a thickness of 30 µm to be 60% or more.

In the case where the transmittance is 60%/30 µm, transmission loss due to the prepreg is 2.0 dB; in the case where the transmittance is 80%/30 µm, the transmission loss is about 0.8 dB; and in the case where the transmittance is 90%/30 µm, the transmission loss is about 0.4 dB, and optical signals can be transmitted when the loss is approximately this much. Here, the transmittance may be selected on the basis of the distance for transmission.

In addition, as the above described adhesive insulating material, a transparent resin having high transmittance, for example, the same resin as that used for the formation of an optical waveguide, can be used.

In the case where a resin having such a high transmittance, specifically, a resin having a transmittance of 70%/1 mm is used with a thickness of 30 µm, the transmission loss is about 0.05 dB, and in the case where a resin having a transmittance of 90%/1 mm is used with a thickness of 30 µm, the transmission loss is about 0.01 dB, which is extremely small.

In addition, in the case where an optical signal transmitting region is formed so as to penetrate through the insulating layer comprising the above described adhesive insulating material, it is desirable for the resin composite with which the through holes for an optical path are filled in and the adhesive insulating material to have the same index of refraction. This is because no reflection or refraction occurs in the interface between the two.

In addition, the above described adhesive insulating material may contain particles. The difference in the coefficient of thermal expansion with other insulating layers can be made small by mixing in particles, and thus, warping of the substrate due to a difference in the coefficient of thermal expansion, shifting of the optical axis and the like can be prevented.

Specifically, in the case where 25% by weight of silica in spherical form having a distribution in particle size of 0.1 µm to 0.8 µm is added to an acryl based resin (index of refraction: 1.51, transmittance: 93%/mm, coefficient of thermal expansion: 70 ppm), for example, the transmittance becomes as low as 81%/mm, but the coefficient of thermal expansion becomes 53 ppm. Here, taking into consideration that the coefficient of thermal expansion of epoxy resin substrates which are widely in use as an insulating layer in multilayer printed circuit boards is about 20 ppm, it is preferable to mix in particles, in the case where epoxy resin substrates are used as other insulating layers.

Here, though the transmittance is lowered by mixing in particles in the described example, a resin having such a degree of transmittance can be used as the adhesive insulating material, as described above.

The same particles as those included in the above described optical waveguide can be cited as specific examples of the above described particles.

Layers may be sandwiched with hot plates (SUS plates and the like) after positioning in accordance with a pin lamination method or a mass lamination method, and then pressed as described above while heat and pressure are applied. In addition, the above described pressing may be carried out in a vacuum.

In addition, in the case where pressing is carried out in accordance with the above described method, it is desirable for the outermost layers (surfaces making contact with the hot plates) to be formed of conductor layers having no pattern. In the case where a conductor circuit is formed in an outermost layer, for example, the pressure conveyed from a hot plate becomes uneven (pressure conveyed through a region where a conductor circuit is formed becomes greater than a region where no conductor circuit is formed), and as a result, conductor circuits forming the respective layers, insulating layers and optical circuits may be undulated. In particular, in the case where optical circuits are undulated, this causes the transmission loss to increase, and uneven pressure causes the optical circuits to positionally shift.

In terms of the conditions for the above described pressing, conditions such that the pressure is 20 kg/cm$^2$ to 50 kg/cm$^2$, the period of time for pressing at a temperature of 180° C. or more is 40 minutes or more, and the total period of time for pressing is 150 minutes can be cited as an example.

In addition, in the case where circuit boards and the adhesive insulating material are layered and pressed in this process, three or more circuit boards may be prepared, and the adhesive insulating material may be sandwiched between the respective circuit boards when the layers are pressed.

In addition, in this process, optical circuits, for example, an optical waveguide that has been manufactured in film form in advance (optical waveguide film) or an optical fiber sheet, are prepared, in addition to the circuit boards and the adhesive insulating material, and these may be layered in the order of, for example, a circuit board, an adhesive insulating material, optical circuits, a adhesive insulating material, a circuit board, and pressed.

Furthermore, the laminating press may be carried out with an insulating layer substrate (insulating layer which becomes a base) where optical circuits are formed directly on one surface or on the two surfaces interposed therebetween. Here, in this case, as the method for forming optical circuits, the same method as that used in the above described process (c) can be used.

(4) Next, a via hole which penetrates through all of the insulating layers (penetrating via holes) is formed, if necessary.

The above described penetrating via hole can be formed by forming a through hole which penetrates through all of the insulating layers, for example, through a drilling process, and after that, forming a conductor layer on the wall surface of this through hole through plating and the like.

In addition, in this process, an optical signal transmitting region which penetrates through all of the insulating layers may be formed, and in this case, it is desirable to form optical circuits in the outermost layers.

In addition, conductor circuits sandwiching all of the insulating layers may be connected through a plurality of non-penetrating via holes.

These non-penetrating via holes are formed by forming non-penetrating through holes in the direction toward one conductor circuit formed in an inner layer from the two surfaces of the layered insulating layers in a laser process (in this case, the respective non-penetrating holes become bottomed holes on the two surfaces of the above described conductor circuit), and after that, forming a conductor layer on the wall surface (which may be entirety of inside) of the non-penetrating holes through plating and the like.

In addition, in the present process, the above described process (2), that is to say, the process of layering an insulating layer and a conductor circuit and the process of layering optical circuits may be repeated one or more times after the creation of penetrating via holes.

(5) Next, solder resist layers are formed in the outermost layers, if necessary.

The above described solder resist layers can be formed by carrying out a curing process after an uncured solder resist composite is applied, or by pasting a film made of the above described solder resist composite by applying pressure, and then carrying out a curing process if necessary.

In addition, in the case where a solder resist layer of which the transmittance is not high is formed as the solder resist layer in this process, openings for an optical path which can work as an optical signal transmitting region are formed at the same time as the formation of the solder resist layer. Here, in the case where a solder resist layer which is transparent to transmission light is formed, it is not necessary to form openings for an optical path.

The above described openings for an optical path can be formed by carrying out a light exposure and developing process, for example, after application of the above described solder resist composite.

In addition, openings for forming solder bumps (openings for mounting an IC chip or an optical element) may be formed at the same time as the formation of the openings for an optical path. Openings for an optical path and openings for forming a solder bump may, of course, be formed separately.

In addition, at the time of formation of a solder resist layer, a resin film having openings at desired locations is manufactured in advance, and a solder resist layer having openings for an optical path and openings for forming solder bumps may be formed by pasting the resin film.

In addition, the openings for an optical path formed in this process may be filled in with the same resin composite as the resin composite with which the through holes for an optical path are filled in.

(6) Next, micro lenses are provided on end portions of the optical signal transmitting regions if necessary.

Here, the micro lenses may be provided on the solder resist layer in the case where a transparent solder resist layer is formed as the above described solder resist layer.

In addition, in the case where micro lenses are provided, a surface process, such as a process using a water repellant coating material, a water repellant process using $CF_4$ plasma or a hydrophilic process using $O_2$ plasma, may be carried out in advance in portions where micro lenses are provided. Inconsistencies in the form of micro lenses, particularly in the degree of sagging, may easily be caused, depending on the wettability in the portions where the above described micro lenses are provided, but inconsistencies in the degree of sagging can be reduced by carrying out a surface process.

A specific method for the above described surface process is briefly described in the following.

In the case where the above described process using a water repellant coating agent is carried out, first, a mask having openings in portions which correspond to the portions where micro lenses are formed is made, and then, a water repellant coating agent is applied through application using a spray or application using a spin coater, and after that, the water repellant coating agent is naturally dried, and furthermore, the mask is removed, whereby the surface process is completed. Here, the thickness of the water repellent coating agent layer is usually about 1 µm. Here, a plate with a mesh or a mask on which a resist is formed may be used.

Here, in the case where a process using a water repellant coating agent is carried out, the process using a water repellant coating agent may be carried out on the entirety of the solder resist layer without using a mask.

In addition, in the case where a water repellant process using $CF_4$ plasma is carried out as described above, first, a mask having openings in portions on the solder resist layer which correspond to the portions where micro lenses are formed is made, and then, a $CF_4$ plasma process is carried out, and furthermore, the mask is removed, whereby the surface process is completed. Here, a mask where a resist is formed may be used.

In addition, in the case where a hydrophilic process using $O_2$ plasma is carried out as described above, first, a mask having openings in portions on the solder resist layer which correspond to the portions where micro lenses are formed is made, and then, an $O_2$ plasma process is carried out, and furthermore, the mask is removed, whereby the surface process is completed. Here, a metal plate or a mask where a resist is formed may be used.

In addition, it is desirable to carry out a water repellant process (including a process using a water repellant coating agent) and a hydrophilic process as described above in combination.

In addition, the above described micro lenses may be provided directly, or may be provided with an optical adhesive. Furthermore, they may be provided by using a lens marker. In addition, in the case where they are provided by using a lens marker, a surface process may be carried out in the portions of this lens marker in which micro lenses are provided.

As the method for providing micro lenses directly on the above described solder resist layer, a method for dropping an appropriate amount of uncured resin for an optical lens onto the resin composite and carrying out a curing process on this dropped uncured resin for an optical lens can be cited as an example.

In the above described method, an apparatus such as a dispenser, an inkjet, a micropipette, a microsyringe or the like can be used in order to drop an appropriate amount of uncured resin for an optical lens onto the solder resist layer. In addition, the uncured resin for an optical lens that is dropped onto the solder resist layer using such apparatuses tends to become a sphere due to its surface tension, and therefore, it becomes of a hemispheric form on the above described solder resist layer, and after that, a curing process is carried out on the uncured resin for an optical lens in hemispherical form, whereby micro lenses in hemispherical form can be formed on the solder resist layer.

Here, the diameter, the form of the curved surface and the like of thus formed micro lenses can be controlled by appropriately adjusting the viscosity of the uncured resin for an optical lens and the like taking the wettability between the solder resist layer and the uncured resin for an optical lens into consideration.

(7) Next, solder pads and solder bumps are formed in accordance with the following method, and furthermore, an optical element or a package substrate on which an optical element is mounted.

That is to say, portions of the conductor circuits that have been exposed as a result of the creation of openings for the formation of the above described solder bumps are coated with a corrosion-resistant metal, such as nickel, palladium, gold, silver, platinum and the like, so that solder pads are gained.

The above described coating layer can be formed through, for example, plating, vapor deposition, electro-coating or the like, and from among these, formation through plating is desirable in that the coating layer has excellent uniformity.

Here, the solder pads may be formed before the above described micro lens providing process.

Furthermore, the above described solder pads are filled in with a solder paste via a mask where openings are formed in portions corresponding to the above described solder pads, and after that, solder bumps are formed through reflow. In addition, gold bumps may be formed instead of solder bumps.

Furthermore, optical elements (light receiving elements or light emitting elements) and the like are mounted on the solder resist layer. Optical elements and the like can be mounted by interposing, for example, the above described solder bumps. In addition, at the time of formation of the above described solder bumps, optical elements, for example, are attached at the point in time when the solder pads are filled in with a solder paste, and the optical elements may be mounted at the same time as reflow. In addition, the composite of the solder used here is not particularly limited, and any composite, such as Sn/Pb, Sn/Pb/Ag, Sn/Ag/Cu, Sn/Cu, and the like may be used.

In addition, optical elements may be mounted using a conductive adhesive and the like instead of solder.

In addition, after optical elements and the like are mounted, these optical elements and the like may be filled in with an underfill if necessary. Here, as the method for the filling of an underfill, a conventional, well-known method can be used.

Through the processes described above, a multilayer printed circuit board according to the present invention can be manufactured.

Here, though in this manufacturing method, focusing on a semi-active method, the processes of forming insulating layers and conductor circuits are described, a full additive method, an RCC method, a via sheet lamination method, a bump sheet lamination method or the like may be used for the formation instead of the semi-additive method.

In addition, though in this manufacturing method, non-penetrating via holes are described as photo via holes or laser via holes, the form of the above described non-penetrating via holes are not particularly limited to conformal via holes, field via holes, stud via holes and the like.

Here, though the method for manufacturing a multilayer printed circuit board described so far is a method for preparing a plurality of insulating layers on which a conductor circuit or optical circuits are formed and pressing these by interposing an adhesive insulating material, it is also possible to provide a multilayer printed circuit board where optical circuits are formed between insulating layers (in an internal layer) as described above in accordance with a build-up method, where an insulating layer which becomes a base is used as a starting material and a conductor circuit, optical circuits and other insulating layers are layered on top of this on the basis of the design.

In the case where a multilayer printed circuit board is manufactured in accordance with this method, however, it is necessary to form an opening in the insulating layer, in order to form an optical signal transmitting region after layering the insulating layer on the optical circuits, and in this case, there is a risk that optical circuits may be damaged during the process for forming an opening, which may lead to increase in transmission loss.

Accordingly, it is desirable to manufacture a multilayer printed circuit board according to the present invention in accordance with the above described method.

In a multilayer printed circuit board according to the present invention, an optical circuit for transmitting an optical signal is formed inside the multilayer printed circuit board, that is to say, between insulating layers, and therefore, an appropriate location can be selected for forming an optical circuit taking the locations in which optical parts are mounted and the locations in which conductor circuits are formed into consideration, and thus, there is greater freedom in design for the multilayer printed circuit board, and miniaturization of the multilayer printed circuit board can be achieved.

In addition, in the multilayer printed circuit board according to the present invention, an optical circuit is formed between insulating layers, and therefore, sufficient space for mounting an optical element or various electronic parts can be secured on the surface of the multilayer printed circuit board, and in addition, the conductor circuits in the outermost layers can be made to keep up with circuits with high density. Therefore, it becomes possible to mount various optical parts and electronic parts with high density.

In addition, in the multilayer printed circuit board according to the present invention, in the case where an optical signal transmitting region which penetrates through at least one insulating layer is formed, and furthermore, at least one end of the above described optical signal transmitting region is optically coupled with an optical waveguide, an optical signal can be transmitted, for example, between optical parts which are mounted on each of the two surfaces of the above described multilayer printed circuit board via the above described optical signal transmitting region.

Furthermore, as an optical circuit is formed inside the multilayer printed circuit board according to the present invention, it is easy to make the multilayer printed circuit board fire retardant, making the multilayer printed circuit board much more reliable.

EXAMPLES

In the following, the present invention is described in further detail.

Example 1

1. Manufacture of Circuit Board A (1) A copper-clad multilayer board where copper foils having a thickness of 18 μm are laminated and surface conductor layers 28 are formed on the two surfaces of an insulating substrate 21 comprising a glass epoxy resin or a BT (bismaleimide triazine) resin having a thickness of 0.8 mm was used as a starting material (see FIG. 16(*a*)). First, holes are formed through drilling in this copper-clad multilayer board, and electroless plating films 27' were formed on the wall surface of the holes, and furthermore, holes 9 were filled in with a resin composite 30 (see FIGS. 16(*b*) and 16(*c*)).

Here, as the resin composite, 100 parts by weight of a bisphenol F type epoxy monomer (YL983U, made by Yuka Shell K.K., molecular weight: 310), 170 parts by weight of $SiO_2$ particles in spherical form having a particle diameter of 0.4 to 0.6 μm and an average particle diameter of 1.6 μm when the surface is coated with a silane coupling agent (SO-E2, made by Admatec GmbH), and 1.5 parts by weight of a leveling agent (Perenol S4, made by San Nopco Co., Ltd.) were put into a container and mixed through stirring, so that the viscosity became 45 to 49 Pa·s at 23±1° C. In addition, 6.5 parts by weight of an imidazole curing agent (2E4MZ-CN, made by Shikoku Corp.) was used as a curing agent.

Figure 16:
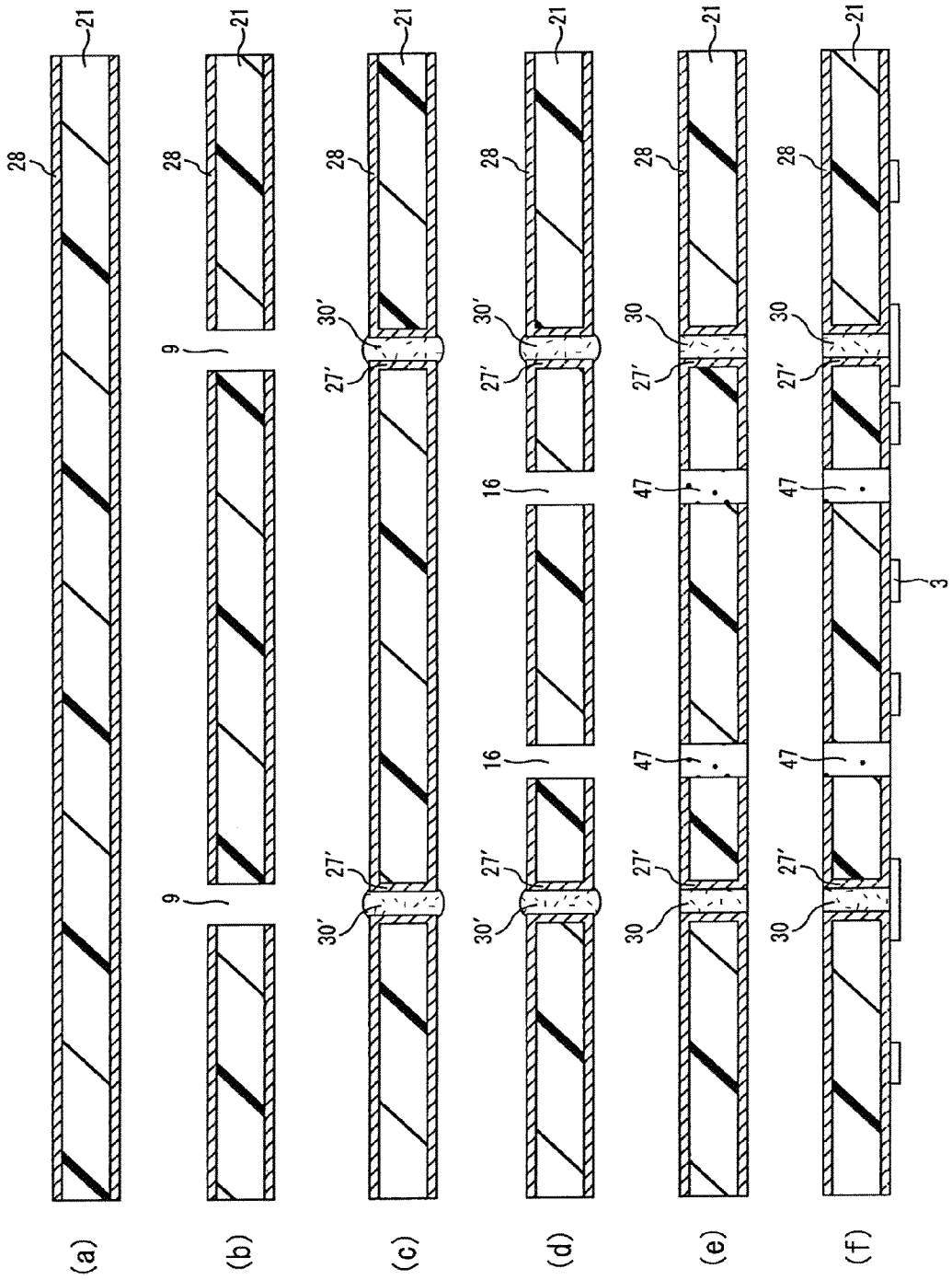
FIG. 16 is a cross section view for schematically illustrating part of a method for manufacturing a multilayer printed circuit board according to the present invention.

(2) Next, through holes for an optical path 16 having such a form that the cross section was a rectangle of 320 μm×1000 μm with semicircles having a radius of 160 μm attached at the two ends were formed in a router process so as to penetrate through a substrate 21 and surface conductor layers 28, and furthermore, a desmearing process was carried out on the wall surface of through holes for an optical path 16 (see FIG. 16(*d*)). In this case, through holes for an optical path 16 having a collective through hole structure were formed.

(3) Next, a resin was disposed on a mask for filling holes of a printing apparatus and screen printing was carried out, and thereby, through holes for an optical path 16 were filled in with a resin composite, and then, a curing process was carried out under conditions of one hour at 120° C. and one hour at 150° C., and after that, the resin which protruded from through holes for an optical path 16 was ground using abrasive paper #3000, and furthermore, the surface was polished with alumina particles having a diameter of 0.05 μm so as to be flattened. Here, the polishing process was carried out so that end portions of the optical signal transmitting regions made of a resin composite 47 and surface conductor layers 28 formed the same plane (see FIG. 16(*e*)). Here, when the resin composite with which the through holes for an optical path were filled in was ground, the resin composite with which holes 9 were filled in and which protruded from the holes was simultaneously ground, in the above described process (1). Here, the protruding resin may be ground at a stage where the holes are filled in with the resin composite in the process (1).

As the resin composite in this process, an epoxy resin (transmittance: 91%, CTE: 82 ppm) to which 40% by weight of crushed silica having a distribution in particle size of 0.1 μm to 0.8 μm was added so that the transmittance became 82%, the CTE became 42 ppm and the viscosity became 200000 cps was used.

Figure 17:
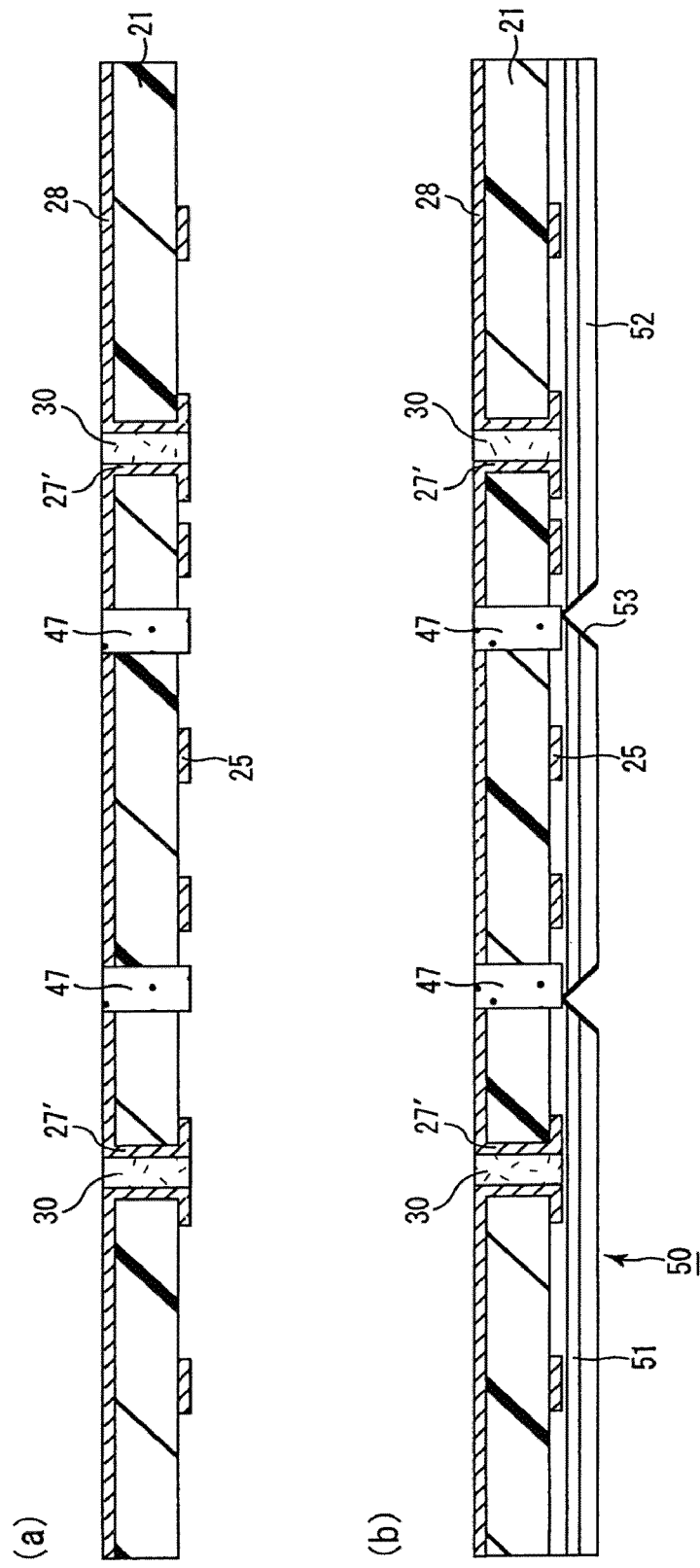
FIG. 17 is a cross section view for schematically illustrating part of a method for manufacturing a multilayer printed circuit board according to the present invention.

(4) Next, an etching resist 3 was formed in portions on one surface conductor layer (lower part in the figure) (see FIG. 16(*f*)) and an etching process was carried out, and thereby, conductor circuits 25 were formed on one surface of the substrate (see FIG. 17(*a*)).

(5) An optical waveguide was formed and layered in accordance with the following method on the side on which conductor circuits 25 were formed. Here, an optical waveguide 50 having four channels where four cores are aligned in parallel was formed as the optical waveguide.

First, an acryl based resin (index of refraction: 1.52, transmittance: 94%, CTE: 72 ppm) was prepared as a resin for forming a core, and an acryl based resin (index of refraction: 1.51, transmittance: 93%, CTE: 70 ppm) to which 25% by weight of $SiO_2$ particles in spherical form having a particle diameter of 0.4 μm to 0.6 μm (SO-E2, made by Admatec GmbH) was added so that the transmittance became 81%, the CTE became 53 ppm and the viscosity became 1000 cps was prepared as a resin for forming a clad.

Next, the resin for forming a clad was applied on the side of the substrate 21 where conductor circuits 25 were formed using a spin coater (1000 pm/10 sec), and pre-baking for 10 minutes at 80° C., a process for exposure to light of 2000 mJ and post-baking for 1 hour at 150° C. were carried out, and thus, a lower clad 52 having a thickness of 50 μm was formed. Here, the lower clad was formed so as to be thicker than conductor circuits 25.

Next, the resin for forming a core was applied on lower clad 52 using a spin coater (1200 pm/10 sec), and pre-baking for 10 minutes at 80° C., a process for exposure to light of 500 mJ through a mask, a developing process for 2 minutes through dipping using a solution of 1% TMAH (tetramethyl ammonium solution), a process for exposure to light of 2000 mJ without a mask, and post-baking for 1 hour at 150° C. were carried out, and thus, a core 51 having a width of 50 μm×a thickness of 50 μm was formed.

Next, the resin for forming a clad was applied using a spin coater (1000 pm/10 sec), and pre-baking for 10 minutes at 80° C., a process for exposure to light of 2000 mJ and post-baking for 1 hour at 150° C. were carried out, and thus, an upper clad having a thickness of 50 μm was formed on the core and an optical waveguide 50 made up of core 51 and clad 52 was provided.

After that, a dicing process using a blade #3000 having an angle of 90° was carried out on the optical waveguide 50 in portions corresponding to optical signal transmitting regions, and furthermore, an Au/Cr vapor deposition film was formed on the surface exposed in the process, and thus, optical path conversion mirrors having an angle of 90° were provided (see FIG. 17(b)).

A circuit board A was completed through these processes.

2. Manufacture of Multilayer Printed Circuit Board (6) Next, the above described two circuit boards A, and one prepreg made of a high Tg epoxy having a thickness of 80 μm (MCL-E-679, made by Hitachi Chemical Co., Ltd.), were prepared, and circuit boards A were layered on both sides of this prepreg and positioned in accordance with a pin lamination method, so that optical waveguides 50 were located inside, and after that, the layers were pressed under such conditions that the pressure was 30 kg/cm², the time for pressing at a temperature of 180° C. or more was 45 minutes, and the total time for pressing was 150 minutes (see FIG. 18(a)). Here, guide holes (not shown) were formed in advance in circuit boards A.

Figure 18:
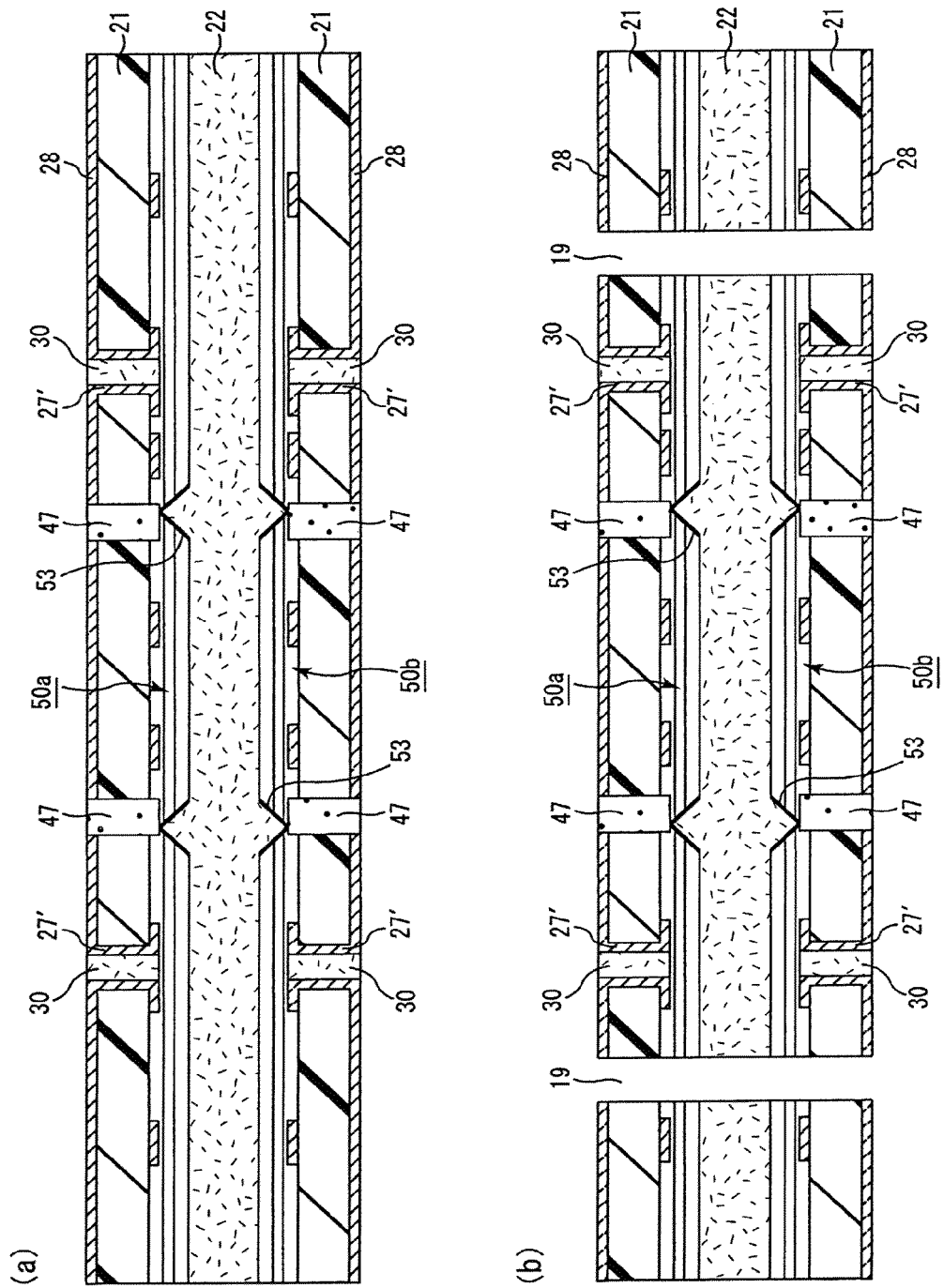
FIG. 18 is a cross section view for schematically illustrating part of a method for manufacturing a multilayer printed circuit board according to the present invention.

(7) Next, through holes 19 were formed through a drilling process so as to penetrate through the entirety of the multilayer board formed in the above described process of (6) (see FIG. 18(a)), and a conductor layer 29' was formed on the wall surface of these through holes 19.

Conductor layers 29' were formed by adding a palladium catalyst to the wall surface of through holes 19, and after that, forming a mask on the surface of the substrate, and then, forming a copper plating film through electroless plating by immersing the substrate in an electroless copper plating solution having the following composition, and after that, attaching a thick electrolytic copper plating film having the following composition.

| [Electroless Plating Solution] | |
| --- | --- |
| $NiSO_4$: | 0.003 mol/l |
| Tartaric acid: | 0.200 mol/l |
| Copper sulfate: | 0.030 mol/l |
| HCHO: | 0.050 mol/l |
| NaOH: | 0.100 mol/l |
| α,α'-Bipyridyl: | 100 mg/l |
| Polyethylene glycol (PEG): | 0.10 g/l |
| [Conditions for Electroless Plating] | |
| 40 minutes at a bath temperature of | 30° C. |
| [Electrolytic Plating Liquid] | |
| Sulfuric acid: | 2.24 mol/l |
| Copper sulfate: | 0.26 mol/l |
| Additive (KAPAPACID HL, made by Atotech Japan K.K.): | 19.5 ml/l |

| [Conditions for Electrolytic Plating] | |
| --- | --- |
| Current density: | 1 A/dm² |
| Time: | 65 minutes |
| Temperature: | 22 ± 2° C. |

Figure 19:
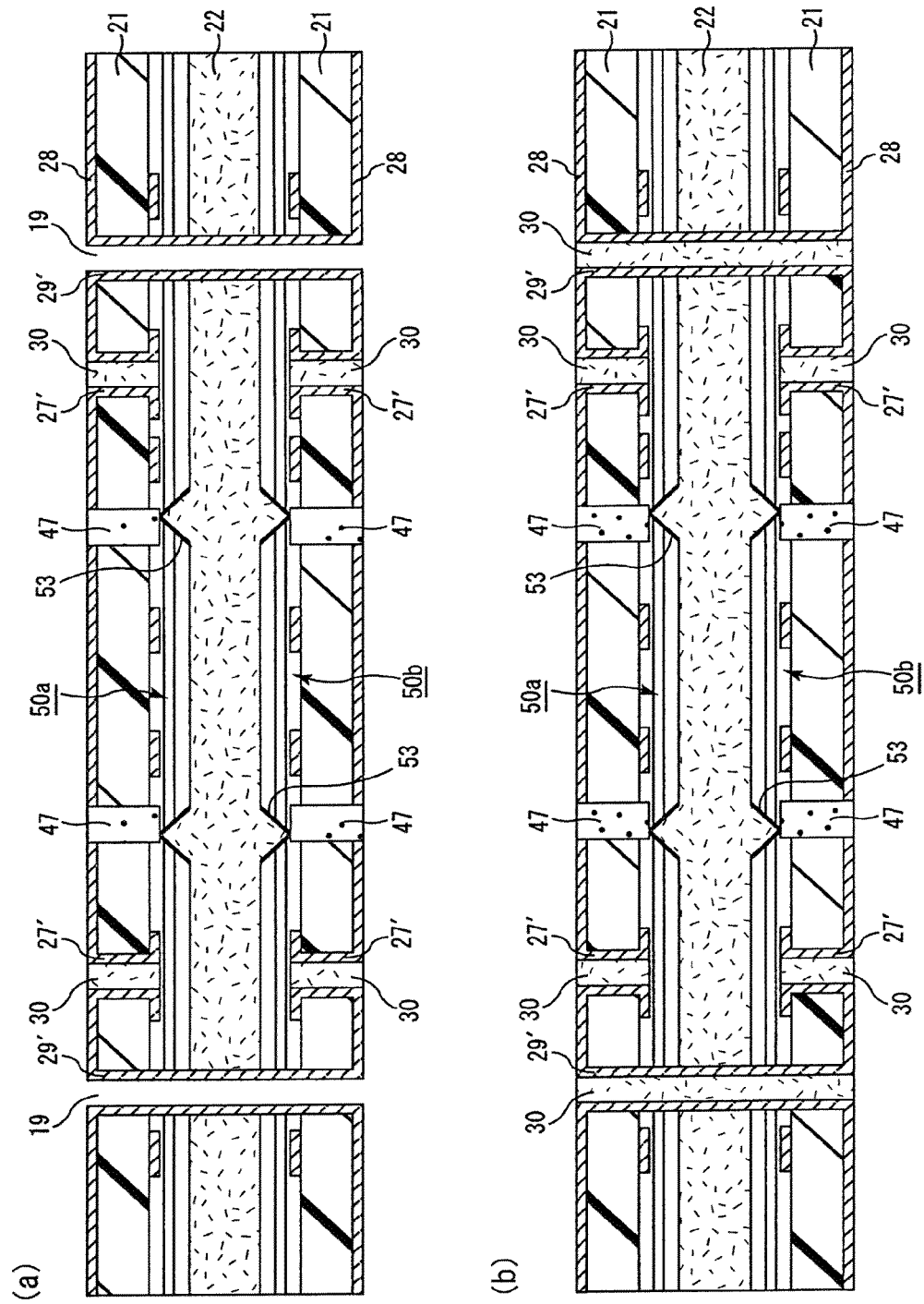
FIG. 19 is a cross section view for schematically illustrating part of a method for manufacturing a multilayer printed circuit board according to the present invention.
Figure 20:
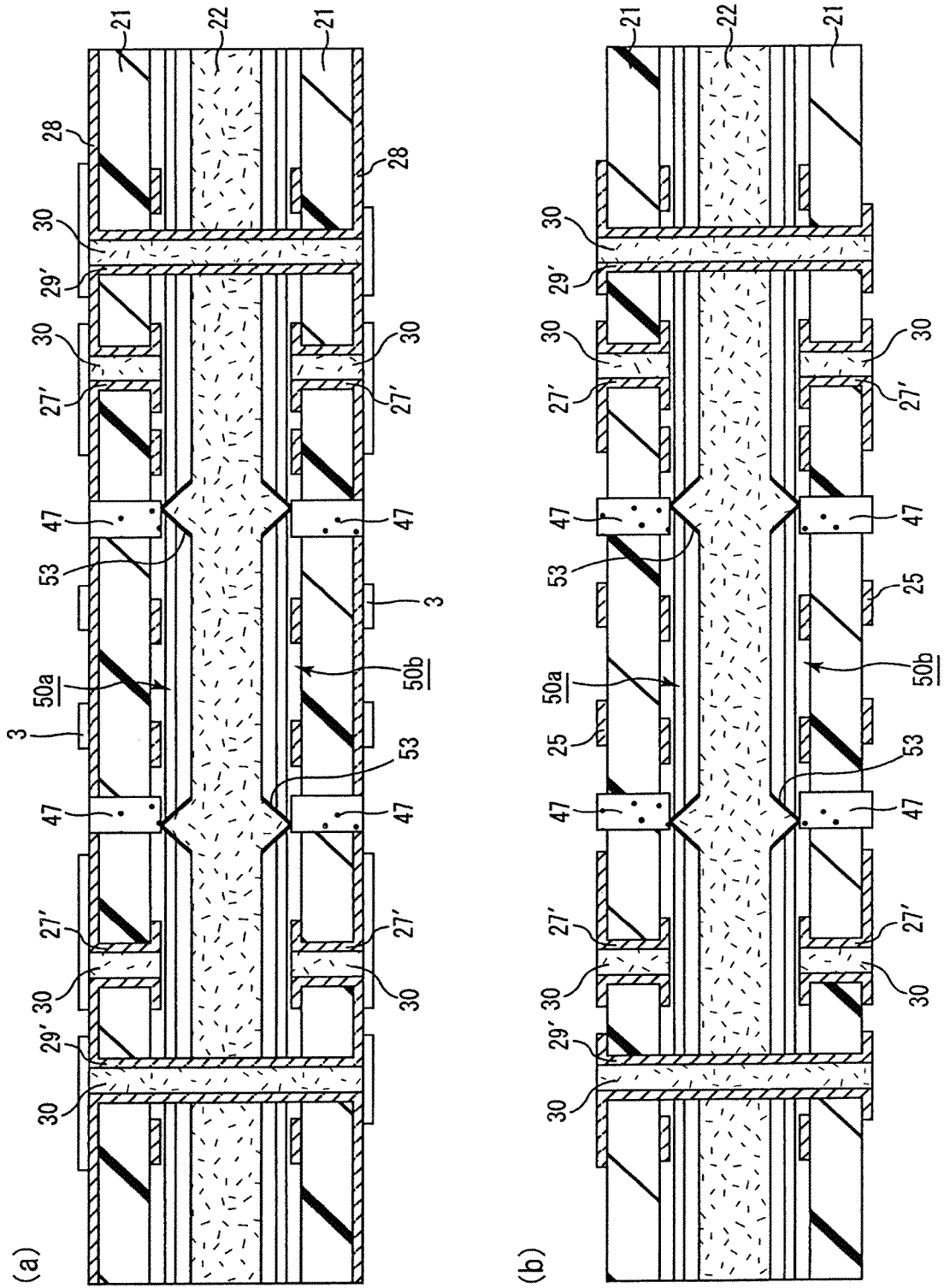
FIG. 20 is a cross section view for schematically illustrating part of a method for manufacturing a multilayer printed circuit board according to the present invention.

(8) Next, through holes 19 where conductor layers 29' were formed on the wall surface were filled in with a resin composite 30 (see FIG. 19(b)), an etching resist was formed on the conductor layers on the surface of the multilayer board (surface conductor layers 28 formed on circuit boards A) (see FIG. 20 (a)), and after that, an etching process was carried out, and thereby, conductor circuits 25 were formed in the outermost layers (see FIG. 20(b)).

(9) Next, layers of a solder resist composite were formed in the outermost layers.

As the above described solder resist composite, 46.67 g of an oligomer (molecular weight: 4000) which was made photosensitive by converting 50% of the epoxy groups in a cresol novolac type epoxy resin (made by Nippon Kayaku Co., Ltd.) of which 60% by weight was dissolved in DMDG, 15.0 g of a bisphenol A-type epoxy resin (Epikoat 1001, made by Yuka Shell Co., Ltd.) of which 80% was dissolved in methyl ethyl ketone, 1.6 g of an imidazole curing agent (trade name: 2E4MZ-CN, made by Shikoku Corp.), 3 g of a polyvalent acrylic monomer (trade name: R604, made by Nippon Kayaku Co., Ltd.), which is a photosensitive monomer, 1.5 g of another type of polyvalent acrylic monomer (trade name: DPE6A, made by Kyoeisha Chemical Co., LTD.), and 0.71 g of a dispersion antiformer (trade name: S-65, made by San Nopco Co., Ltd.) were mixed, and this mixture, to which 2 g of benzophenone (made by Kanto Chemical Co., Inc.) was added as a photo polymerization initiator and 0.2 g of a Michler' s ketone (made by Kanto Chemical Co., Inc.) was added as a photosensitizer so that the viscosity became 2.0 Pa·s at 25° C., was used.

Here, the viscosity was measured using a B type viscometer (type DVL-B, made by Tokyo Keiki Co., Ltd.), with a rotor No. 4 in the case of 60 rpm and a rotor No. 3 in the case of 6 rpm.

(10) Next, a photomask having a thickness of 5 mm where a pattern for openings for forming solder bumps was drawn was made to make contact with a layer of the transparent solder resist composite, this was exposed to ultraviolet rays of 1000 mJ/cm², a developing process was carried out in a DMTG solution, and thus, openings for forming solder bumps 98 were formed.

Furthermore, heating processes were carried out under the respective conditions of 1 hour at 80° C., 1 hour at 100° C., 1 hour at 120° C. and 3 hours at 150° C., so that the layers of the solder resist composite were cured, and thus, solder resist layers 34 having openings for forming solder bumps 43 were formed (see FIG. 21(a)).

(11) Next, the substrate on which solder resist layers 34 were formed was immersed for 20 minutes in an electroless nickel plating liquid of pH=4.5 containing nickel chloride ($2.3 \times 10^{-1}$ mol/l), sodium hypophosphite ($2.8 \times 10^{-1}$ mol/l) and sodium citrate ($1.6 \times 10^{-1}$ mol/l), and thereby, nickel plating layers having a thickness of 5 μm were formed in the opening for forming solder bumps 48. Furthermore, this substrate was immersed for 7.5 minutes under conditions of 80° C. in an electroless gold plating liquid containing potassium gold cyanide ($7.6 \times 10^{-3}$ mol/l), ammonium chloride ($1.9 \times 10^{-1}$ mol/l), sodium citrate ($1.2 \times 10^{-1}$ mol/l) and sodium hypophosphite ($1.7 \times 10^{-1}$ mol/l), and thereby, a gold plating layer having a thickness of 0.03 μm was formed on the nickel plating layer, and thus, solder pads 36 were provided.

(12) Next, micro lenses 49 were provided on the solder resist layers 34 in locations corresponding to end portions of optical signal transmitting regions 42 in accordance with the following method using an inkjet apparatus. That is to say, a UV curing epoxy based resin (transmittance: 91%/mm, index of refraction: 1.53) was adjusted so as to have a viscosity of 20 cps at room temperature (25° C.), then, this resin was adjusted within the resin container of an inkjet apparatus, so that the viscosity became 8 cps at a temperature of 40° C., and after that, this resin was applied on the upper clads in predetermined locations and cured using UV rays, and thereby, convex lenses having a diameter of 220 µm were provided.

Here, the degree of sagging of the micro lenses was such that the micro lenses could be formed so as to have a form which allows transmission light to be converted to collimated light on the side facing a package substrate on which a light receiving element was mounted in the post-process, and the micro lenses could be formed so as to have a form which allows the focal point of transmission light to coincide with the core of the optical waveguide on the side facing a package substrate on which a light emitting element was mounted.

Figure 21:
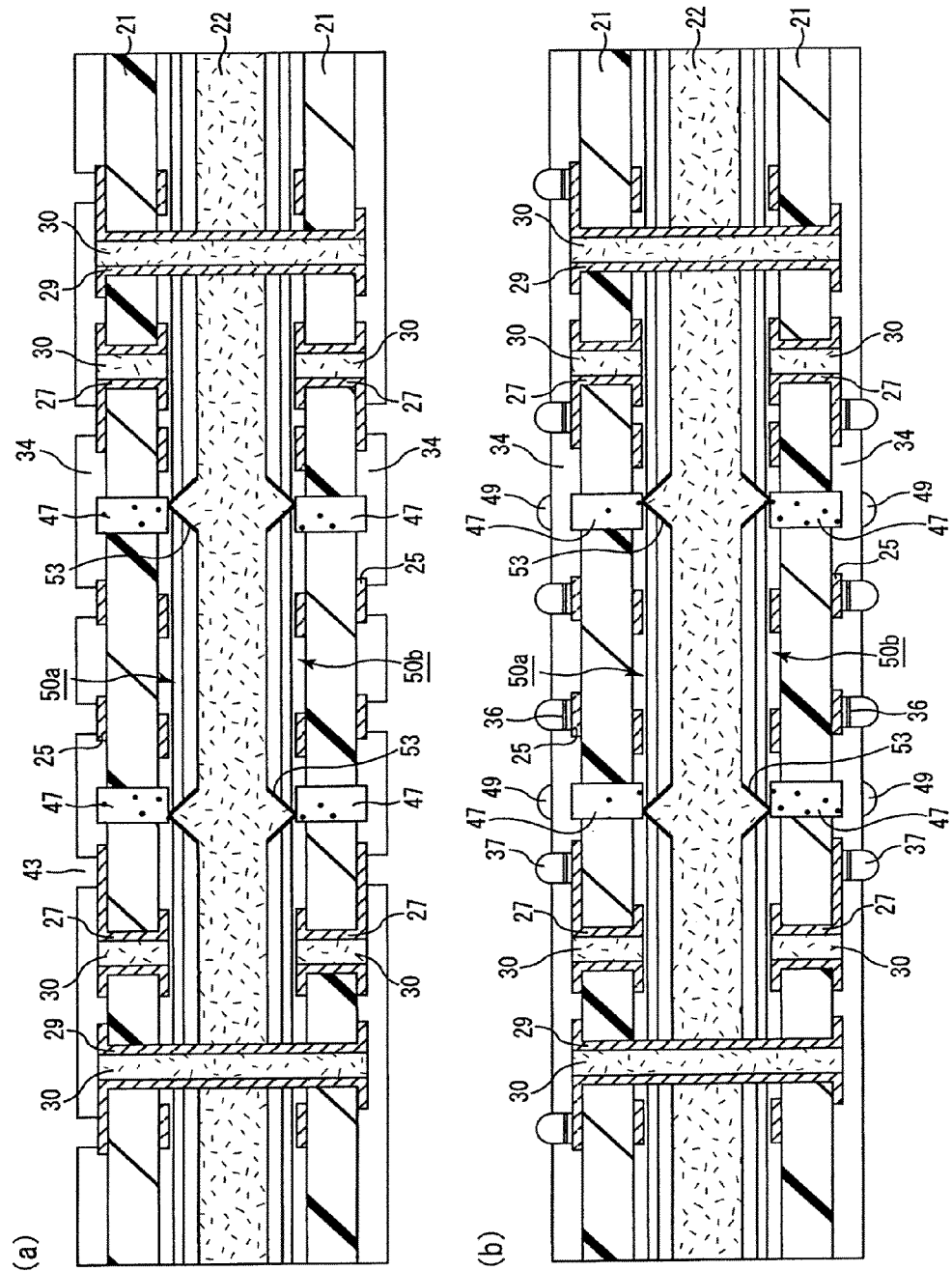
FIG. 21 is a cross section view for schematically illustrating part of a method for manufacturing a multilayer printed circuit board according to the present invention.

(13) Next, a solder paste (Sn/Ag=96.5/3.5) was printed in openings for forming solder bumps 43 (including openings for mounting optical parts), and thus, solder bumps 37 were formed (see FIG. 21 (b)). Next, package substrates on which a PD was mounted as a light receiving element 38 and package substrates on which a VCSEL was mounted as a light emitting element 39 were mounted by interposing the solder bumps, and thus, a multilayer printed circuit board was provided (see FIG. 1).

Here, as the package substrates, substrates where conductor circuits 1725 and insulating layers 1722 were formed and layered on a substrate 1721, and an optical signal transmitting region 1742 having a collective through hole structure was formed (see FIG. 15), and furthermore, a micro lens was provided in an end portion of the optical signal transmitting region on the multilayer printed circuit board side were used.

Example 2

1. Manufacture of Circuit Board B (1) A copper-clad multilayer board, where a copper foil having a thickness of 18 µm was laminated and a surface conductor layer 28 was formed on the two surfaces of an insulating substrate 21 comprising a glass epoxy resin or a BT (bismaleimide triazine) having a thickness of 0.8 mm, was used as a starting material (see FIG. 22(a)). First, holes were drilled in this copper-clad multilayer board, an electroless plating process was carried out so that conductor layers 27' were formed, furthermore, the holes were filled in with a resin composite 30, and the conductor layers were etched so as to have a pattern, and thereby, conductor circuits 25 were formed on the two surfaces of substrate 21, and at the same time, non-penetrating via holes 27 were formed (see FIGS. 22(b) to 22(d)).

(2) Next, a resin film for an insulating layer, which was slightly greater than the substrate, was disposed on the substrate and temporarily pasted through pressure under the conditions where the pressure was 0.4 MPa, the temperature was 80° C. and the time for pressure application was 10 seconds, and then was cut, and after that, pasted in accordance with the following method using a vacuum laminating apparatus, and thereby, an insulating layer was formed.

That is to say, the resin film for an insulating layer was permanently pasted to the substrate through pressure under the conditions where the degree of vacuum was 65 Pa, the pressure was 0.4 MPa, the temperature was 80° C. and the time was 60 seconds, and after that, was thermally cured for 30 minutes at 170° C.

Here, the resin film for an insulating layer was manufactured in such a manner where 30 parts by weight of a bisphenol A-type epoxy resin (Epicoat 1001, made by Yuka Shell Epoxy K.K., epoxy equivalent: 469), 40 parts by weight of a cresol novolac type epoxy resin (Epiclon N-673, made by Dainippon Ink & Chemicals, Inc., epoxy equivalent: 215) and 30 parts by weight of phenol novolac resin containing a triazine structure (Phenolite KA-7052, made by Dainippon Ink & Chemicals, Inc., phenolic hydroxyl group equivalent: 120) were dissolved in 20 parts by weight of ethyl diglycol acetate and 20 parts by weight of solvent naphtha while being stirred and heated, to which 15 parts by weight of polybutadiene rubber, of which the terminals were converted to epoxy (Denalex R-45EPT, made by Nagase Kasei Kogyo K.K.), 1.5 parts by weight of crushed pieces of 2-phenyl-4,5-bis (hydroxymethyl) imidazole, 2 parts by weight of finely crushed silica and 0.5 parts by weight of a silicone based antifoaming agent were added so that an epoxy resin composite was prepared, and after that, the gained epoxy resin composite was applied on a PET film having a thickness of 38 µm using a roll coater so that the thickness after drying became 50 µm, and then was dried for 10 minutes at 80° C. to 120° C.

Figure 22:
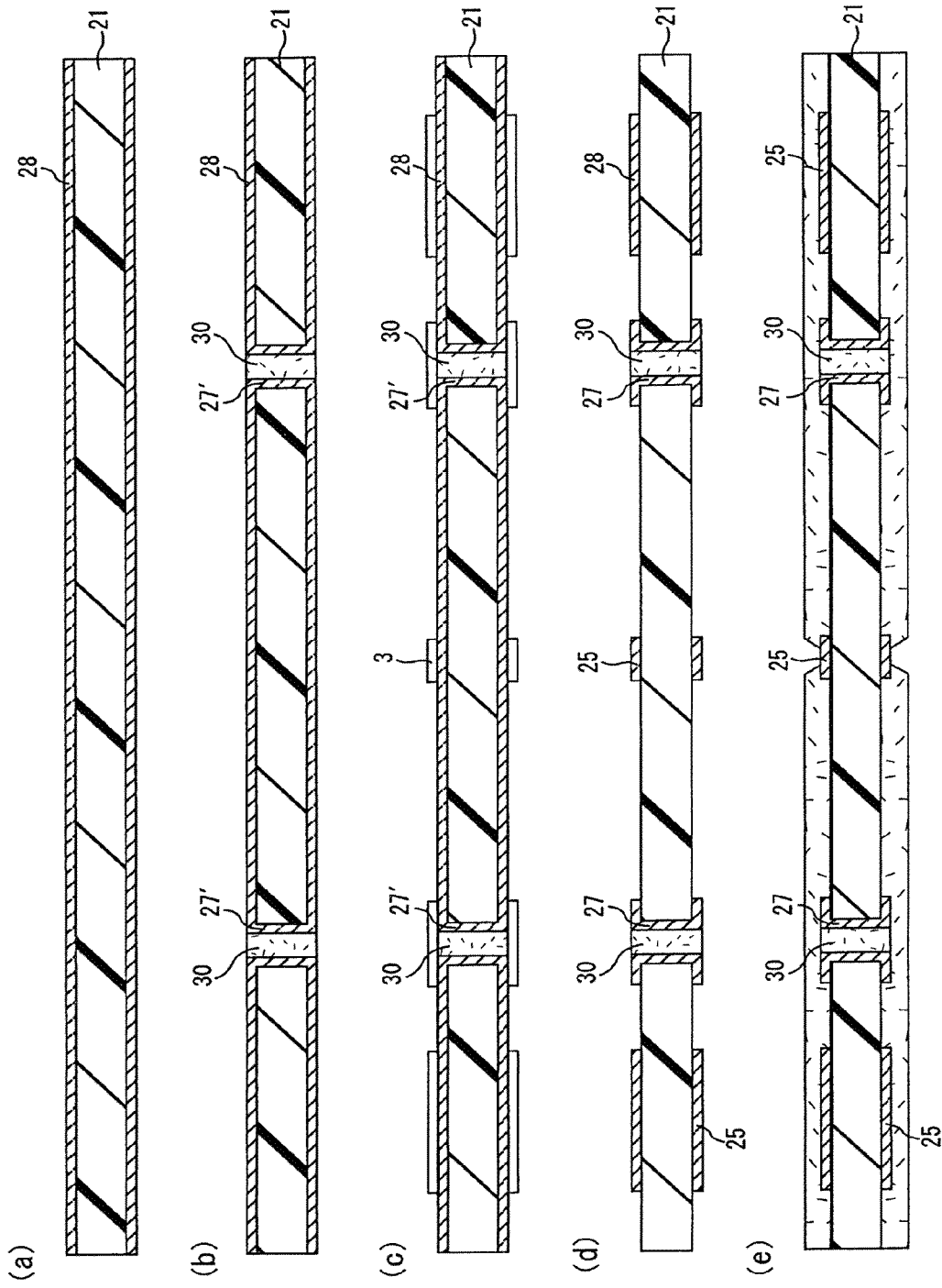
FIG. 22 is a cross section view for schematically illustrating part of a method for manufacturing a multilayer printed circuit board according to the present invention.

(3) Next, a mask was disposed on an insulating layer, and openings for via holes were formed in insulating layers 22 using a $CO_2$ gas laser having a wavelength of 10.4 µm in one shot under the conditions where the diameter of the beam was 4.0 mm, a top-hat mode was used, the pulse width was 8.0 microseconds and the diameter of the through holes of the mask was 1.0 mm (see FIG. 22(e)).

(4) Next, the surfaces, including the inner wall surfaces of the openings for via holes, were coarsened, and after that, conductor circuits were formed on the surfaces of the insulating layers, and non-penetrating via holes were formed. In addition, in this process, optical signal transmitting regions which penetrate through the insulating substrate and the insulating layers were formed at the same time.

That is to say, first, a palladium catalyst was attached to the surfaces (including the inner wall surfaces of the openings for via holes) of insulating layers 22, and after that, thin film conductor layers were formed of an electroless copper plating film by immersing the substrate in an electroless copper plating solution, and after that, an electrolytic copper plating film was formed on the above described thin film conductor layers (in the figures, the thin film conductor layers and the electrolytic copper plating film are together denoted as 33).

Here, the electroless plating process and the electrolytic plating process were carried out under the same conditions as in process (7) in Example 1.

Next, optical signal transmitting regions 42 which were filled in with a resin composite 47 were formed in accordance with the same method as in processes (2) and (3) of Example 1.

Figure 23:
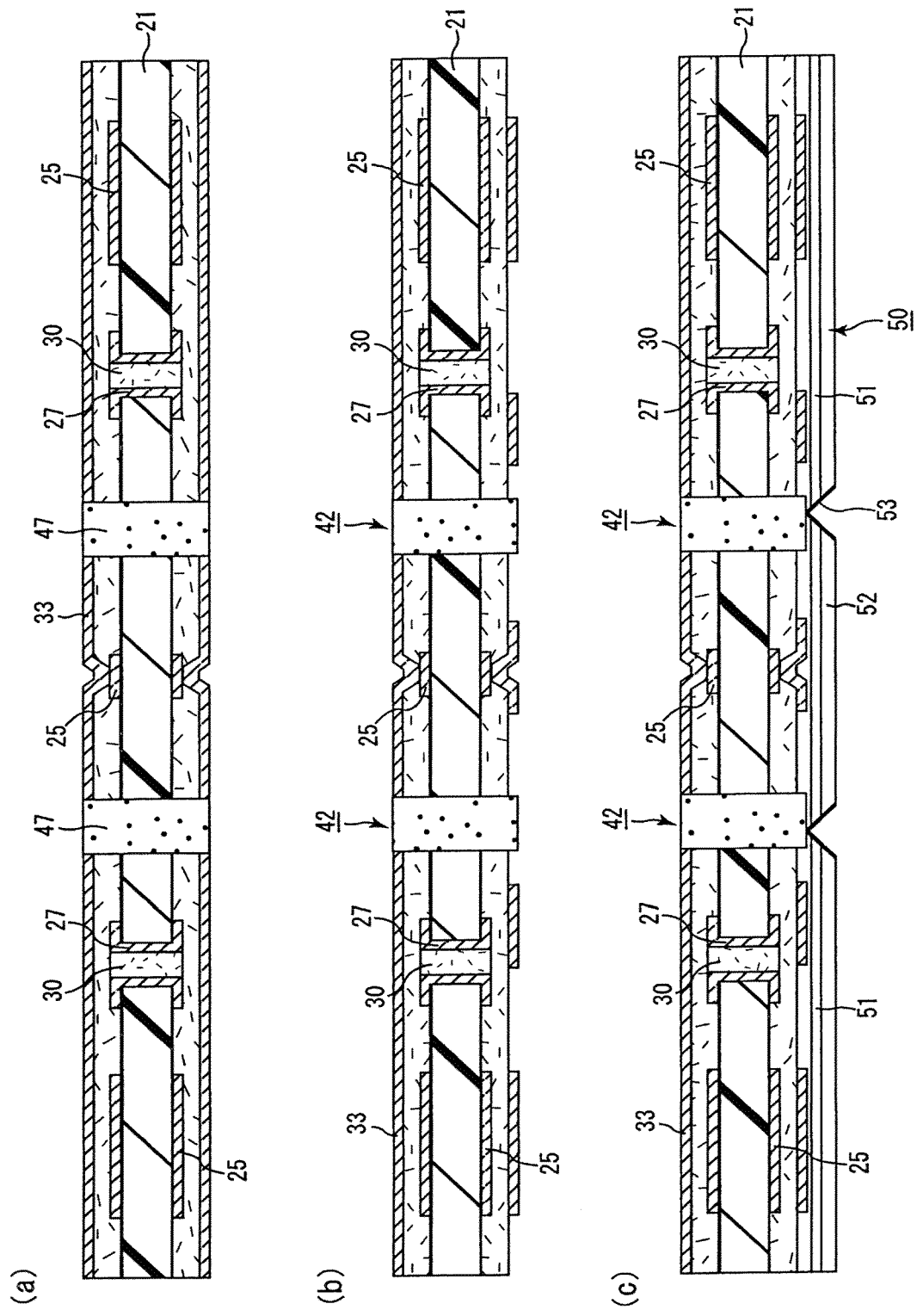
FIG. 23 is a cross section view for schematically illustrating part of a method for manufacturing a multilayer printed circuit board according to the present invention.

After that, conductor circuits 25 were formed on the surface of one side of the circuit board in accordance with the same method as in process (4) of Example 1 (see FIGS. 23(a) and 23(b)).

(5) Next, an optical waveguide 50 was formed and layered on the side where the conductor circuits were formed in the above described process (4) in accordance with the same method as in process (5) of Example 1 (see FIG. 23(c)).

A circuit board B was manufactured through the processes as described above.

2. Manufacture of Multilayer Printed Circuit Board (6) A multilayer printed circuit board was manufactured in the same manner as in processes (6) to (12) of Example 1, except that a circuit board B was used instead of a circuit board A (see FIG. 2).

Example 3

A multilayer printed circuit board was manufactured in the same manner as in Example 2, except that the configuration of the optical waveguides and the package substrates was changed (see FIG. 3).

In the present example, either a package substrate on which a light receiving is mounted or a package substrate on which a light emitting element is mounted was mounted on each surface of a multilayer printed circuit board, and furthermore, the locations in which optical path conversion mirrors are formed were adjusted during signal transmission via optical waveguides, so that end portions of the optical waveguides exposed from the sides of the multilayer printed circuit board and optical elements mounted on the package substrates were optically connected.

In the multilayer printed circuit board according to the present example, signal transmission between substrates can be carried out through optical signals.

Example 4

1. Manufacture of Circuit Board C (1) A circuit board was manufactured in accordance with a method which is approximately the same as that for manufacturing a circuit board B of Example 2. Here, optical waveguides were not formed throughout the entirety of the outermost layers, but only in portions in the outermost layers. In addition, the optical waveguides were not formed directly on the circuit board, but optical waveguide films were separately manufactured in accordance with the following method and pasted in predetermined locations using an adhesive (Optodyne UV-1000, made by Daikin Industries, Ltd.).

Specifically, first, a clad and a core were formed and layered on a glass substrate in accordance with the same method as in process (5) of Example 1, and furthermore, optical path conversion mirrors were formed, and finally, the glass substrate was removed using a solution of 3% hydrofluoric acid, and thereby, an optical waveguide film was manufactured.

Next, the above described adhesive was applied in predetermined locations on the circuit board, and an optical waveguide film was sucked against and secured to the head of a flip chip mounting machine with high precision and positioned by using an alignment mark that was formed on the optical waveguide film in advance and an alignment mark that was formed on the circuit board in advance, so that the optical waveguide film was pressed against the adhesive while remaining parallel to the circuit board, and then, the adhesive was temporarily cured using a high pressure mercury lamp (10 J/cm$^2$), and furthermore, permanently cured using an oven under conditions of 60° C. for 1 hour, and thereby, the optical waveguide was attached.

Here, the optical waveguide film may be pasted after positioning on the basis of the alignment mark by using an optical alignment apparatus, or the optical waveguide film may be pasted after light enters or is emitted from both ends of the optical waveguide film, so that the optical axes of the optical signal transmitting region and the optical path conversion mirrors coincided, by using an optical alignment apparatus.

2. Manufacture of Circuit Board D (2) A circuit board was manufactured in accordance with a method which is approximately the same as that for manufacturing the above described circuit board C. Here, one extra insulating layer and one extra conductor circuit layer were layered on each surface of the substrate.

3. Manufacture of Multilayer Printed Circuit Board (3) Next, one piece of the above described circuit board C and one piece of the above described circuit board D, and one glass unwoven prepreg made of epoxy having a thickness of 80 µm (AS-5000GP, made by Hitachi Chemical Co., Ltd.), were prepared, and each of the circuit boards D and E were layered on the two sides of this prepreg while being positioned in accordance with a pin lamination method, so that optical waveguides 50 were located inside, and after that, the layers were pressed under such conditions that the pressure was 30 kg/cm$^2$, the time for pressing was 45 minutes at a temperature of 180° C. or more, and the total time for pressing was 150 minutes (see FIG. 18(a)).

(4) Next, the process up to the provision of micro lenses was carried out in the same manner as in processes (7) to (12) of Example 1. Here, the micro lenses were formed only in end portions of the optical signal transmitting regions facing the package substrates in the later processes.

(5) Next, optical waveguide films were separately formed in accordance with the following method, and these optical waveguide films were adhered on the solder resist layers in the outermost layers by using an adhesive (Optodyne UV-1000, made by Daikin Industries Ltd.).

The above described optical waveguide films were manufactured by forming a clad and a core on a glass substrate through layering in accordance with the same method as in process (5) of Example 1, further forming optical path conversion mirrors, and finally, peeling off the glass substrate in a solution of 3% hydrofluoric acid. In addition, the optical waveguides were pasted in accordance with the same method as in the above described process (1).

(6) After that, the same processes as in Example (13) were carried out, and thereby, a multilayer printed circuit board on which package substrates were mounted was provided (see FIG. 4).

Example 5

1. Manufacture of Circuit Board E (1) A circuit board was manufactured in accordance with a method which is approximately the same as that for the manufacture of circuit board B of Example 2. Here, in the present example, the number and the locations in which optical signal transmitting regions were formed, and the locations in which optical path conversion mirrors were formed, were adjusted in order to manufacture a multilayer printed circuit board for carrying out signal transmission between substrates through optical signals.

2. Manufacture of Circuit Board F (2) A circuit board was manufactured in the same manner as in the circuit board B of Example 2, except that optical signal transmitting regions and optical waveguides were not formed, and an etching process was carried out on the surface conductor layers on both surfaces so as to form conductor circuits in the two outermost layers.

3. Manufacture of Multilayer Printed Circuit Board (3) Next, two pieces of the above described circuit boards E, one piece of the above described circuit board F, and two high Tg prepregs made of epoxy having a thickness of 80 µm (MCL-E-679, made by Hitachi Chemical Co., Ltd.) were prepared, and the circuit boards E were layered and positioned on both sides of the circuit board F, which was at the center, by interposing prepregs in accordance with a pin lamination method, so that optical waveguides 50 were located inside, and after that, the layers were pressed under such conditions that the pressure was 30 kg/cm², the time for pressing at a temperature of 180° C. or more was 45 minutes, and the total time for pressing was 150 minutes. Here, guide holes (not shown) were formed in advance in the circuit board.

(4) After that, a multilayer printed circuit board was manufactured in the same manner as in (7) to (12) of Example 1 (see FIG. 6).

Example 6

1. Manufacture of Circuit Board G (1) A copper-clad multilayer board, where a copper foil having a thickness of 18 μm was laminated and a surface conductor layer 28 was formed on the two surfaces of an insulating substrate 21 comprising a glass epoxy resin or a BT (bismaleimide triazine) having a thickness of 0.8 mm, was used as a starting material (see FIG. 24(a)). First, holes were drilled in this copper-clad multilayer board, and electroless plating films 27' were formed on the wall surface of the holes, and furthermore, the holes 9 were filled in with a resin composite 30 (see FIGS. 24(b) and 24(c)).

Here, the same resin composite as that used in process (1) of Example 1 was used.

Figure 24:
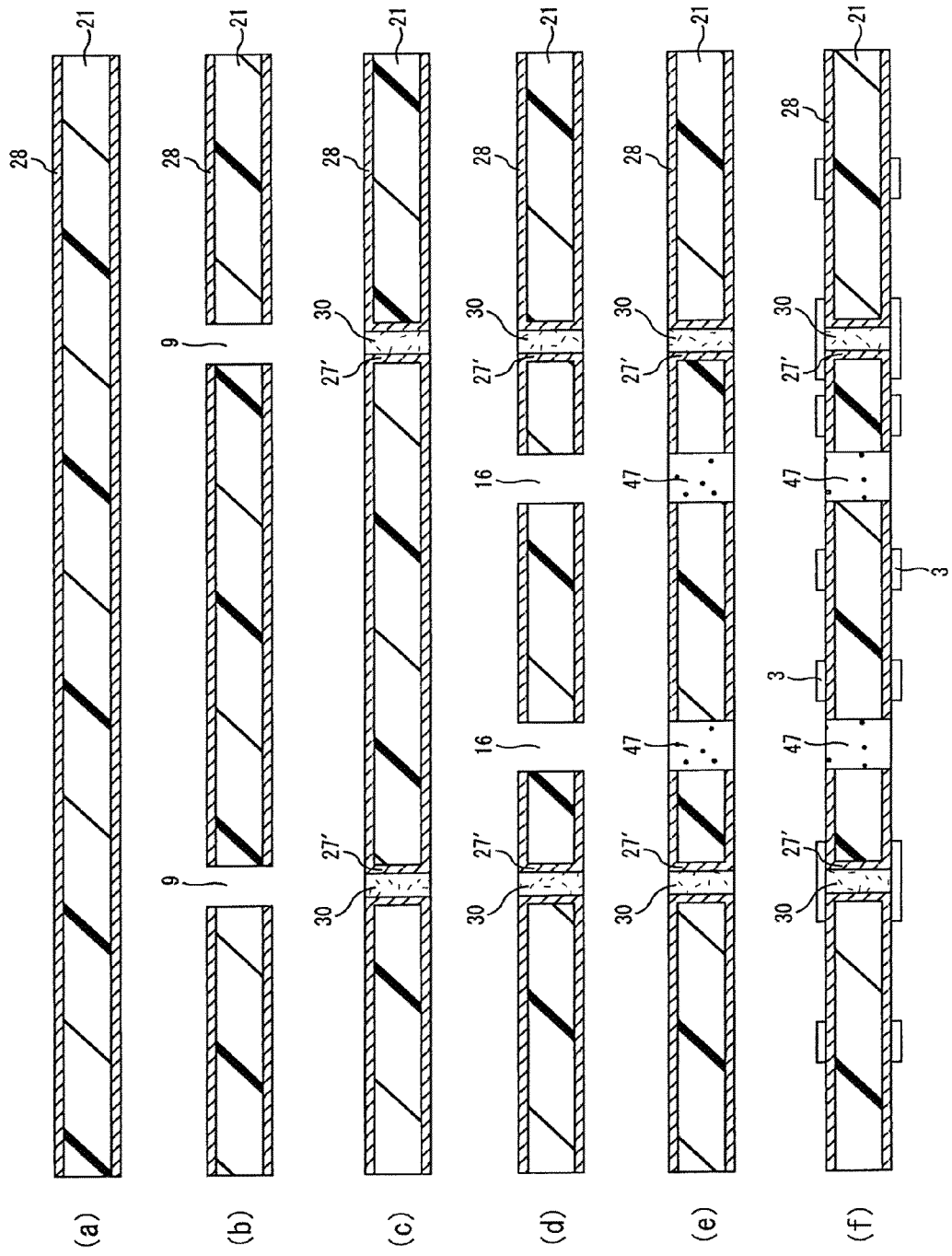
FIG. 24 is a cross section view for schematically illustrating part of a method for manufacturing a multilayer printed circuit board according to the present invention.

(2) Next, through holes for an optical path 16 which penetrate through a substrate 21, insulating layers 22 and surface conductor layers 28 were formed through router processing, and furthermore, a desmearing process was carried out on the wall surface of through holes for an optical path 16 (see FIG. 24(d)). Here, through holes for an optical path 16 having a collective through hole structure of which the cross section is larger than that of other through holes for an optical path were formed.

(3) Next, a resin was disposed on a mask for filling holes of a printing apparatus and screen printing was carried out, and thereby, through holes for an optical path 16 were filled in with a resin composite, and then, a curing process was carried out under conditions of 1 hour at 120° C. and 1 hour at 150° C., and after that, the resin which protruded from through holes for an optical path 16 was ground with abrasive paper #3000, and furthermore, the surface was flattened through polishing with alumina particles having a diameter of 0.05 μm. Here, a polishing process was carried out, so that the end portions of the optical signal transmitting regions made of a resin composite 47 and surface conductor layers 28 were of the same plane (see FIG. 24(e)).

In this process, the same resin composite as that used in process (3) of Example 1 was used.

Figure 25:
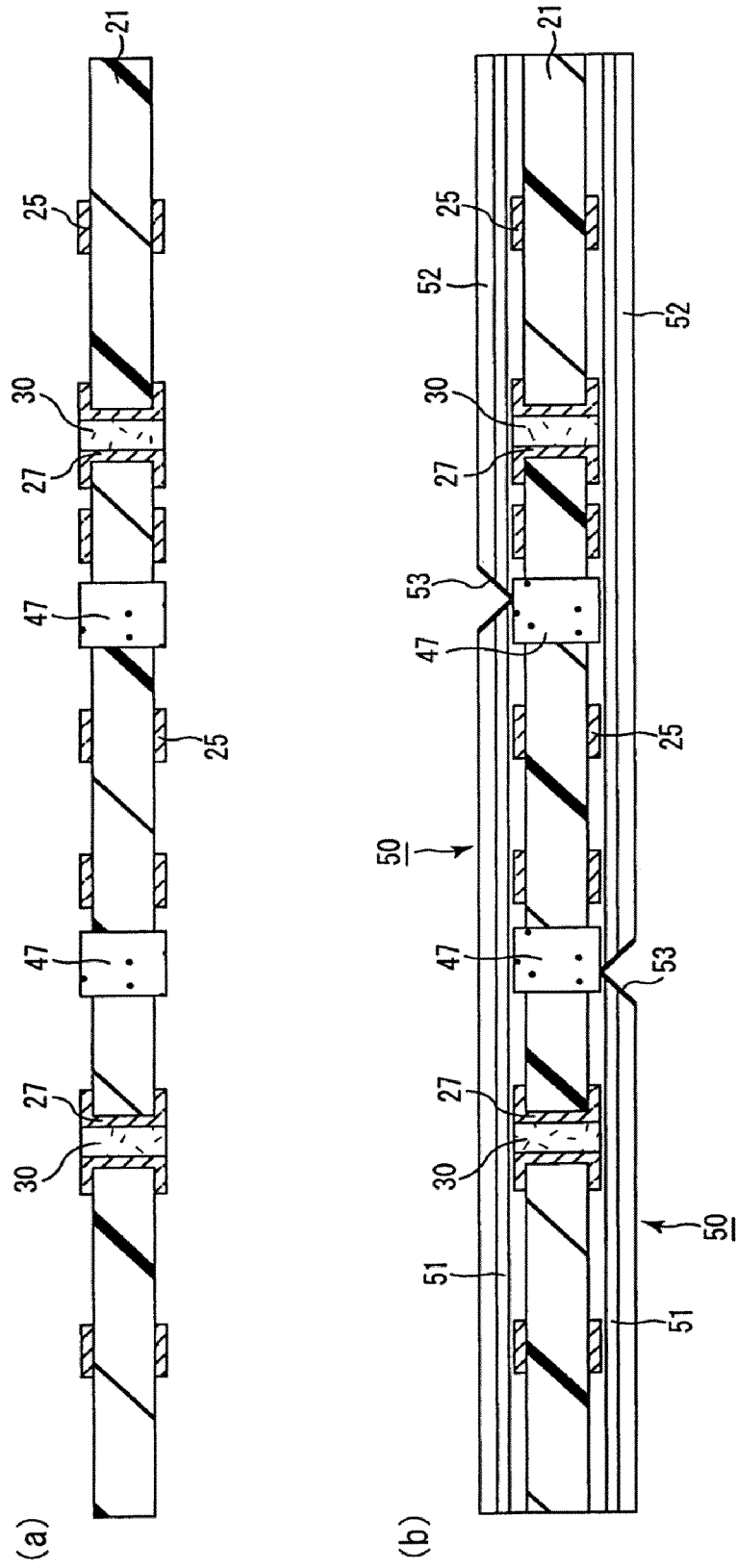
FIG. 25 is a cross section view for schematically illustrating part of a method for manufacturing a multilayer printed circuit board according to the present invention.

(4) Next, an etching resist 3 was formed on surface conductor layers 28 (see FIG. 24(f)) and an etching process was carried out, and thereby, conductor circuits 25 were formed on the two surfaces of the substrate (see FIG. 25(a)).

(5) Next, optical waveguides 50 were formed on the two surfaces of the substrate on which conductor circuits 25 were formed, in accordance with the same method as in process (5) of Example 1 (see FIG. 25(b)).

A circuit board G was manufactured through these processes.

2. Manufacture of Circuit Board H (6) A copper-clad multilayer board, where a copper foil having a thickness of 18 μm was laminated and a surface conductor layer was formed on the two surfaces of an insulating substrate comprising a glass epoxy resin or a BT (bismaleimide triazine) having a thickness of 0.8 mm, was used as a starting material, and first, holes were drilled in this copper-clad multilayer board, and electroless plating films were formed on the wall surface of the holes, and furthermore, the holes were filled in with a resin composite.

Here, the same resin composite as that used in process (1) of Example 1 was used.

(7) Next, an etching resist was formed on the surface conductor layer on one side and an etching process was carried out, and thereby, conductor circuits were formed on one surface of the substrate.

A circuit board H was manufactured through these processes.

3. Manufacture of Multilayer Printed Circuit Board (8) Next, two pieces of the above described circuit boards H, one piece of the above described circuit board G and two adhesive insulating films A having a thickness of 80 μm and manufactured in accordance with the following method were prepared, and the circuit boards H were layered and positioned on the two sides of the circuit board G, which was at the center, by interposing prepregs in accordance with a pin lamination method, and after that, the layers were pressed under such conditions that the pressure was 30 kg/cm², the time for pressing at a temperature of 180° C. or more was 45 minutes and the total time for pressing was 150 minutes. Here, guide holes (not shown) were formed in advance in the circuit boards.

The adhesive insulating films A were manufactured by stirring with three rollers a mixture of 40 parts by weight of a bisphenol A-type epoxy resin (E-1001, made by Yuka Shell Epoxy K.K.), 60 parts by weight of a phenol novolac type epoxy resin (E-154, made by Yuka Shell Epoxy K.K.), 5 parts by weight of an imidazole type curing agent (2PHZ, made by Shikoku Corp.) and 75 parts by weight of butyl cellosolve acetate to which 30 parts by weight of SiO₂ particles in spherical form having a particle diameter of 0.4 to 0.6 μm (SO-E2, made by Admatec GmbH) was added.

After that, this resin composite was applied to the substrate using a spin coater and temporarily cured through irradiation with UV rays, whereby an adhesive insulating film was manufactured. Here, the adhesive insulating film had an index of refraction of 1.58 and a transmittance for light having a wavelength of 850 nm of 97%/37 μm.

(9) After that, a multilayer printed circuit board was manufactured in the same manner as in (7) to (12) of Example 1 (see FIG. 7).

Example 7

1. Manufacture of Optical Waveguide Film (1) An optical waveguide film was manufactured in accordance with the same method as in process (5) of Example 4, and this optical waveguide film was peeled from the glass substrate, and after that, optical path conversion mirrors were formed in predetermined locations.

2. Manufacture of Multilayer Printed Circuit Board (2) Next, one optical waveguide film manufactured in the above described (1), two circuit boards H manufactured in Example 6 and two adhesive insulating films A having a thickness of 80 μm (see Example 6) were prepared, and the circuit boards H were layered and positioned on the two sides of the optical waveguide film, which was at the center, by interposing prepregs in accordance with a pin lamination method, and after that, the layers were pressed under such conditions that the pressure was 30 kg/cm², the time for pressing at a temperature of 180° C. or more was 45 minutes and the total time for pressing was 150 minutes. Here, guide holes (not shown) were formed in advance in the circuit boards and the optical waveguide film.

(3) After that, a multilayer printed circuit board was manufactured in the same manner as in (7) to (12) of Example 1 (see FIG. 8).

Example 8

1. Manufacture of Multilayer Printed Circuit Board (1) Two optical waveguide films as that manufactured in Example 7, two circuit boards H as that manufactured in Example 6 and three adhesive insulating films A having a thickness of 80 μm (see Example 6) were prepared, and the two optical waveguide films were layered on top of each other by interposing a prepreg, and furthermore, the circuit boards H were layered and positioned on the two sides of the two layered optical waveguide films, which was at the center, by interposing prepregs in accordance with a pin lamination method, and after that, the layers were pressed under such conditions that the pressure was 30 kg/cm$^2$, the time for pressing at a temperature of 180° C. or more was 45 minutes and the total time for pressing was 150 minutes. Here, guide holes (not shown) were formed in advance in the circuit boards and the optical waveguide films.

(2) After that, a multilayer printed circuit board was manufactured in the same manner as in (7) to (12) of Example 1 (see FIG. 9).

Example 9

A multilayer printed circuit board was manufactured in the same manner as in Example 7, except that the layered optical waveguide film was different.

An optical waveguide film where three clad layers and two core layers were alternately formed and optical path conversion mirrors were formed in predetermined locations was used. Here, the method for manufacturing this was approximately the same as the method used in process (5) of Example 4, but one additional process for layering a core and one additional process for layering a clad were repeated in accordance with this method (see FIG. 10 (*a*)).

Example 10

1. Manufacture of Circuit Board I (1) A copper-clad multilayer board, where a copper foil having a thickness of 18 μm was laminated and a surface conductor layer 28 was formed on the two surfaces of an insulating substrate 21 comprising a glass epoxy resin or a BT (bismaleimide triazine) having a thickness of 0.8 mm, was used as a starting material (see FIG. 26(*a*)). First, holes were drilled in this copper-clad multilayer board and electroless plating films 27' were formed on the wall surface of the holes, and furthermore, the holes 9 were filled in with a resin composite 30 (see FIGS. 26(*b*) and 26(*c*)).

Figure 26:
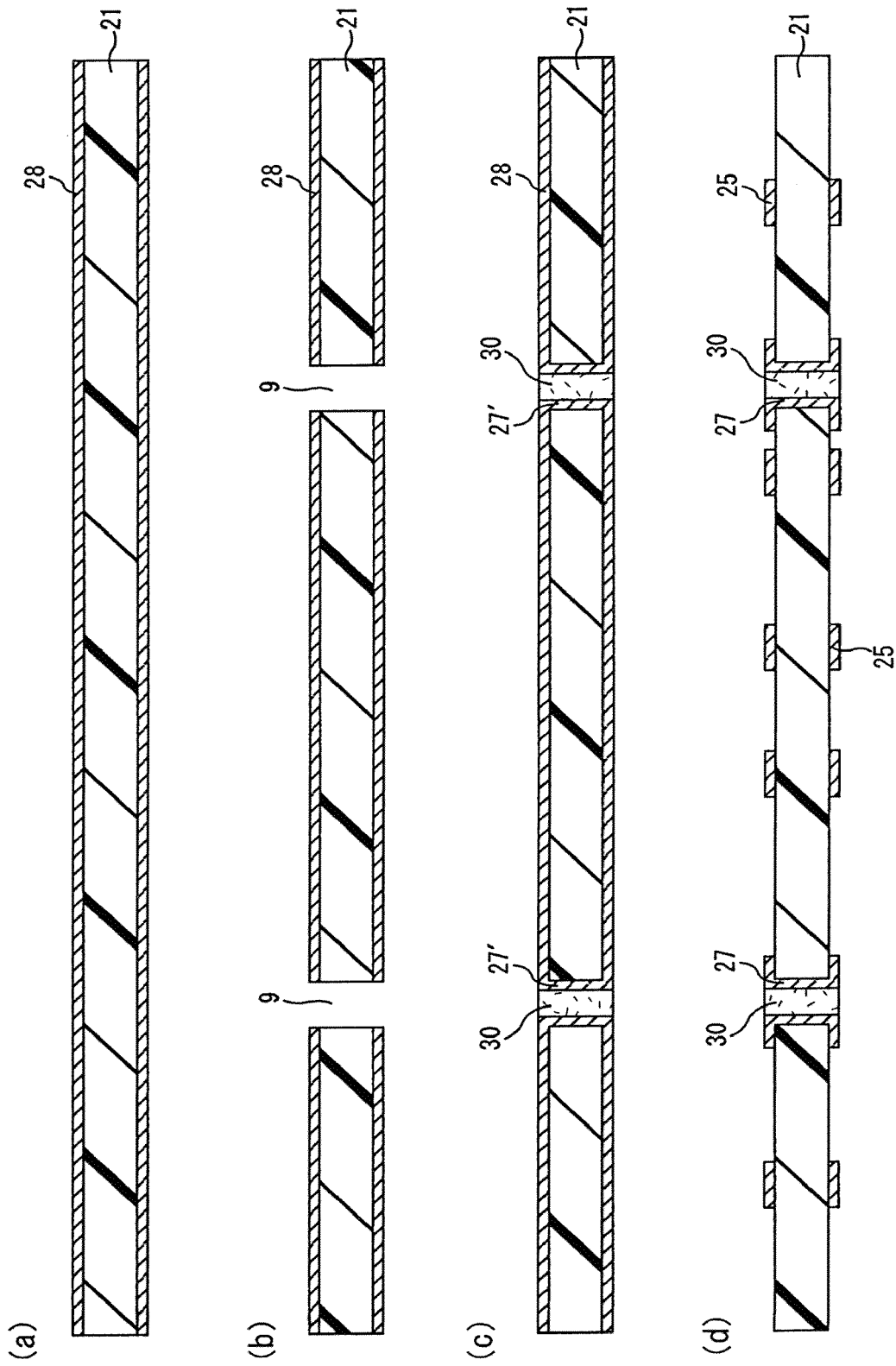
FIG. 26 is a cross section view for schematically illustrating part of a method for manufacturing a multilayer printed circuit board according to the present invention.

(2) Next, an etching resist was formed in portions on surface conductor layers 28 and an etching process was carried out, and thereby, conductor circuits 25 and non-penetrating via holes 27 were formed (see FIG. 26(*d*)).

A circuit board I was completed through these processes.

2. Manufacture of Multilayer Printed Circuit Board (3) Next, one piece of the above described circuit board I, two optical waveguide films as that manufactured in Example 7, two circuit boards H as that manufactured in Example 6 and four glass unwoven prepregs made of epoxy having a thickness of 80 μm (AS-5000GP, made by Hitachi Chemical Co., Ltd.) were prepared, and the optical waveguide films were layered on the two surfaces of circuit board I by interposing prepregs, and circuit boards H were layered and positioned on the two sides of this by interposing prepregs in accordance with a pin lamination method, and after that, the layers were pressed under such conditions that the pressure was 30 kg/cm$^2$, the time for pressing at a temperature of 180° C. or more was 45 minutes and the total time for pressing was 150 minutes. Here, guide holes (not shown) were formed in advance in the circuit boards and the optical waveguide films.

(4) After that, a multilayer printed circuit board was manufactured in the same manner as in (7) to (12) of Example 1 (see FIG. 11).

Example 11

1. Manufacture of Circuit Board K (Six-Layer Board)

(1) Insulating layers were formed on the two surfaces of a substrate where conductor circuits were formed on the two surfaces in the same manner as in processes (1) to (3) of Example 2.

(2) Next, a palladium catalyst was added to the surface of the insulating layers (including the inner wall surface of the openings for via holes), and after that, the substrate was immersed in an electroless copper plating solution, and thus, a thin film conductor layer was formed from an electroless copper plating film, and after that, an electrolytic copper plating film was formed on the above described thin film conductor layer.

Here, the electroless plating process and the electrolytic plating process were each carried out under the same conditions as in process (7) of Example 1.

After that, conductor circuits and non-penetrating via holes were formed on the two surfaces of the circuit board through an etching process in accordance with the same method as in process (4) of Example 1.

(3) Processes (2) and (3) of Example 2 and the process of the above described (2) were repeated, so that insulating layers and conductor circuits were further formed and layered.

In addition, non-penetrating via holes for connecting conductor circuits in the outermost layers were formed at the same time.

A circuit board K, which is a six-layer board, was completed with the configuration described above.

2. Manufacture of Circuit Board K'

(4) A circuit board K' was manufactured in the same manner as in the above described processes (1) to (3), except that conductor circuits were formed only on one surface and the conductor layer on the other surface was left without a pattern in the outermost layers of the circuit board in the above described process (3).

3. Manufacture of Circuit Board L (Eighteen-Layer Board)

(5) One piece of the above described circuit board K, two pieces of the above described circuit boards K' and two adhesive insulating films A having a thickness of 80 μm (see Example 6) were prepared, and the circuit boards K' were layered and positioned on the two sides of the circuit board K, which was at the center, by interposing prepregs in accordance with a pin lamination method, so that the solid conductor layer was located outside, and after that, the layers were pressed under such conditions that the pressure was 30 kg/cm$^2$, the time for pressing at a temperature of 180° C. or more was 45 minutes and the total time for pressing was 150 minutes.

(6) Next, optical signal transmitting regions which penetrated through the entirety of the eighteen-layer board and were filled in with a resin composite were formed in accordance with the same method as in processes (2) and (3) of Example 1.

After that, conductor circuits were formed in the outermost layer on one side of the eighteen-layer board in accordance with the same method as in process (4) of Example 1, and thus, a circuit board L was completed.

Manufacture of Multilayer Printed Circuit Board (7) Next, one optical waveguide film as that manufactured in Example 7, one circuit board H (two-layer board) as that manufactured in Example 6, one piece of the above described circuit board L (eighteen-layer board) and one adhesive insulating film as that used in Example 6 were prepared, and the circuit boards were layered and positioned on both sides of the optical waveguide film, which was at the center, by interposing the adhesive insulating films in accordance with a pin lamination method, so that the solid conductor layer was located on the outside, and after that, the layers were pressed under such conditions that the pressure was 30 kg/cm², the time for pressing at a temperature of 180° C. or more was 45 minutes and the total time for pressing was 150 minutes.

Here, guide holes were formed in advance in the circuit boards and the optical waveguide film.

(3) After that, a multilayer printed circuit board was manufactured in the same manner as in (7) to (12) of Example 1 (see FIG. 12).

Example 12

1. Manufacture of Circuit Board J (1) An insulating substrate 21 comprising a glass epoxy resin or a BT (bismaleimide triazine) resin having a thickness of 0.8 mm was used as a starting material (see FIG. 27(a)), through holes for an optical path 16 were formed in this insulating substrate 21 through router processing (see FIG. 27(b)), and furthermore, a desmearing process was carried out on the wall surface of through holes for an optical path 16.

(2) Next, a resin was disposed on a mask for filling holes of a printing apparatus and screen printing was carried out, and thereby, through holes for an optical path 16 were filled in with a resin composite, and then, a curing process was carried out under conditions of 1 hour at 120° C. and 1 hour at 150° C., and after that, the resin which protruded from through holes for an optical path 16 was ground with abrasive paper #3000, and furthermore, the surface was flattened through polishing with alumina particles having a diameter of 0.05 µm. Here, a polishing process was carried out, so that the end portions of the optical signal transmitting regions made of a resin composite 47 and the surface of insulating substrate 21 were made in the same plane (see FIG. 27(c)).

The same resin composite as that used in process (3) of Example 1 was used in this process.

Figure 27:
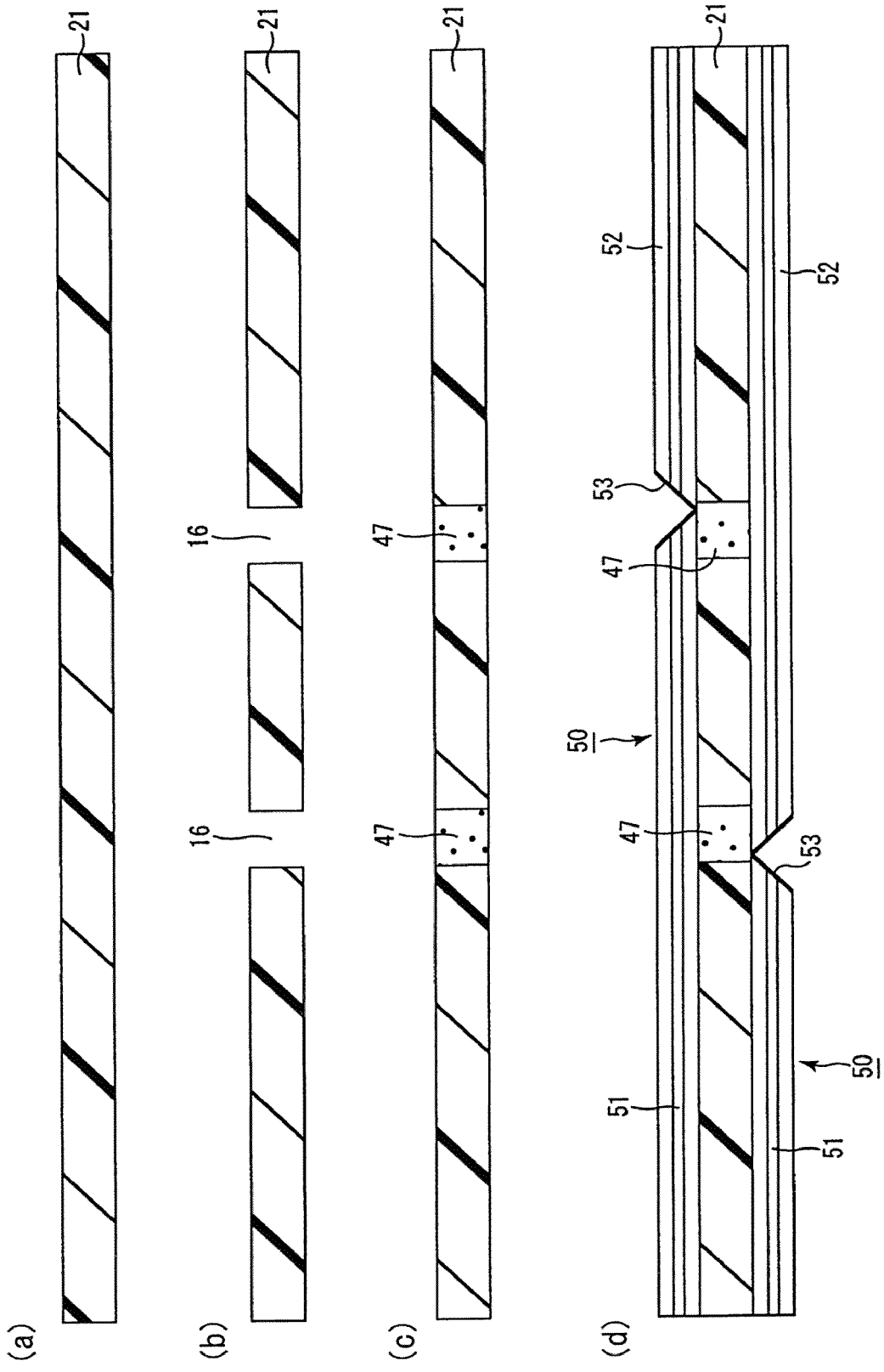
FIG. 27 is a cross section view for schematically illustrating part of a method for manufacturing a multilayer printed circuit board according to the present invention.

(3) Optical waveguides 50 were formed and layered on the two surfaces of an insulating substrate 21 in accordance with the same method as in process (5) of Example 1 (see FIG. 27(d)).

A circuit board J was completed through these processes.

2. Manufacture of Multilayer Printed Circuit Board (4) Next, one piece of the above described circuit board J, two circuit boards H as that manufactured in Example 6 and two adhesive insulating films B having a thickness of 80 µm and manufactured in accordance with the following method were prepared, and the circuit boards H were layered and positioned on the two surfaces of the circuit board J by interposing prepregs in accordance with a pin lamination method, and after that, the layers were pressed under such conditions that the pressure was 30 kg/cm², the time for pressing at a temperature of 180° C. or more was 45 minutes and the total time for pressing was 150 minutes. Here, guide holes (not shown) were formed in advance in the circuit boards and the optical waveguide film.

With regard to the manufacture of an adhesive insulating film B, 30 parts by weight of $SiO_2$ spherical particles (SO-E2, made by Admatec GmbH) having a particle diameter of 0.4 to 0.6 pm was added to 10 parts by weight of an acrylate based monomer, 4 parts by weight of an imidazole curing agent, 5 parts by weight of benzophenone (polymerization initiator) and 40 parts by weight of ethyl lactate (solvent), and this was stirred using three rollers.

After that, this resin composite was applied on a substrate using a spin coater and temporarily cured through UV irradiation, and thereby, an adhesive insulating film was manufactured. Here, the adhesive insulating film had an index of refraction of 1.51 and a transmittance of 80%/mm for light having a wavelength of 850 nm.

(5) After that, a multilayer printed circuit board was manufactured in the same manner as in (7) to (12) of Example 1 (see FIG. 13).

Example 13

A multilayer printed circuit board was manufactured in the same manner as in Example 7, except that an optical fiber sheet was used instead of an optical waveguide film.

Here, as the optical fiber sheet, an optical fiber sheet where four GI optical fibers having a core diameter of 50 µm, a clad diameter of 125 µm and multiple modes were aligned was used (see FIG. 14(a)).

Example 14

A multilayer printed circuit board was manufactured in the same manner as in Example 1, except that a package substrate having an optical signal transmitting region in recess form was mounted as the package substrate on which a light receiving element (PD) was mounted (see FIG. 15).

Comparative Example 1

Conductor circuits (including non-penetrating via holes) were formed on the two surfaces of an insulating substrate, and optical signal transmitting regions which penetrated through this insulating substrate and contained a light receiving element inside were formed, and after that, an optical waveguide was formed on one surface in accordance with the same method as in process (5) of Example 1, and a package substrate on which an optical element (VCSEL or PD) was mounted was mounted on the other surface, and thus, a multilayer printed circuit board was completed.

Optical waveguides were exposed from the outermost layers in the multilayer printed circuit board according to the present comparative example.

Comparative Example 2

A multilayer printed circuit board was manufactured in the same manner as in Comparative Example 1, except that solder resist layers (RPZ-1, made by Hitachi Chemical Co., Ltd.) were formed so as to cover the optical waveguides.

Optical waveguides were formed on the outside of the insulating layers in the outermost layers in the multilayer printed circuit board according to the present comparative example.

The multilayer printed circuit boards of Examples 1 to 14 and Comparative Examples 1 and 2 were designed so that the size of the optical signal transmitting regions allows transmission light to be transmitted without hitting the wall surface. That is to say, the multilayer printed circuit boards were designed taking the thickness (length of optical signal transmitting regions) of the multilayer printed circuit board and the provision of micro lenses into consideration.

In addition, the conductor circuits of the multilayer printed circuit boards according to Examples 1 to 14 and Comparative Examples 1 and 2 were formed in accordance with a subtractive method, but they may be formed in accordance with a build-up method of the subtractive method.

A reliability test was carried out on the multilayer printed circuit boards according to the examples and the comparative examples, and the optical signal transmitting properties were evaluated using the transmission loss value before and after the reliability test.

The above described reliability test was conducted under such conditions that the multilayer printed circuit boards were left for 100 hours at high temperatures in a high moisture environment (85° C., 85%), and after that, left for 48 hours under natural conditions. After that, the multilayer printed circuit boards were cut into 4 cm, 6 cm, 8 cm and 10 cm and used as measurement samples, and the transmission loss was found in accordance with a cutback method.

Here, two multilayer printed circuit boards of each kind were manufactured; one was used to measure the transmission loss value before the reliability test (initial loss), and the other was used to measure the transmission loss value after the reliability test.

The optical signal transmitting properties were evaluated in accordance with the following method.

That is to say, in multilayer printed circuit boards through which optical signals are transmitted within the substrate, an IC chip was mounted on a package substrate and an electrical signal of 2.5 Gbps was inputted into a connector for testing using a pulse generator so as to pass through the driver IC, allowing a VCSEL to emit light, and then, optical signals were transmitted to the multilayer printed circuit board, and furthermore, optical signals transmitted via the multilayer printed circuit board (optical signal transmitting regions and optical circuits) were received by a PD so as to be converted to electrical signals which passed through an amplifier IC, and the electrical signals were taken out from the connector for testing, and whether or not optical signals could be transmitted normally was determined from eye patterns using an oscilloscope.

In addition, in the multilayer printed circuit boards for transmitting optical signals between substrates, an IC chip was mounted on a package substrate and an electrical signal of 2.5 Gbps was inputted into a connector for testing using a pulse generator so as to pass through a driver IC and allow a VCSEL to emit light, and then, optical signals were transmitted to the multilayer printed circuit board, and furthermore, optical signals transmitted via the multilayer printed circuit board (optical signal transmitting regions and optical circuits) were received by a PD which was mounted on another package substrate via a GI optical fiber having multiple modes which was connected to a portion where an optical circuit was exposed from a side of the multilayer printed circuit board so as to be converted to an electrical signal, and then, the electrical signals were taken out from the connector for testing through an amplifier IC, and thus, whether or not optical signals could be transmitted normally was determined from eye patterns using an oscilloscope.

Here, matching oil was applied in the portion on the side of the multilayer printed circuit board to which the GI optical fiber was attached.

The results are shown in Table 1.

Here, the multilayer printed circuit board according to Example 13 uses an optical fiber sheet where a GI optical fiber is aligned as the optical circuit, and the transmission loss of this GI optical fiber was 3.0 dB/km, which is very small, and therefore, it can be said optical signals can actually be transmitted without fail, though the transmission loss value was not measured.

TABLE 1

|  | Initial loss (dB/cm) | Loss after evaluation (dB/cm) | Increase in loss (dB/cm) | Optical signal transmitting properties Before evaluation | Optical signal transmitting properties After evaluation |
|---|---|---|---|---|---|
| Example 1 | 0.11 | 0.23 | 0.12 | ○ | ○ |
| Example 2 | 0.13 | 0.21 | 0.07 | ○ | ○ |
| Example 3 | 0.12 | 0.18 | 0.06 | ○ | ○ |
| Example 4 | 0.12 | 0.20 | 0.08 | ○ | ○ |
| Example 5 | 0.14 | 0.21 | 0.07 | ○ | ○ |
| Example 6 | 0.11 | 0.23 | 0.12 | ○ | ○ |
| Example 7 | 0.09 | 0.20 | 0.11 | ○ | ○ |
| Example 8 | 0.11 | 0.21 | 0.10 | ○ | ○ |
| Example 9 | 0.10 | 0.22 | 0.12 | ○ | ○ |
| Example 10 | 0.12 | 0.24 | 0.12 | ○ | ○ |
| Example 11 | 0.11 | 0.22 | 0.11 | ○ | ○ |
| Example 12 | 0.09 | 0.22 | 0.13 | ○ | ○ |
| Example 13 | — | — | — | ○ | — |
| Example 14 | 0.10 | 0.24 | 0.14 | ○ | ○ |
| Comparative Example 1 | 0.14 | 0.82 | 0.68 | ○ | x |
| Comparative Example 2 | 0.12 | 0.67 | 0.55 | ○ | x |

As shown in Table 1, the evaluation before reliability test (initial loss) was 0.09 to 0.14 dB/cm both in the examples and the comparative examples, and the transmission loss value for a distance of 30 cm was calculated to be 2.7 to 4.2 dB, and thus, it became clear that optical signals can sufficiently be transmitted over 30 cm.

In addition, optical transmission was possible over 30 cm in the above described actual transmission evaluation.

Meanwhile, in the evaluation after reliability test (loss after reliability test), the loss became 0.18 dB/cm to 0.24 dB/cm (increased by 0.06 dB/cm to 0.13 dB/cm) in the examples, and the value for transmission loss over a distance of 30 cm was calculated to be 5.4 dB to 7.2 dB, and thus, it became clear that transmission was possible over a distance of 30 cm.

In general, tolerable loss, with which transmission of optical signals of 2.5 Gbps from the light emitting portion of the VCSEL to the light receiving portion of the PD is possible, is about 18 dB, and the tolerable loss from which the loss in an optical circuit according to the examples is subtracted becomes 10.8 to 12.6 dB. In addition, with this value, optical transmission is possible, taking into consideration the precision of alignment between the optical signal transmitting regions, the optical elements and the optical circuits, as well as loss due to an underfill.

Meanwhile, the loss in the comparative examples was 0.82 dB/cm and 0.67 dB/cm (increased by 0.58 dB/cm and 0.68 dB/cm), the transmission loss value over a distance of 30 cm was calculated to be 24.6 dB and 20.1 dB, which exceeds 18 dB, and therefore, it became clear that transmission over a distance of 30 cm was impossible.

What is claimed is:

1. A multilayer printed circuit board comprising:
a plurality of optical circuits comprising a first optical circuit layer and a second optical circuit layer;
an insulating layer comprising an adhesive insulating material and having a first surface and a second surface on an opposite side of the first surface, the insulating layer adhering the first optical circuit layer on the first surface and the second optical circuit layer on the second surface;
a first layered structure formed over the first optical circuit on an opposite side of the insulating layer and comprising at least one substrate and a plurality of conductor circuits;
a second layered structure formed over the second optical circuit on an opposite side of the insulating layer and comprising at least one substrate and a plurality of conductor circuits; and
an optical signal transmitting region formed through the first layered structure and optically coupled to the first optical circuit layer,
wherein at least one of the first and second layered structures further comprises a transparent solder resist layer formed as an outermost layer, and the transparent solder resist layer is formed over the optical signal transmitting region.

2. The multilayer printed circuit board according to claim 1, further comprising a through hole connecting the plurality of conductor circuits through the substrate in the first layered structure.

3. The multilayer printed circuit board according to claim 1, further comprising an optical element mounted over the first layered structure, wherein said optical signal transmitting region is optically coupling the first optical circuit layer and the optical element.

4. The multilayer printed circuit board according to claim 3, wherein at least one of said first and second optical circuit layers comprises an optical waveguide.

5. The multilayer printed circuit board according to claim 4, wherein at least one of said first and second optical circuit layers comprises in a film form.

6. The multilayer printed circuit board according to claim 3, wherein at least one of said first and second optical circuit layers comprises an optical fiber sheet.

7. The multilayer printed circuit board according to claim 1, wherein the first optical circuit layer and the second optical circuit layer are superposed one another.

8. The multilayer printed circuit board according to claim 7, wherein at least one of said first and second optical circuit layers comprises an optical waveguide.

9. The multilayer printed circuit board according to claim 7, wherein at least one of said first and second optical circuit layers comprises an optical fiber sheet.

10. The multilayer printed circuit board according to claim 1, further comprising an adhesive layer interposed between the first layered structure and the first optical circuit layer.

11. The multilayer printed circuit board according to claim 1, further comprising a via hole connecting the conductor circuits through the substrate in the first layered structure.

12. The multilayer printed circuit board according to claim 11, wherein said first optical circuit layer has a core and a clad, and a portion of said core and a portion of said via hole are superposed on one another.

13. The multilayer printed circuit board according to claim 1, wherein at least one of said first and second optical circuit layers comprises an optical waveguide.

14. The multilayer printed circuit board according to claim 1, wherein at least one of said first and second optical circuit layers comprises an optical fiber sheet.

15. The multilayer printed circuit board according to claim 1, wherein at least one of the first and second layered structures further comprises an optical waveguide and an optical connector fixed on said transparent solder resist layer, and said optical waveguide is coupled with said optical connector.

16. The multilayer printed circuit board according to claim 1, wherein at least one of the first and second layered structures further comprises a plurality of optical signal transmitting regions, and at least one of said optical signal transmitting regions is not exposed to an outermost portion of the at least one of the first and second layered structures.

17. The multilayer printed circuit board according to claim 1, further comprising a through hole penetrating through the first and second layered structures, the insulating layer and the first and second optical circuit layers, wherein the conductor circuits of the first layered structure and the conductor circuits of the second layered structure are electrically connected by the through hole.

18. The multilayer printed circuit board according to claim 1, wherein the first optical circuit layer is formed on a surface of the first layered structure.

19. The multilayer printed circuit board according to claim 1, wherein at least one of the first and second optical circuit layers comprises an optical path conversion mirror which changes direction of an optical signal transmitted through the at least one of the first and second optical circuit layers.

20. The multilayer printed circuit board according to claim 1, wherein the first optical circuit layer has a core and a clad, the second optical circuit layer has a core and a clad, and the first optical circuit layer and the second optical circuit layer are positioned such that the core of the first optical circuit layer and the core of the second optical circuit layer are superposed one another in a direction perpendicular to the first surface of the insulating layer.

21. The multilayer printed circuit board according to claim 20, wherein the core of the first optical circuit layer has a thickness of 20 to 80 μm.

* * * * *